United States Patent
Fishbaine et al.

(10) Patent No.: US 6,538,750 B1
(45) Date of Patent: *Mar. 25, 2003

(54) ROTARY SENSOR SYSTEM WITH A SINGLE DETECTOR

(75) Inventors: David Fishbaine, Minnetonka; Steven K. Case, St. Louis Park; John P. Konicek; Thomas L. Volkman, both of Minneapolis; Brian D. Cohn, Northfield; Jeffrey A. Jalkio, St. Paul, all of MN (US)

(73) Assignee: CyberOptics Corporation, Minneapolis, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/314,169

(22) Filed: May 19, 1999

Related U.S. Application Data

(60) Provisional application No. 60/086,509, filed on May 22, 1998.

(51) Int. Cl.[7] ................................................ G01B 1/14
(52) U.S. Cl. .................... 356/614; 365/622; 365/615; 365/630; 382/151
(58) Field of Search .......................... 356/237.1–237.5, 356/375, 394, 400, 446, 614, 615, 622, 629, 630, 634, 635, 636; 250/560–561, 559.29, 559.49; 348/126; 382/8, 47, 146, 149, 151

(56) References Cited

U.S. PATENT DOCUMENTS

| | | |
|---|---|---|
| 3,854,052 A | 12/1974 | Asar et al. |
| 4,553,843 A | 11/1985 | Langley et al. ............. 356/375 |
| 4,615,093 A | 10/1986 | Tews et al. |
| 4,647,208 A | 3/1987 | Bieman |
| 4,696,047 A | 9/1987 | Christian et al. .............. 382/8 |
| 4,733,969 A | 3/1988 | Case et al. |
| 4,745,295 A | 5/1988 | Seno et al. ................. 250/560 |
| 4,872,747 A | 10/1989 | Jalkio et al. |

(List continued on next page.)

FOREIGN PATENT DOCUMENTS

| | | |
|---|---|---|
| EP | 0 577 128 A1 | 5/1994 |
| JP | 6-249629 | 9/1994 |
| JP | 6-307831 | 11/1994 |
| JP | 7-336099 | 12/1995 |
| WO | WO 97/30572 | 8/1997 |
| WO | 98/06059 | 2/1998 |
| WO | 98/09276 | 3/1998 |
| WO | 98/18135 | 4/1998 |
| WO | 98/20311 | 5/1998 |

*Primary Examiner*—Frank G. Font
*Assistant Examiner*—Sang H. Nguyen
(74) *Attorney, Agent, or Firm*—Dicke, Billig & Czaja, P.A.

(57) ABSTRACT

The system of the present invention reports a signal related to a physical condition of an object, such as an electronic component, with the most basic realization of the system including a vacuum quill for releasably holding the object and a motion control system for rotating the quill. The invention includes control electronics coupled to the detector for providing a trigger signal where the detector is oriented to view a stripe in a viewing plane perpendicular to the central axis of the quill, and to provide an image of the stripe. The control electronics sends a plurality of trigger signals to the detector while the motion control system rotates the quill, with each trigger signal triggering the acquisition of another image of a stripe. A processing circuit processes the plurality of images of the stripes to provide the signal related to the physical condition of the object, which can include the orientation or location of the component, the presence or absence of balls on a ball grid array, the height of a specific lead on a leaded component, the distance between the leads on a leaded component or the coplanarity of features on the component. A method for picking and placing components is also disclosed for use with the apparatus of the present invention.

118 Claims, 52 Drawing Sheets

U.S. PATENT DOCUMENTS

| | | |
|---|---|---|
| 5,005,978 A | 4/1991 | Skunes et al. |
| 5,015,096 A | 5/1991 | Kowalski et al. |
| 5,039,210 A | 8/1991 | Welstead et al. |
| 5,046,851 A | 9/1991 | Morgan |
| 5,086,559 A | 2/1992 | Akatsuchi |
| 5,114,229 A | 5/1992 | Hideshima .................. 356/273 |
| 5,208,463 A | 5/1993 | Honma et al. .............. 250/561 |
| 5,249,239 A | 9/1993 | Kida ............................. 382/8 |
| 5,260,791 A | 11/1993 | Lubin |
| 5,278,634 A | 1/1994 | Skunes et al. |
| 5,293,048 A | 3/1994 | Skunes et al. |
| 5,309,223 A | 5/1994 | Konicek et al. |
| 5,331,406 A | 7/1994 | Fishbaine et al. |
| 5,348,956 A | 9/1994 | Van Keulen et al. |
| 5,371,375 A * | 12/1994 | Stern et al. .................. 250/561 |
| 5,377,405 A | 1/1995 | Sakurai et al. |
| 5,384,956 A | 1/1995 | Sakurai et al. |
| 5,440,391 A | 8/1995 | Smeyers et al. |
| 5,450,206 A | 9/1995 | Caillat et al. |
| 5,465,152 A | 11/1995 | Bilodeau et al. |
| 5,467,186 A | 11/1995 | Indo et al. |
| 5,491,888 A | 2/1996 | Sakurai et al. |
| 5,559,727 A | 9/1996 | Deley et al. ................. 356/375 |
| 5,566,447 A | 10/1996 | Sakurai |
| 5,570,993 A | 11/1996 | Onodera et al. |
| 5,608,642 A | 3/1997 | Onodera |
| 5,619,328 A | 4/1997 | Sakurai |
| 5,621,530 A | 4/1997 | Marrable, Jr. |
| 5,646,681 A * | 7/1997 | Okazaki ..................... 348/151 |
| 5,646,733 A | 7/1997 | Bieman |
| 5,660,519 A | 8/1997 | Ohta et al. |
| 5,694,384 A | 12/1997 | Luster |
| 5,701,179 A | 12/1997 | Chatterjee |
| 5,715,051 A | 2/1998 | Luster |
| 5,734,475 A | 3/1998 | Pai |
| 5,742,504 A | 4/1998 | Meyer et al. |
| 5,743,005 A | 4/1998 | Nakao et al. |
| 5,751,450 A | 5/1998 | Robinson |
| 5,753,903 A | 5/1998 | Mahaney |
| 5,757,176 A | 5/1998 | Farrow |
| 5,757,978 A | 5/1998 | Flick et al. |
| 5,764,386 A | 6/1998 | Robinson |
| 5,768,759 A | 6/1998 | Hudson |
| 5,825,913 A | 10/1998 | Rostami et al. |
| 5,878,484 A | 3/1999 | Araya et al. |
| 5,897,611 A | 4/1999 | Case et al. .................. 356/375 |
| 5,999,640 A | 12/1999 | Hatase et al. |
| 6,055,055 A * | 4/2000 | Toh ............................. 356/394 |
| 6,133,579 A * | 10/2000 | Wacker et al. ......... 250/559.34 |

\* cited by examiner

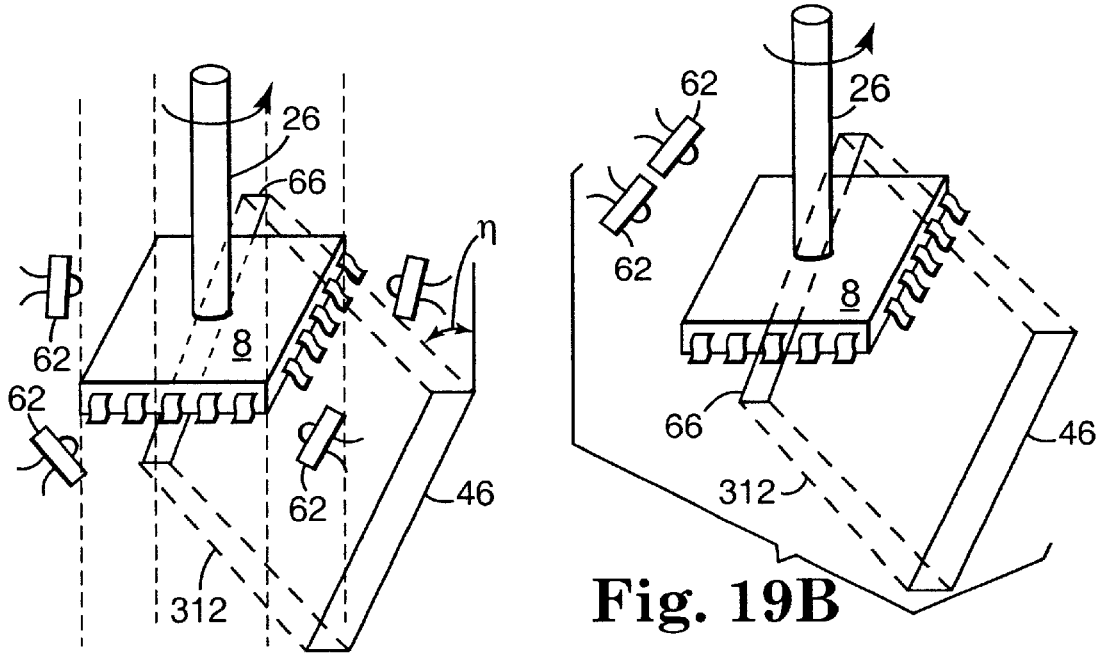
Fig. 19A
Fig. 19B
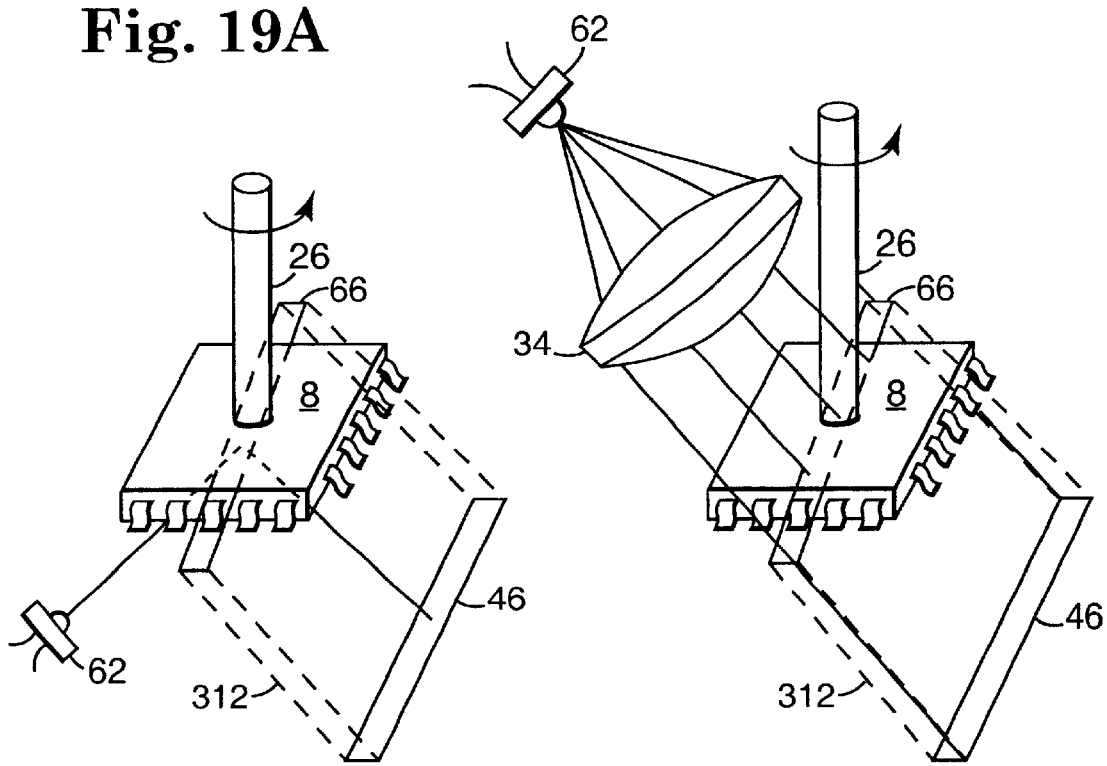
Fig. 19C
Fig. 19D

ROTARY SENSOR SYSTEM WITH A SINGLE DETECTOR

PRIORITY CLAIM

The present application claims priority from the provision application titled Optical Sensing Devices and Methods, application Ser. No. 60/086,509 filed May 22, 1998.

CROSS REFERENCE TO RELATED APPLICATION

This application is related to the subject matter of the application titled Rotary Sensor System with at Least Two Detectors, filed on the same day with the present application.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates to optical sensor systems for determining the location or orientation of an object, such as an electronic component, including such systems which report a physical condition of the object, such as the orientation of the object, the height of a particular feature on the object, the distance between features on the object, the presence of expected features on the object or the coplanarity of features on the object.

BACKGROUND OF THE INVENTION

Component Position Computation

There are many optical-based approaches to identifying various parameters related to an object, such as an electronic component. The various parameters which may be reported include orientation of the component, location of features on the component, indications of the quality of the component, such as a bent lead (lead tweeze) in the case of a Quad Flat Pack (QFP) component, or a measurement of a feature located on the bottom of the component, such as the height of a ball on a Ball Grid Array (BGA) Component. The system for identifying these parameters is generally mounted in a pick and place machine which picks up the component and places the component on a printed circuit board. All of these approaches rely on a quill in the pick and place machine to pick up the component, and all generally utilize the motion control system in the pick and place machine in the measurement process. Some of the approaches use cameras to collect data representative of an image of the component and others collect data representative of an outline of the component, and all have some sort of processor that analyzes the collected data in order to identify some specific portion of the component, such as the edges of the part or the tips of the component leads. The sections below briefly describe a variety of the approaches used today, and describe their relative advantages and disadvantages.

In general, the systems described below can be characterized as being either "on-head" or "off-head." On-head sensor systems (considered together with their host pick and place machines) sense and correct for the orientation of the component while the component travels to the target circuit board. On-head systems are preferred, as they minimize the amount of time required to place a component on a board, thereby increasing the throughput of the pick and place machine.

Off-head sensor systems perform the data collection in a fixed location on the pick and place machine. With an off-head system, the quill must first move the component to the dedicated station and after acquiring the image, move the component to the target circuit board for placement. Off-head systems typically reduce the machine's throughput since the head makes additional stops or travels further, but are used because they are inexpensive, reduce the mass which must be carried on the head and one sensor can readily service multiples quills.

Another way to characterize various sensor systems is by the relative location of the detector and the light source with respect to the component. FIGS. 1A–C show the three schemes of front-lit, back lit and shadow cast sensor systems, respectively. In front-lit systems, light from a source illuminates the features of interest on the component and the light reflected off of the features is optionally directed through optics forming an image on a detector. In back-lit systems, light from a source is incident on the component, and then optionally directed through focusing optics before it reaches a detector. Because the detector does not collect light scattered off the bottom of the component in either the back-lit or the shadow-cast systems, neither type of system is capable of inspecting features on the bottom of components, such as balls on a Ball Grid Array (BGA) or pins on a pin grid array (PGA). In shadow cast systems, light from a source optionally travels through collimating optics, onto the component, optionally directed through an optical system and then casts a shadow on the detector.

One approach in use today for assessing the orientation of an electronic component on a pick and place nozzle uses data representative of a shadow of the component, sometimes exclusively using the data representative of the edges of the shadow to perform its orientation computation. One such sensor is available from CyberOptics® Corporation and is called a LaserAlign® Sensor. In this shadow cast sensor system, light is cast onto the component from one side of the component and a linear detector on the other side of the component captures data representative of the component's shadow. Appropriate electronics analyze the data to compute the x,y,θ coordinates of a pre-selected feature on the component. FIG. 2 shows this approach schematically and the method is described further in U.S. Pat. No. 5,278,634 to Skunes et al., assigned to CyberOptics Corporation. This approach takes advantage of the motion control system already installed on the pick and place machine, which has an accurate encoder for reporting the angular position of the nozzle. At several angular positions, the system collects data from the detector representative of the shadow of the component. As appropriate for the type of component, the angular positions do not have to be equally spaced over 360 degrees nor is the component required to spin at a constant angular velocity. For each angular position, the sensor system computes the width of the component's shadow. By assessing the shadow center position at the minimum shadow width angle the component location in one axis can be determined. By measuring two shadow positions at the two minimum widths 90° apart, the position of a rectangular component can be computed. This system does not provide any further information not already derived from the shadow edges. Hence, it cannot identify misplaced or missing balls on BGAs or flip-chips. One main advantage of the sensor, however, is that it can be placed on-head, which allows for increased throughput of the pick and place machine.

Another on-head system employs a video camera on the moving head. In this approach, the camera stares down parallel to the pickup quill, and a right angle prism (or equivalent) is moved under the camera and component during travel, shown in FIGS. 3A–B. In this approach, there is typically one camera for each pick-up nozzle. This system has three drawbacks. First, there is substantial cost and mass associated with the right angle prism and the mechanism to slide it reliably into place. Second the minimum time between pickup and placement is limited by the time required to raise the nozzle, slide the prism into position, acquire the image, slide the prism out of position, and then lower the nozzle. Finally, the prism must be roughly as thick as the width of the component to be measured. Hence, the z motion of the component during pickup and placement is much longer than is required for other approaches.

One off-head approach to assessing component orientation is to place one or more fixed position upward looking video cameras (e.g., 2D array detectors) in the pick and place machine at a dedicated station. For small components, or ones with relatively coarse pitch between leads, one image of the component is taken and its position determined from analyzing a single image. For larger components with fine pitch, several images may be needed to provide adequate resolution, since the component is placed on the basis of the location of its feature positions and a higher magnification view may be required to resolve fine pitch leads, balls, columns or pins. This approach utilizes standard components (e.g., cameras, optics, image processing hardware and image processing software) which may be easily assembled by pick and place machine manufacturers. However, this off-head system is slower than on-head approaches for the reasons stated above. The path from pickup to placement of the component must be altered to travel over the camera, degrading overall throughput of the pick and place machine. It is also likely that the travel will need to be slowed or stopped over the camera to obtain a clear image. If multiple images must be collected, this slows the process even further.

Another off-head system uses line scan cameras instead of 2D array cameras, which typically provide better spatial resolution. Compared to area array cameras, line scan cameras will typically have shorter exposure times, hence higher brightness light sources are generally required. In a line scan camera, the image is built-up one line of pixels at a time as the object and the camera move relative to one another.

Feature Inspection

In order to optically assess the quality of components before placement on a circuit board, several systems allow for inspection of lead coplanarity, missing or improperly placed balls or other quality issues with the component.

One off-head system approach uses standard CCD cameras to image at least a portion of the component, either as the component passes unidirectionally over a line scan camera, or with the component fixedly held ever the camera. From an image of the portion of interest on the component, computations about the lead tweeze in a component with leads, missing balls on a ball grid array or the like may be made. This system cannot assess any parameter related to height such as lead or ball coplanarity.

One off-head sensor system for assessing lead coplanarity is shown schematically in FIG. 4 and described in U.S. Pat. Nos. 5.33 1,406 and 5,309,223 to Konicek and Fishbaine, which pre-aligns the component perpendicularly with respect to the direction of scan. The system employs two or more beams of light which intersect in a point, where the height of the component is held constant with respect to the line while the leads on one side of the component are sequentially passed through the beams. As the component moves at the constant reference height, each lead sequentially blocks and then unblocks at least two of the beams. Once the leads on the first edge of the component are analyzed, leads on the second, third and fourth edges of the component are analyzed.

Another version of this method uses two similar sensors positioned on opposite sides of a rectangular component, which increases throughput by a factor of two, because all four edges of the component are analyzed in two movements of the quill. Because this is a shadow cast system, it is unable to inspect the features on the bottom of components, such as improperly manufactured balls on a BGA.

Another approach uses a high aspect ratio detector (possibly both in terms of pixel count and aspect ratio of individual detectors) that is placed at approximately the same height as the leads to be measured. Two or more point sources are placed opposite the detector and slightly below the leads. Images are collected of the shadows cast from each point source and analyzed to determine the heights of the leads. One version of this has four copies of this geometry, one for each side of the component. This approach is very fast, and has the added advantage of being on-head. With appropriate software it may also be possible to determine the component position and orientation with sufficient accuracy for placement. The disadvantages of the device are its need for a custom detector array and the large size for an on-head device (hence limiting the number of heads which can be installed on a machine).

Another approach is to scan a laser across the device and observe the laser's apparent position from an oblique angle (which may also be scanned). The primary advantages of this approach are speed and versatility. As this method is a front-lit system, features on the bottom of parts can be measured. A resonant or polygon scanner shifts the beam rapidly across the component in one axis while the component is translated in the other. The disadvantages of this approach are the relative complexity of the sensor, the challenge of dealing with a wide range of surface reflectivities, and maintaining a constant height for the component while scanning.

The prior art has its limitations, and a single system which takes advantage of the existing precision rotary motion capability of the pick and place machine, provides orientation and component quality information, and is capable of providing on-head coplanarity information without requiring pre-alignment steps is needed.

SUMMARY OF THE INVENTION

The system of the present invention reports a signal related to a physical condition of an object, such as an electronic component, with the most basic realization of the system including a vacuum quill for releasably holding the object and a motion control system for rotating the quill. The invention includes control electronics coupled to the detector for providing a trigger signal where the detector is oriented to view a stripe in a viewing plane perpendicular to the central axis of the quill, and to provide an image of the stripe. The control electronics sends a plurality of trigger signals to the detector while the motion control system rotates the quill, with each trigger signal triggering the acquisition of another image of a stripe. A processing circuit processes the plurality of images of the stripes to provide the signal related to the physical condition of the object, which can include the orientation or location of the component, the presence or absence of balls on a ball grid array, the height of a specific lead on a leaded component, the distance between the leads on a leaded component or the coplanarity of features on the component.

As required for the particular application of the invention, various sorts of illumination can be provided to create additional embodiments of the present invention, such as front-lit, including specular, diffuse and combinations thereof, back-lit, back-lit shadow casting, reflective shadow casting or a combination of illumination types. The present invention can be integrated into various types of pick and place machines to provide on-head or off-head reporting of the physical condition of interest. The detector is triggered to acquire an image as a function of elapsed time or upon reaching preselected angular positions of the quill. The processing circuit may be configured to operate in real time or on stored images of the stripes. If operating in real-time, the processor locates at least two data points from an array of polar data, and computes the signal as a function of the two or more polar data points. Otherwise, the processing circuit may convert the polar data, collected in a polar array into a Cartesian array, by mapping gray values in the polar array into target pixels of a Cartesian array.

When the detector in the present invention is oriented to view a plurality of stripes radially oriented with respect to the center of the component, the component is rotated over 360 degrees to acquire an image of the entire component. When the detector is oriented to view a cross component stripe, the component need only be rotated over 180 degrees in order to acquire the necessary data to provide the signal. Off-axis configurations of the detector with respect to a central axis of the quill may be employed when the application requires information about the height of features on the component, such as coplanarity information. In order to generate height information, an off-axis geometry is used, a detector oriented to view a cross-component stripe is used, and the component is rotated 360 degrees to obtain two views of the features necessary to compute heights.

Various embodiments of the quill in the pick and place machine, or variations in offset for the quill pickup may be employed with any embodiment of the present invention in order to minimize space or limit the collection of unnecessary data. The pick-up nozzle may have a turn in it so that the center of the component and an axis of rotation of the quill are not coincident. A second axis of rotation near the center of the component may be added that can rotate independently of the primary quill rotation. In a particular embodiment of this, the two axes rotate at substantially equal and opposite rates. In another embodiment, the central axis of the quill is outside of the outline of the component, which provides for faster inspection of larger components. In another embodiment, multiple quills, or multiple nozzles on one quill may be employed. Optional mirrors may be employed in several of the embodiments. One mirror embodiment movably or fixedly places a mirror in the optical path between the source and the component, while another embodiment movably or fixedly places a mirror in the optical path between the component and the detector.

The present invention also includes a method for picking and placing a component, comprising the steps of releasably picking up, the component with a quill, the quill having a central axis perpendicular to a viewing plane, positioning the component relative to a detector, the detector adapted to view a stripe in the viewing plane and including electronics adapted to provide a signal representative of a physical condition of the component and rotating the component while acquiring a plurality of views of the stripes. At this point, the pick and place machine may optionally decide whether to place the component as a function of the signal. In any event, the method continues to move the component to a placement area and finally, place the component as a function of the signal. The method may be practiced on-head or off-head. The present invention also includes a method for picking and placing a component by rotating the component out of the way of the sensor housing when the quill elevates the component, rotating the component to acquire a plurality of stripes according to the apparatus of the present invention, and finally rotating the component out of the way of the sensor housing before lowering the quill on the way to placing the component.

BRIEF DESCRIPTION OF THE DRAWINGS

FIGS. 19A–D show a second off-axis embodiment of the present invention with diffuse, front-lit, back-lit, front-lit specular and shadow casting illumination, respectively;

For convenience, items in the figures having the same reference symbol are the same or serve the same or a similar function.

DETAILED DESCRIPTION OF THE PREFERRED EMBODIMENTS

The rotary scan camera of the present invention is adaptable for use in determining the orientation of and performing inspection on any number of objects and articles of manufacture, and is well suited for use in the electronics assembly industry. In the electronics assembly industry, pick and place machines, such as the one shown in FIG. 5A, select an electronic component from reels, trays or the like, pick up the component, use some sort of optical sensor for computing the position and orientation of the component, and then place the component onto a printed circuit board or the like. Depending on the complexity of the component and the likelihood that the component may have been physically damaged, the pick and place machine may also inspect the component for physical damage before placing the component.

Figure 1C:
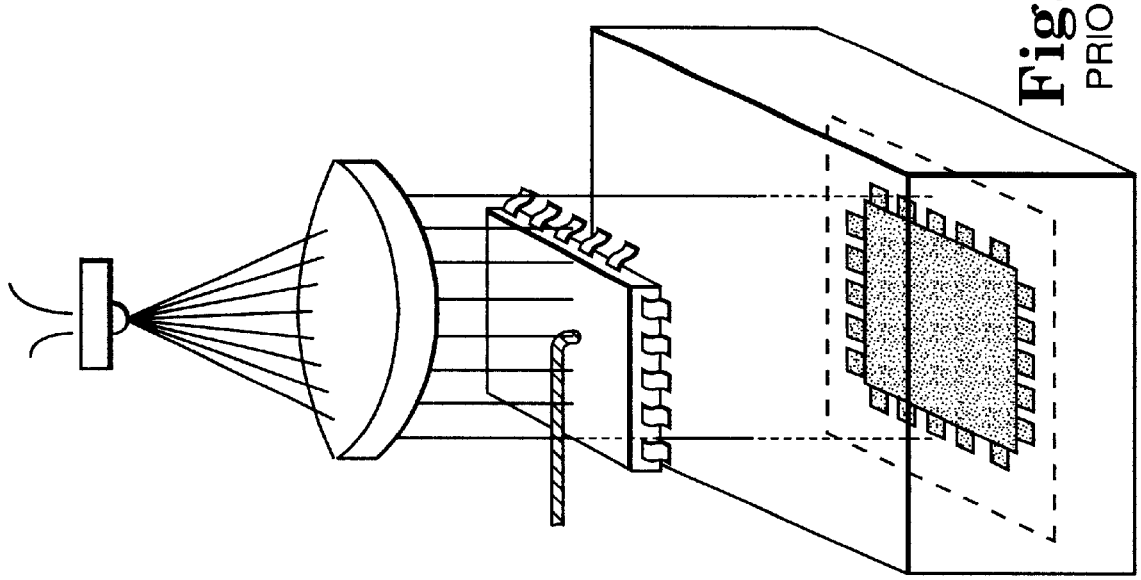
FIGS. 1A–C show a diagram of prior art front-lit optical system, back-lit optical system, and shadow cast optical system, respectively.
Figure 1B:
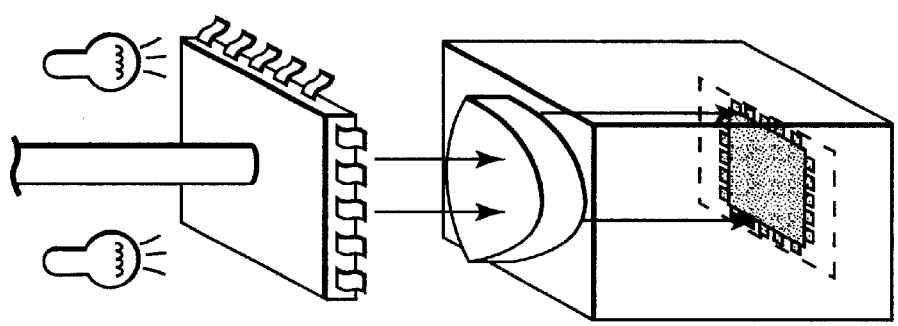
Figure 1A:
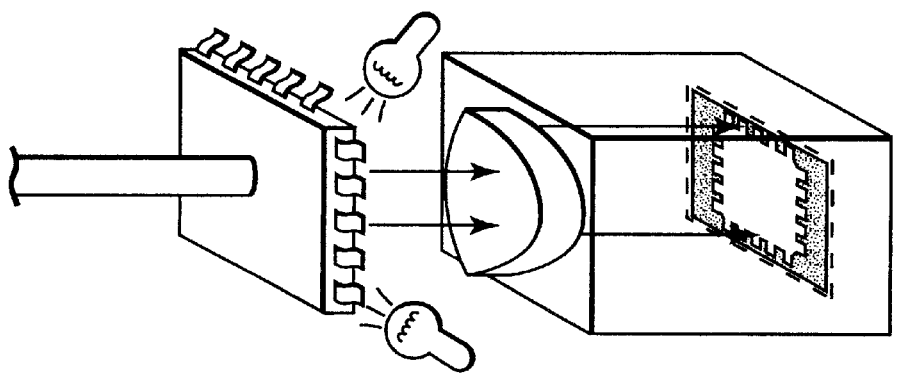
Figure 2:
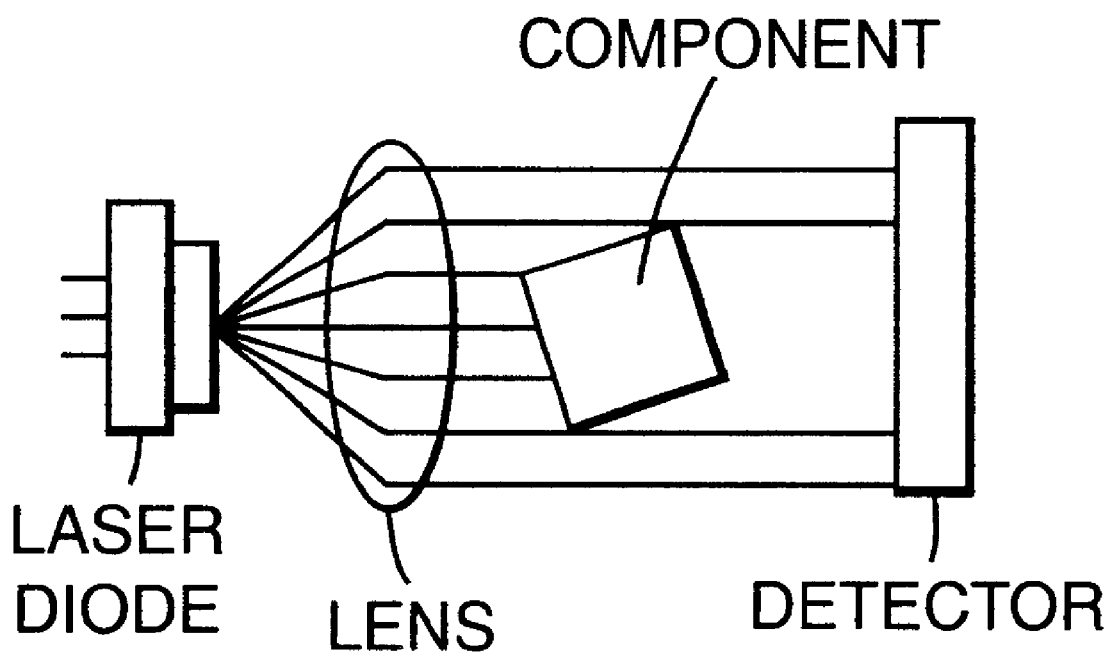
FIG. 2 shows a diagram of a prior art LaserAlign optical system for computing orientation of a component.
Figures 3A, 3B:
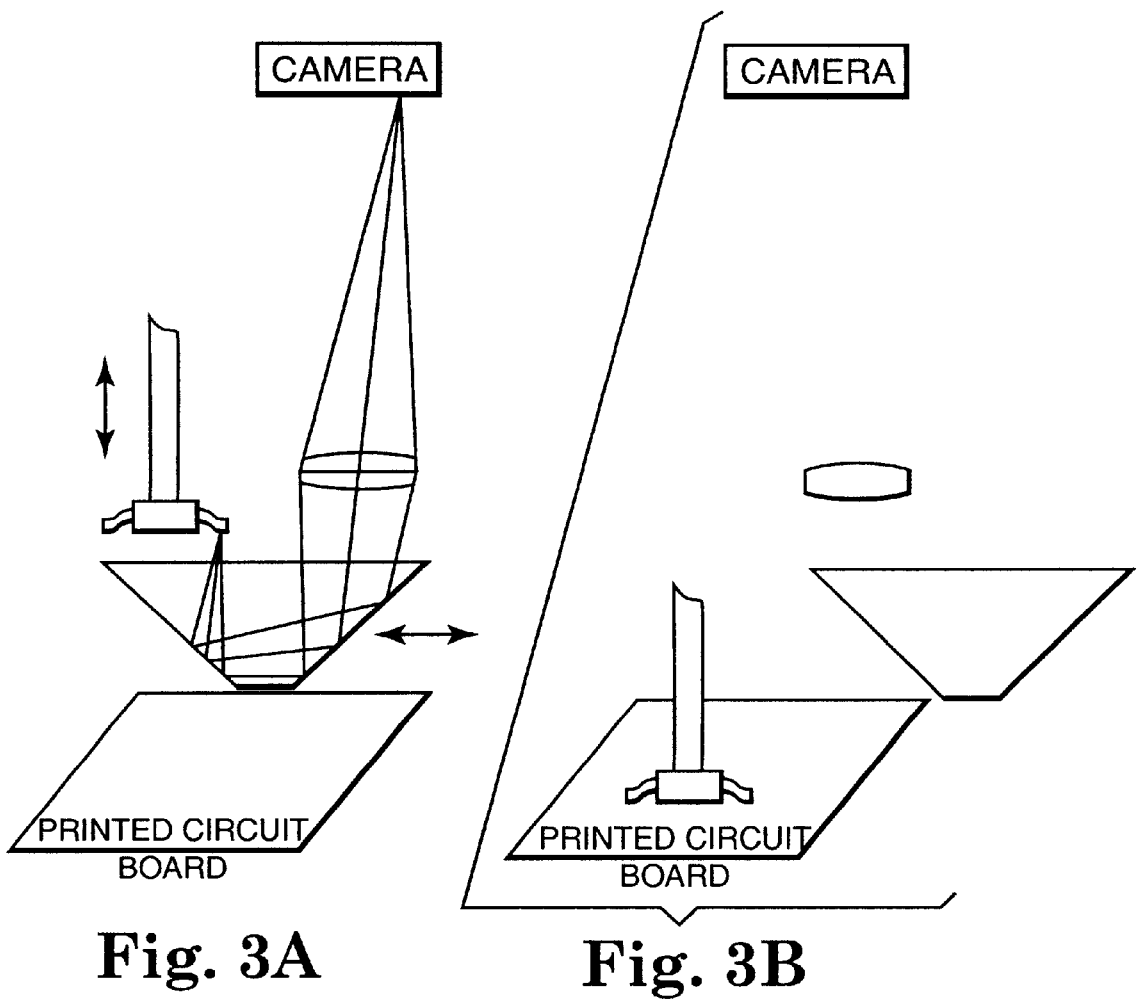
FIGS. 3A–B show diagrams of a prior art on-head video camera system, respectively.
Figure 4:
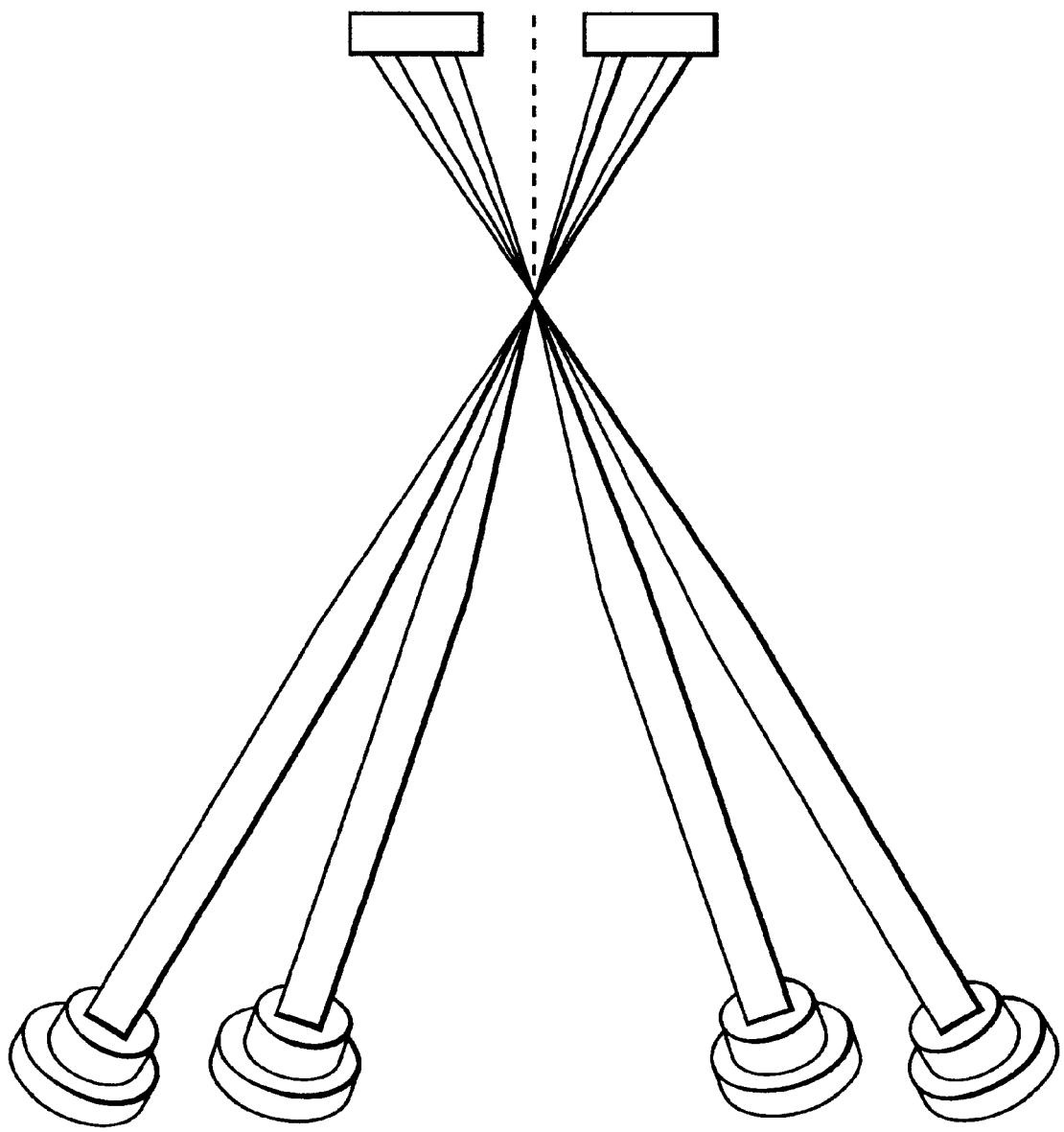
FIG. 4 shows a diagram of a prior art multiple source off-head system for assessing coplanarity.
Figure 5A:
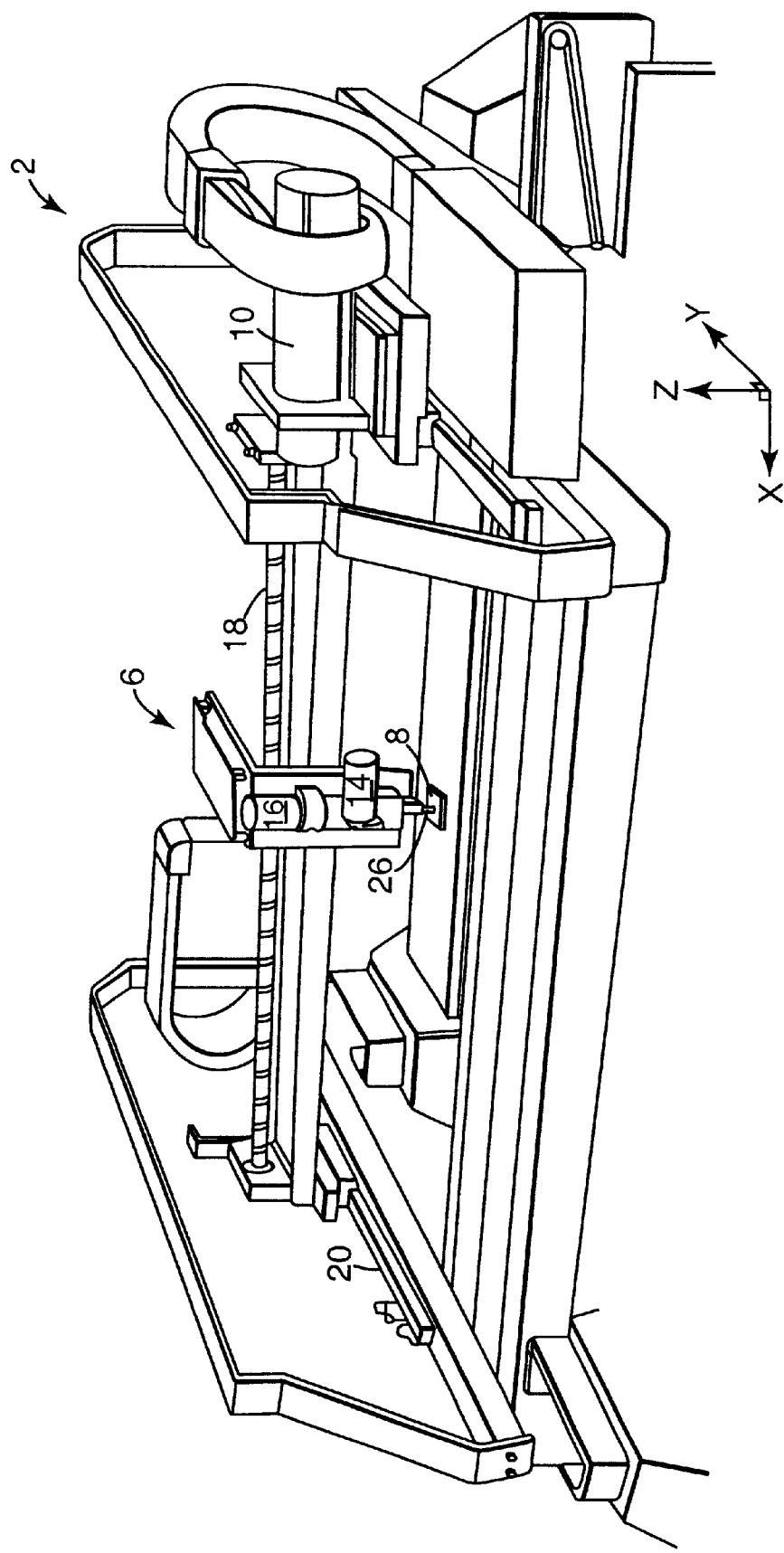
FIGS. 5A–B show diagrams of a pick and place machine adapted to practice the method of the present invention.
Figure 5B:
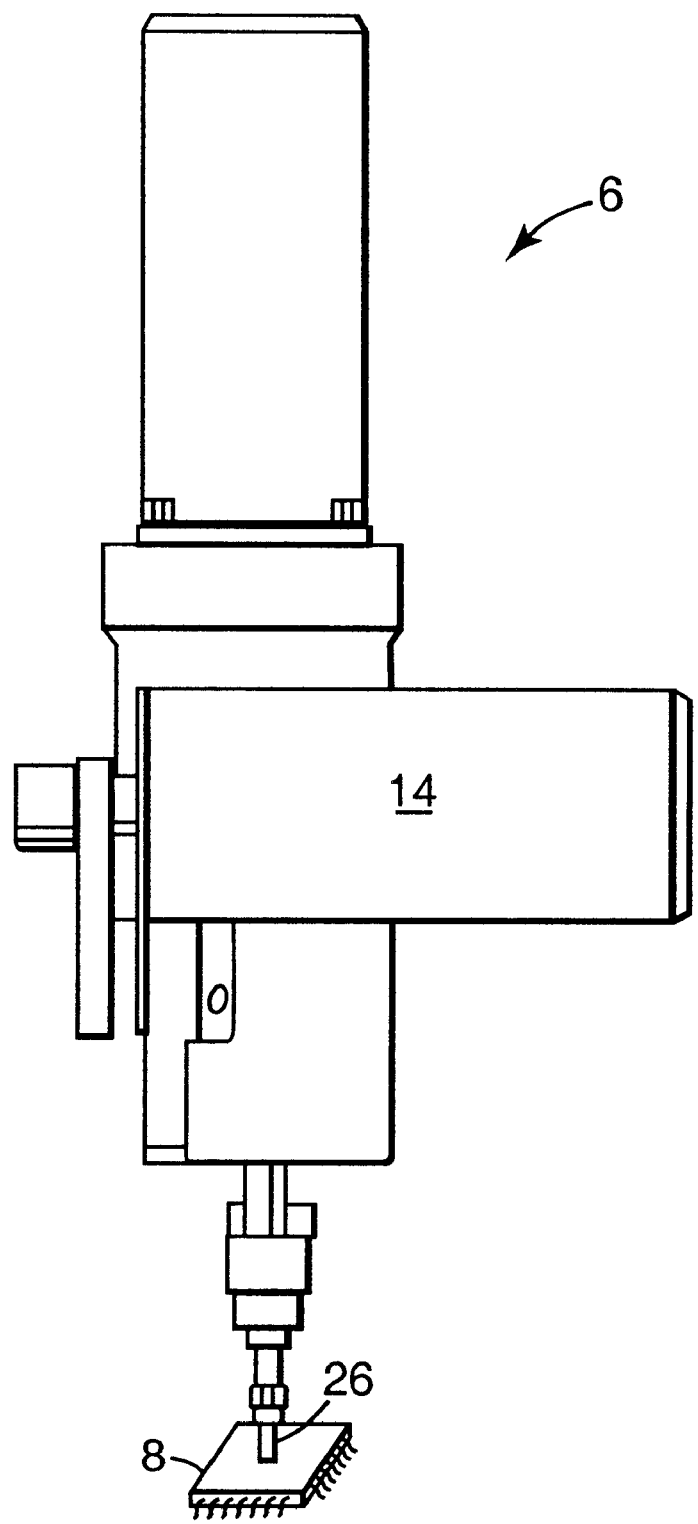

In FIGS. 5A and B, pick and place machine 2 includes a head assembly 6 for picking up component 8. A conveyor system (not shown) transports printed circuit (PC) boards in and out of machine 2. The head is linearly translatable in three directions (x,y,z) and is capable of angularly rotating component S, which movements are accomplished by an x head motor drive 10, y motor drive 12 (not shown in FIG. 5A), a z motor drive 14 and an angular motor drive 16. In pick and place machine 2, each motor runs independently from the others, by turning a threaded shaft which causes the head to stably move along an appropriate gantry or slide, the (x,y) gantries or slides shown respectively at reference designator 18 and 20. A more detailed view of head 6 is shown in FIG. 5B, in which a quill 26 is mechanically mounted on head 6. In many pick and place machines, the quill is a hollow tube-like article and once the quill contacts the component, a vacuum is initiated to secure the component to the end of the quill.

Figure 6:
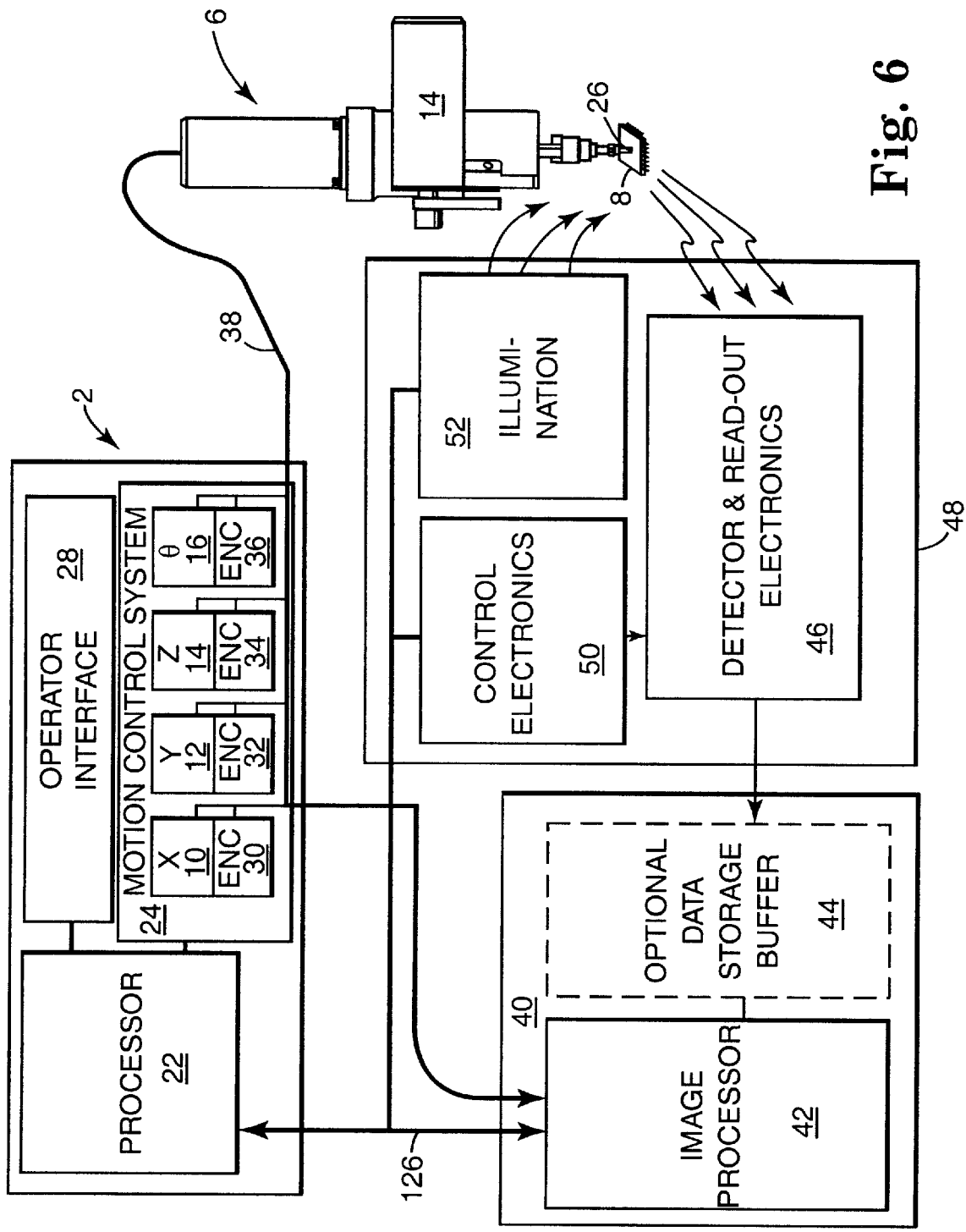
FIG. 6 shows a block diagram of the components of one embodiment of the present invention.

As shown in FIG. 6, pick and place machine 2 also includes a host processor 22 for generally controlling the operation of machine 2 and a motion control system 24 which controls motors 10, 12, 14 and 16. Each motor has an associated encoder 30,32,34,36, respectively, each encoder adapted to independently output a signal representative of the x,y,z or theta position of head 6. The rotary motor 16 has particularly fine control in order to finely position components onto a printed circuit board, and the present invention incorporates the well-developed angular motion and control already present in the pick and place machine 2 in performing the method of the present invention. Pick and place machine 2 also includes an operator interface 28 which typically includes a CRT for viewing images of the component provided by the present invention, or optionally viewing summary results of operation of machine 2. The x,y,z and theta motors 10–16 are electronically coupled to encoders 30–36. Processor 22 and motion control system 24, coupled electronically to head 6 via a bus 38, forms a closed loop control- loop for precisely locating head 6 in a desired sequence of locations, depending on the application. Host processor 22 also communicates design information about the component, such as the feature spacing or part type, to electronics 40 as necessary. The present invention may also be employed in other types of pick and place machines, including those which use belts or linear motors rather than lead screws.

A set of processing circuitry 40 specific to the present invention may be located in pick and place machine 2, but may also be installed on the outside of the machine in a separate card cage (not shown). Processing circuitry 40 generally includes an image processor 42 and an optional data storage buffer 44 for storing images from a detector 46 within sensor housing 48. In a preferred embodiment of the invention, processing circuitry 40 is embodied in a CPU chip, such as an Intel® Pentium ® processor or dedicated DSP processing chip and operates in real time to process images from detector 46. Circuitry 40 could also be located in housing 48. In an alternative embodiment, processing circuitry 40 receives images from detector 46 and stores the images in data buffer 44 until ready to assemble the images and compute the desired signal. In either embodiment, processing circuitry 40 computes a signal representative of the orientation of component 8, the location of certain features on component 8, such as the location of pins, columns or leads (as appropriate for the component type in view), the absence of certain features on component 8, such as missing balls, columns or leads, the distance between features (e.g., lead tweeze), and the height and coplanarity of raised features on component 8 (as provided for in certain embodiments of the present invention). As all of the previously mentioned features are on the bottom of an appropriate type of component 8, it should also be understood that the invention can be practiced to view and locate any regularly placed identification marks on the top of a component or object which relate to the type of the object, its quality or its orientation.

Detector 46 is positioned to view a stripe in a viewing plane associated with component 8. A set of control electronics 50 preferably in sensor 48 provide a series of trigger signals to the detector, to trigger detector 46 to acquire an image of a stripe on component 8 and transfer image data to processing circuitry 40. Control electronics 50 may also be located outside sensor 48, such as, for example, in machine 2. Detector 46 is preferably a linear CCD array commonly used in optical detection such as a 1024 or a 2048 pixel array. Control electronics 50 outputs trigger signals as a function of elapsed time or as a function of angular position of quill 26, and receives output from angular encoder 36 or instructions from processor 22. It is understood that the control electronics can function in either of these two modes, or a combination of the two according to the present invention. The number of images which the detector acquires is dependent on a number of factors in the application, including the size of the component, the amount of memory built into the system, the proximity of the features to each other on the underside of component 8, the desired resolution and the sensor geometry.

Figure 7A:
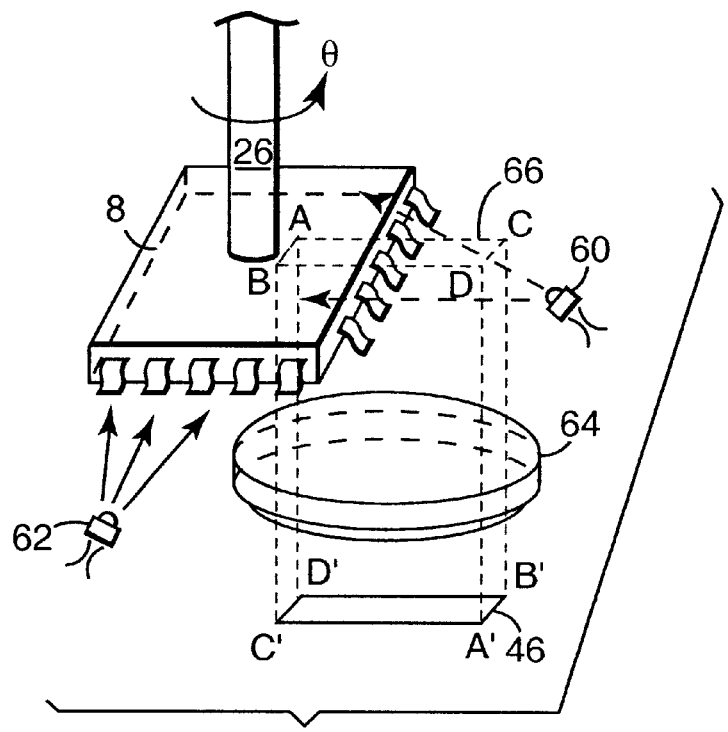
FIGS. 7A–D show the apparatus of the present invention with front-lit illumination, back-lit illumination, back-lit shadow casting illumination, and reflective shadow casting, respectively.

The present invention may be practiced without illumination 52 (assuming ambient room light is sufficient), but in preferred embodiments of the invention includes illumination in order to achieve faster acquisition of reliable data from detector 46. Illumination may be of several types, and some types of illumination are more appropriate for the embodiment of the invention, as discussed in detail in the description of certain embodiments. One type of illumination is front-lit, an example shown in FIG. 7A, where the front-lit light source is positioned to directly light the area of interest. LEDs 60,62 or any type of source, as appropriate, can be used to provide the illumination, which is directed at the underside of component 8. The selected viewing plane in this configuration is a plane coincident with the bottom of the component, as the desired signal from the invention in FIG. 7A is orientation of component 8. Detector 46 is positioned under a lens system 64, which is placed between stripe 66 to be viewed and detector 46. Stripe 66 on the underside has four corners, A–D, which correspond to points A'–D' on the detector after the image is passed through lens 64. Types of front-lit illumination are specular, diffuse and a combination of the two, with front-lit diffuse shown. Lens system 46 is shown throughout this document as a conventional lens that inverts the image, hence the 180 degree rotation from stripe 66 to detector 46. Other embodiments of the lens system 64 may be used including embodiments that do not cause image inversion. A preferred embodiment of lens system 64 is a gradient index (GRIN) rod array. This preferred embodiment produces an erect image, rather than an inverted image.

Figure 7B:
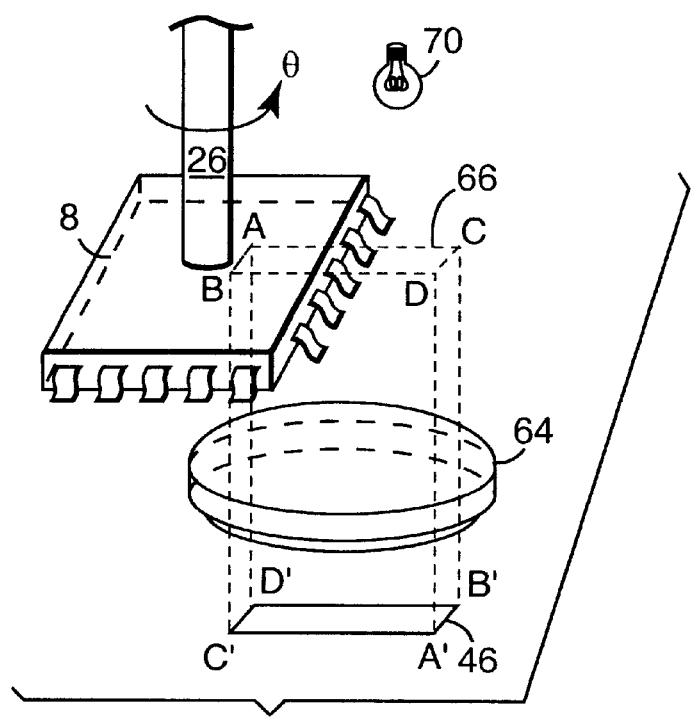

FIG. 7B shows a configuration of the present invention with back-lit illumination.

An extended light source 70 illuminates the top of leaded component 8. Detector 46 is positioned to view a stripe in the viewing plane on the underside of component 8, and the light which forms the image of stripe 66 passes through lens system 64. Stripe 66 on the underside has four corners, A–D, which correspond to points A'–D' on the detector after the light is passed through lens system 64. Leaded components, such as the QFP have opaque leads protruding from the side of the component and are especially well suited to back-lit illumination. The word "image" as used in this document includes a shadow image formed by light blocked by an object (in this case, the component) and light not blocked by the object. The present invention, with back-lit or back-lit shadow casting illumination, may be practiced with objects that are opaque, absorptive, at least partially reflective or translucent.

Figure 7C:
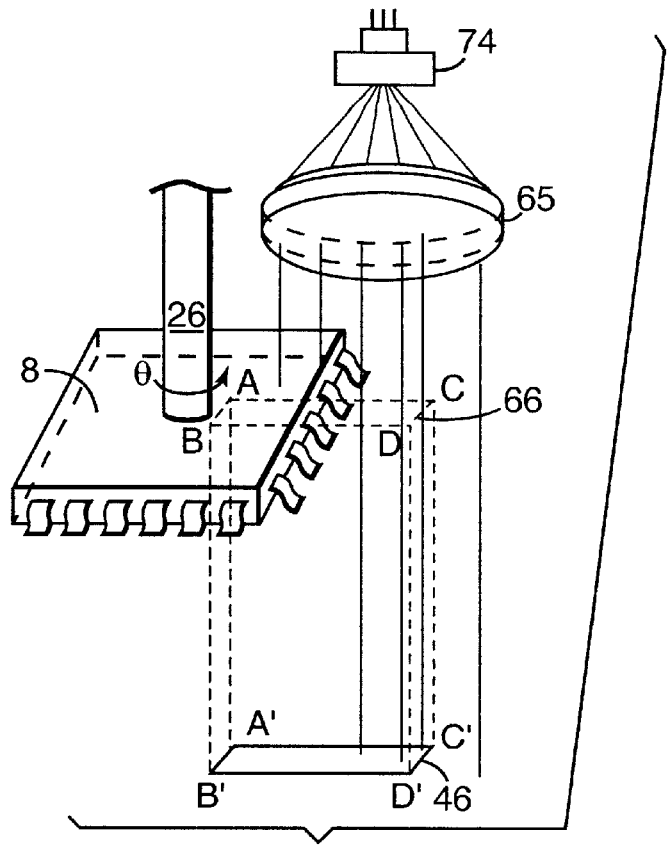

FIG. 7C shows a configuration of the present invention with back-lit shadow casting. A laser source 74, (or any other appropriate point source) shines light through an optional collimating lens 64, positioned above component 8, so that the component 8 casts a sharp, high contrast shadow onto detector 46. A lens system 64 may optionally be introduced between stripe 66 and detector 46 to enhance the sharpness and contrast of the shadow. Stripe 66 on the underside has four corners, A–D, which correspond to points A'–D' on detector 46.

Figure 7D:
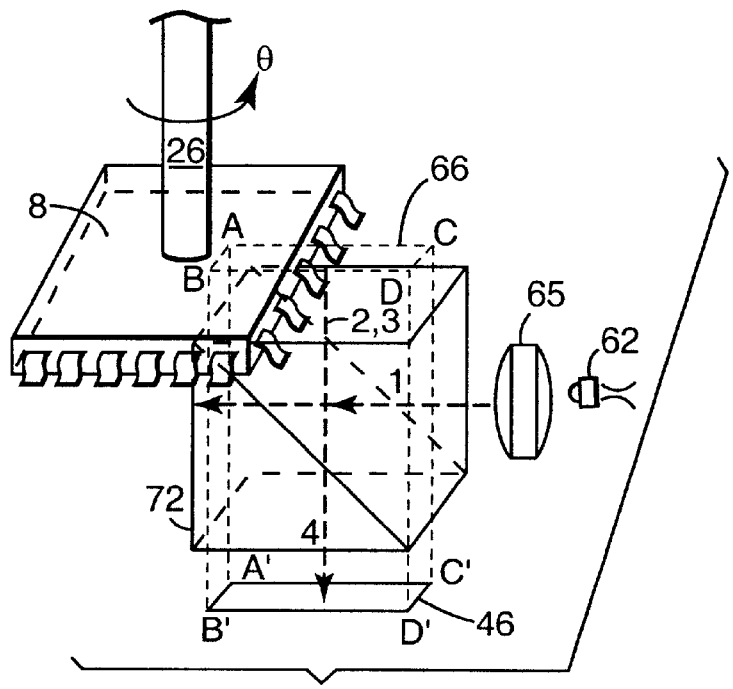

FIG. 7D shows a configuration of the present invention with reflective shadow casting. Point light source 62 is now positioned to the side of component 8, so as to minimize the space required for the apparatus of the present invention. The light from LED 62 passes through convex lens 64, and is partially reflected off the reflective surface in a beam splitter 72. After passing through lens 64, light ray 1 is re-directed by the mirrored surface with splitter 72, with half its initial intensity reaching the underside of component 8 in ray 2. Ray 2 is reflected back down through the partially reflective surface in beamsplitter 72 at 3, and with half the intermediate intensity, falls onto detector 46 at 4. This form of illumination is a special case of specular illumination, which is useful for imaging flat, highly specular objects such as flip-chips.

An optional lens system is omitted from all embodiments of the invention, including FIGS. 7A–D, for clarity. The lens system functions to image stripe 66 onto detector 46.

Figure 8:
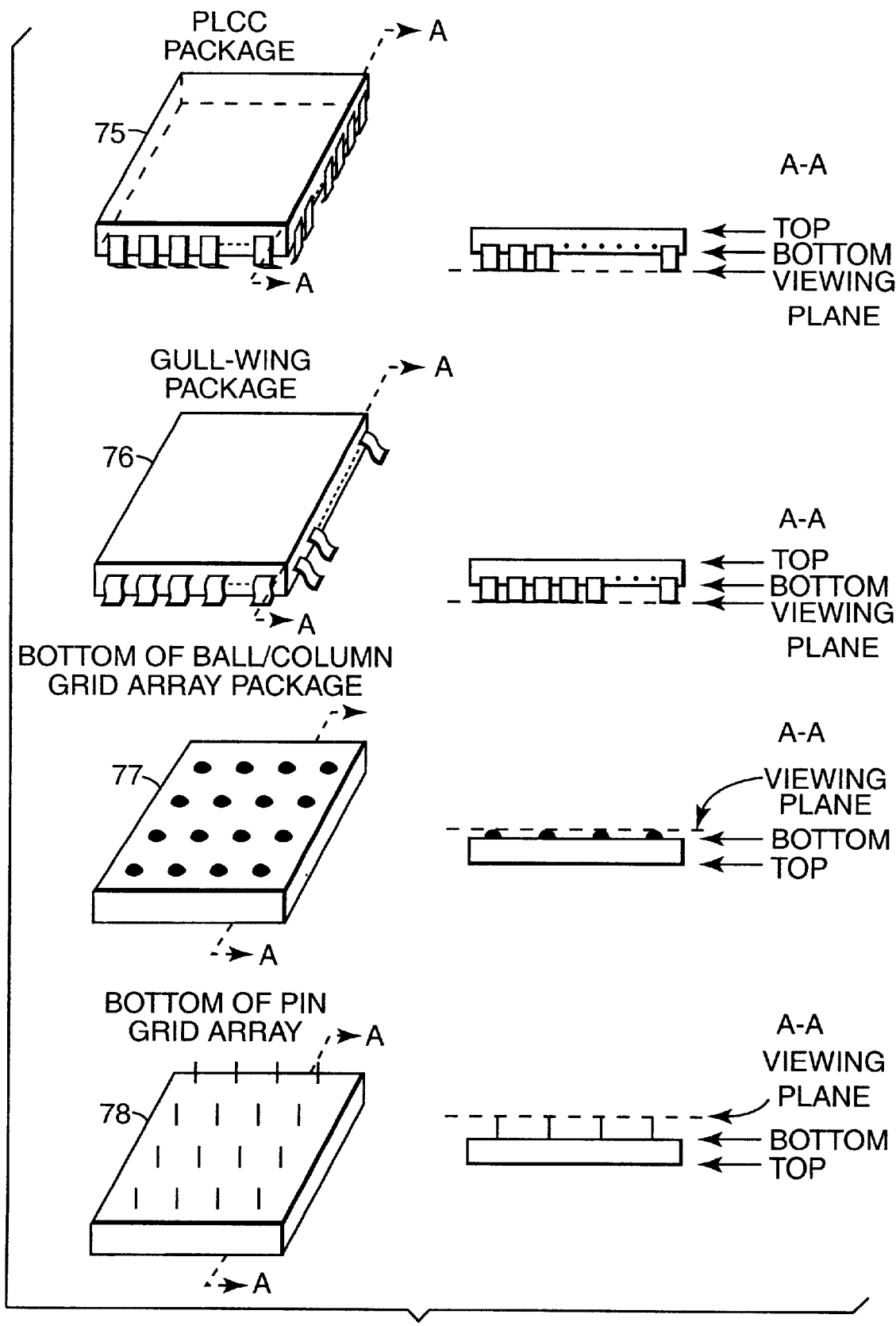
FIG. 8 shows diagrams of various types of components which may be inspected by the present invention: leaded components, ball and column grid array packages and pin grid array packages, respectively.

The present invention can be used with any type of object, and component 8 is shown as an example. Within the electronics assembly industry, the present invention may be used with resistors, capacitors and the like. FIG. 8 shows four different types of packaged components: leaded components such as PLCC 75 and Quad Flat Pack (QFP) 76, ball grid array (BGA) 77 and column grid array (CGA) packages (not shown), and pin grid array (PGA) package 78. Each type of package 75–78 includes a sectional view of the side of the package, with the top, bottom and the viewing plane identified. Other examples of leaded components are Small Outline Packages (SOPs) and Thin Small Outline Packages (TSOPs), while flip-chips are treated substantially the same as BGA-style packages. When the present invention is applied to acquiring information related to raised features on the package, such as coplanarity or height of a feature in a PGA, CGA or BGA package, the detector views a plane (i.e. the "viewing plane") formed by the extrema of the raised features. Otherwise, the physical bottom (or top as applicable) of the package is the viewing plane which detector 46 images.

Figure 9A:
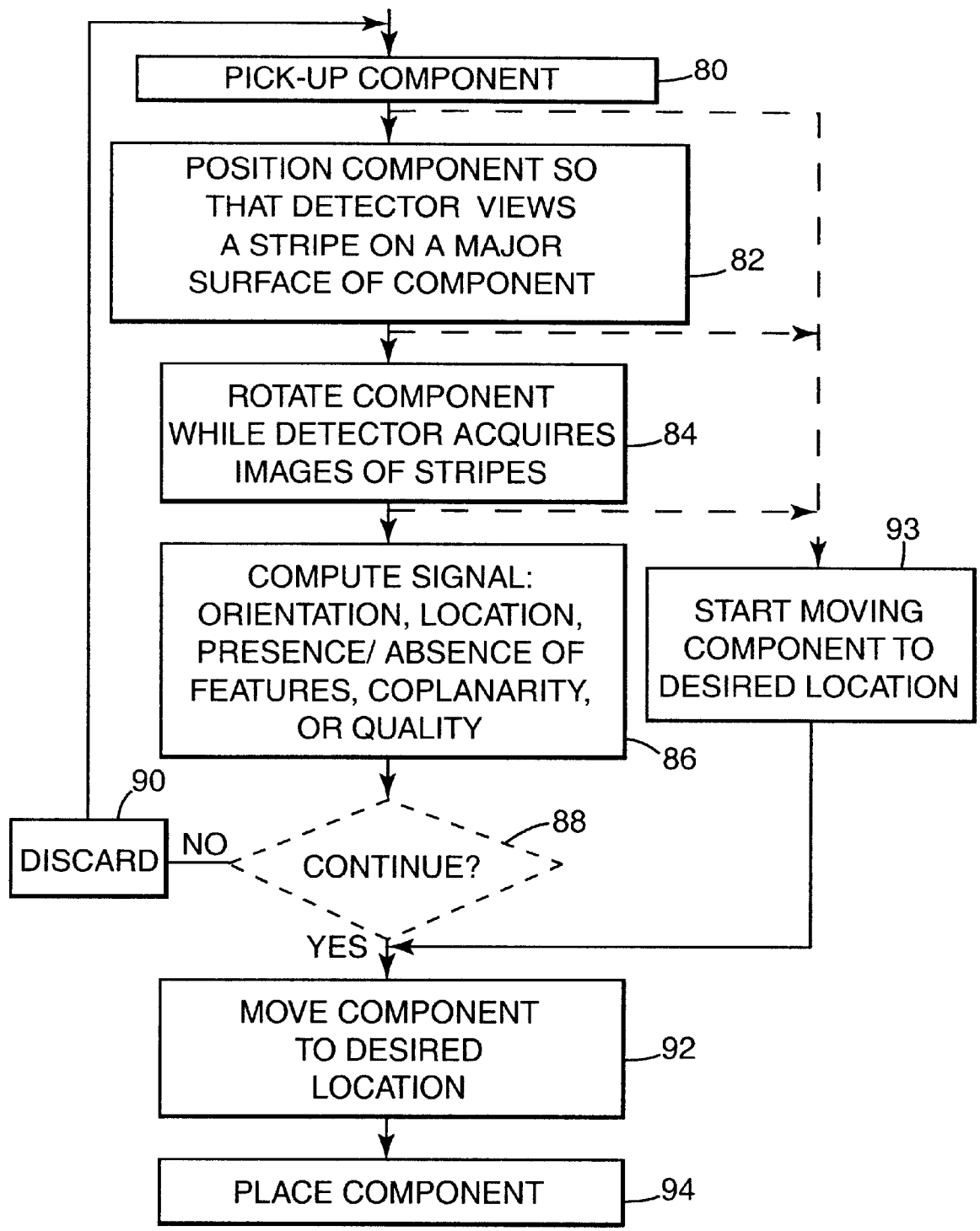
FIGS. 9A–B show flow-charts of the method of the present invention as used on-head and off-head, respectively.
Figure 9B:
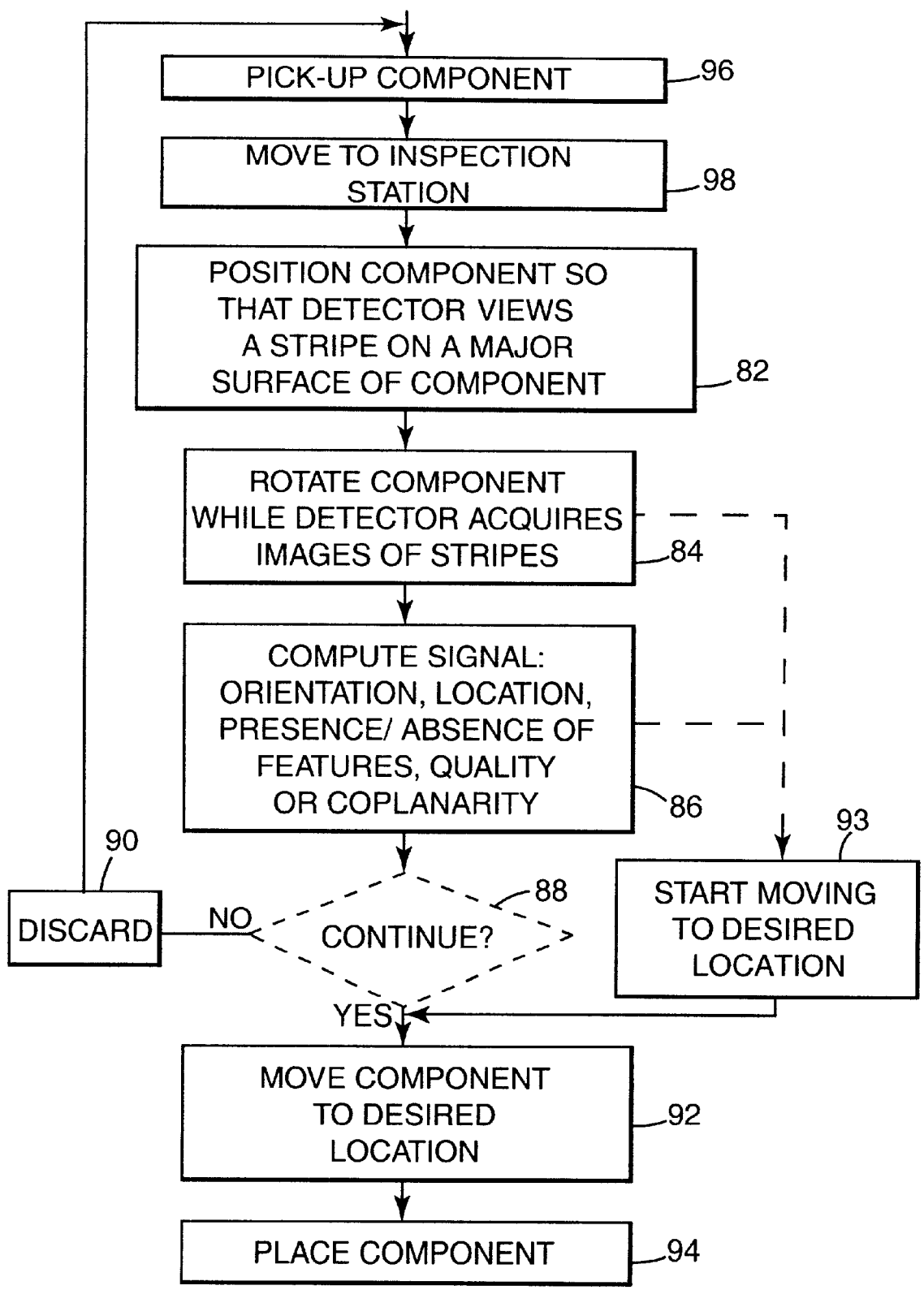

FIGS. 9A and 9B show the methods of the present invention, for on-head and off-head placement, respectively. Each of these methods may include optional initialization steps for preparing to pick-up the component (not shown). FIG. 9A shows block 80, where quill 26 picks up component 8. In block 82, quill 26 positions component 8 with respect to detector 46 so that detector 46 views a stripe in a viewing plane perpendicular to the central axis of the quill, the positioning typically accomplished by host processor 22 issuing instructions to motion control system 24 to cause quill 26 to position component 8. Component 8 may be optionally rotating at this point, in order to minimize the amount of time taken to place a component. In any event, component 8 is rotating when control electronics 50 sends trigger signals to detector 46 to cause detector 46 to acquire an image of a stripe, as shown at block 84. In real time when the application requires, processing circuitry 42 receives a plurality of images of stripes and depending on the desired signal, computes a signal representative of a physical condition of component 8, as shown in block 86. Optional block 88 shows a decision point for processor 22, where the processor can decide to discard this component and pick up another, if the signal is representative of the quality of component 8 and indicates that the component is unacceptable and should be discarded (block 90). (Because many of the components with large numbers of connections on them (pins, leads, columns or balls) are costly, it is important to place them precisely onto the printed circuit board.) Placing the decision block here in the process of placing a component also limits re-work done later in the process of manufacturing printed circuit boards. Block 93 indicates that the head 26 starts moving toward the component placement site on the board, and the dotted lines in the figure indicate by their placement that this step could start at any time after picking up the component. The words "move" or "place" as used throughout this document is intended to encompass any slidable or rotatable movement, and would include orienting the part in anticipation of placement and should be construed to include a pause or minimal re-direction of the object being moved. In block 92, processor 22 instructs motion control system 24 to move component 8 to the desired placement on a printed circuit board, which would also necessarily include orienting the component according to the signal, for precise placement on the board. Finally, in block 94 component 8 is placed on the circuit board.

FIG. 9B shows an off-head placement method of the present invention where the component is picked-up (block 80), and then moved to an inspection station to acquire any information about the orientation of the part (block 98). In this process, the step of orienting the part is performed sometime before placement and not necessarily simultaneously with the movement of the head toward the target printed circuit board, as in the method of FIG. 9A. The blocks 82, 84, 86, 88 and 90 have the same purpose and function as described previously. At block 92, the component is moved to the desired location, which would also include orienting the part in anticipation of placement. At block 93 movement in the general direction of the board may begin at any time after the completion of the step in block 84. Finally at block 94, the component is placed on the board. Off-head placement systems are less complicated mechanically, simpler to maintain and are less costly than on-head systems, since there is no need for the sensor which provides a signal representative of orientation to travel with the head.

Figure 10A:
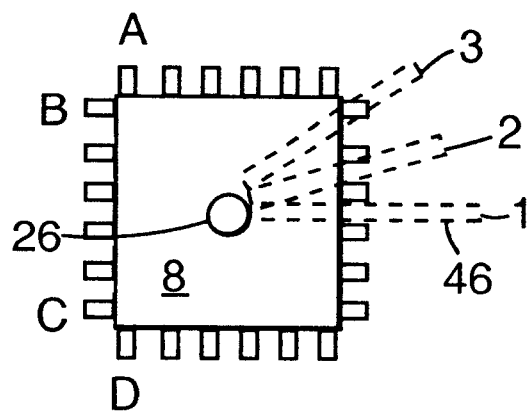
FIGS. 10A–C show a time sequence of plan-view sketches of a component, as viewed by the detector in certain embodiments of the present invention, a polar array as output from the electronics, and a corresponding Cartesian array image of the component, an optional step in the present invention, respectively.

FIG. 10A shows a time sequence of the location of the stripes viewed by detector 46, while component 8 rotates, it is not intended to indicate which element is actually rotating. In this embodiment of the invention, the detector is positioned to view a radially oriented stripe which has one end towards the center of component 8 and the other end, in general, off of component 8. These stripes generally include the perimeter of component 8, which is the area of interest for components with leads along the perimeter. The first stripe acquired views an area on the component located at 1, a later stripe located at 2 and a third stripe is shown located at 3. Any number of stripe views can be taken by the detector 46, but in general 15,000 stripes for a 50 mm size leaded component is sufficient to achieve 14 micron resolution at the corners. For the purpose of orienting the component, fewer stripes may be acquired. The minimum number of stripes acquired when the purpose is to orient the component would be two stripes which show opposing leads, since it is known that when the location of two opposing leads is known the orientation of the part may be computed. Leads A, B, C and D are indicated on the sequenced sketch of component 8. However, more reliable placement may be achieved by locating a plurality of features and determining the orientation that minimizes placement errors (e.g., minimizing the RMS or maximum feature position error).

Figure 10B:
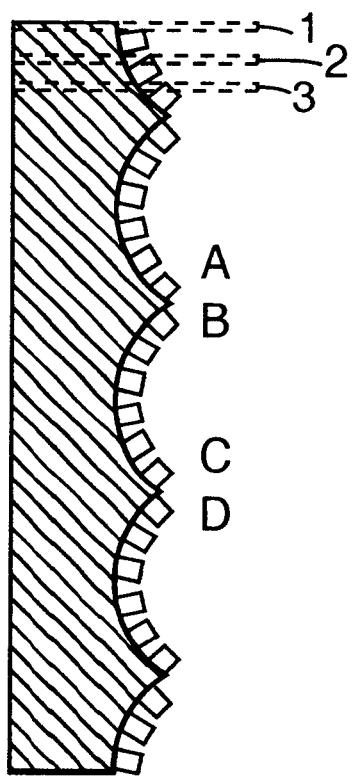
Figure 10C:
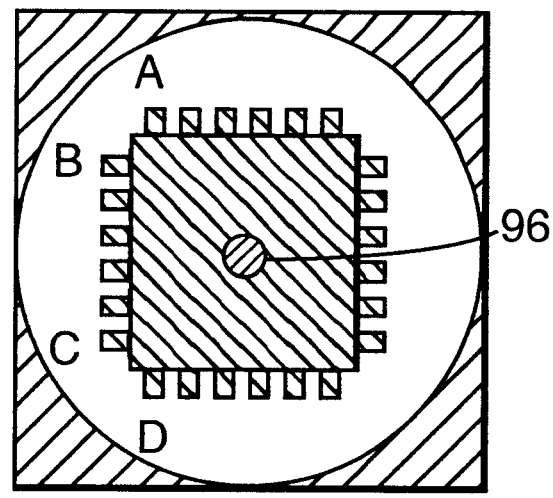

FIG. 10B shows a polar image array including lines of output from detector 46, each line representing the entire output of detector 46. The polar array is composed of polar data in that each of the segments represents the output from detector 46 taken at different angular positions of quill 26. The image of stripe 66 labeled 1 in FIG. 10A is labeled 1, and other images of stripes as output from detector 46 are labeled in a similar fashion. The leads A–D which are viewed in FIG. 10A are shown in the polar output of FIG. 10B. FIG. 10C shows a reconstructed Cartesian image of the component 8, after processing circuitry 40 assembles and computes a signal representative of a physical condition of component 8. There is a hole 96 in the image, because the end of stripe 66 closest to the center of the component was offset from the center of rotation of the component. The interior of hole 96 indicates where the present invention provides no data about component 8. In this case, the object is rotated through 360 degrees to obtain a complete image.

Figure 11A:
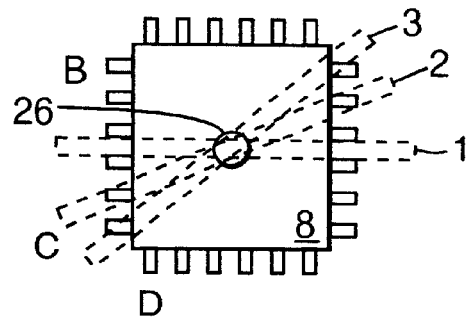
FIGS. 11A–C show a time sequence of plan-view sketches of a component, as viewed by the detector in certain embodiments of the present invention, a polar array as output from the electronics, and a corresponding Cartesian array image of the component, an optional step in the present invention, respectively.

FIG. 11A shows a time sequence of the location of the stripes viewed by detector 46, while component 8 rotates. In this embodiment of the invention, detector 46 is positioned to view a stripe which generally includes two edges of component and its center (a "cross-component" stripe), so that stripe 66 is taken across the entire component. The length of detector 46 in this embodiment is substantially twice the length of the detector used to provide the data in FIGS. 10A–D, since stripe 66 in this embodiment is approximately twice as long. Stripe 66 will necessarily extend off the component when viewed at certain angular rotations. It will be understood that either type of detector may be used interchangeably. In this case, a complete image of the object can be obtained with a 180 degree rotation. If a detector is situated off-axis as in FIGS. 16A–D, two images of the object are obtained from a 360 degree rotation and height information may be computed as desired.

The first stripe acquired views an area of the component located at 1, a second stripe located at 2 and a third stripe shown located at 3. Any number of stripe views can be taken by the detector 46. For the purpose of orienting the component, fewer stripes may be acquired. The minimum number of stripes acquired when the purpose is to orient the component would be one stripe which shows at least a portion of two leads, preferably diagonally opposing leads, since it is known that when the location of two leads is known the orientation of the part may be computed. Leads A, B, C and D are also indicated on the sequenced sketch of component 8. FIG. 11 A shows various segments of component 8 viewed by detector 4 at different moments of time. It is not intended to indicate which element is actually rotating.

Figure 11B:
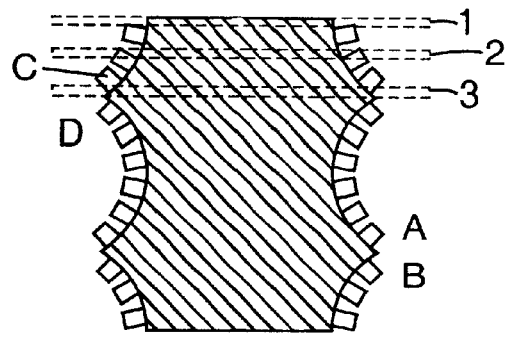
Figure 11C:
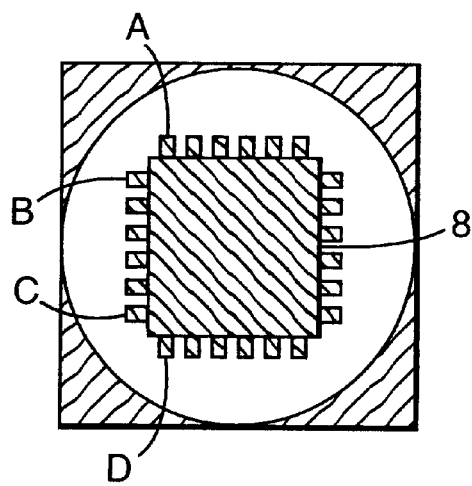

FIG. 11B shows a polar image array including lines of output from detector 46, each line representing the entire output of detector 46. The polar array is composed of polar data, and an image of stripe 66, as received from detector 46, at the corresponding angular position of component 8. The image of stripe 66 labeled 1 in FIG. 11A is labeled 1 in FIG. 11B, the other images of stripes as output from detector 46 similarly labeled. The leads A–D which are viewed in FIG. 11A are also shown in the polar output of FIG. 11B. FIG. 11C shows the reconstructed Cartesian image of the component 8. There is no hole in the reconstructed Cartesian image, since all the stripes imaged were cross component stripes.

Figure 12A:
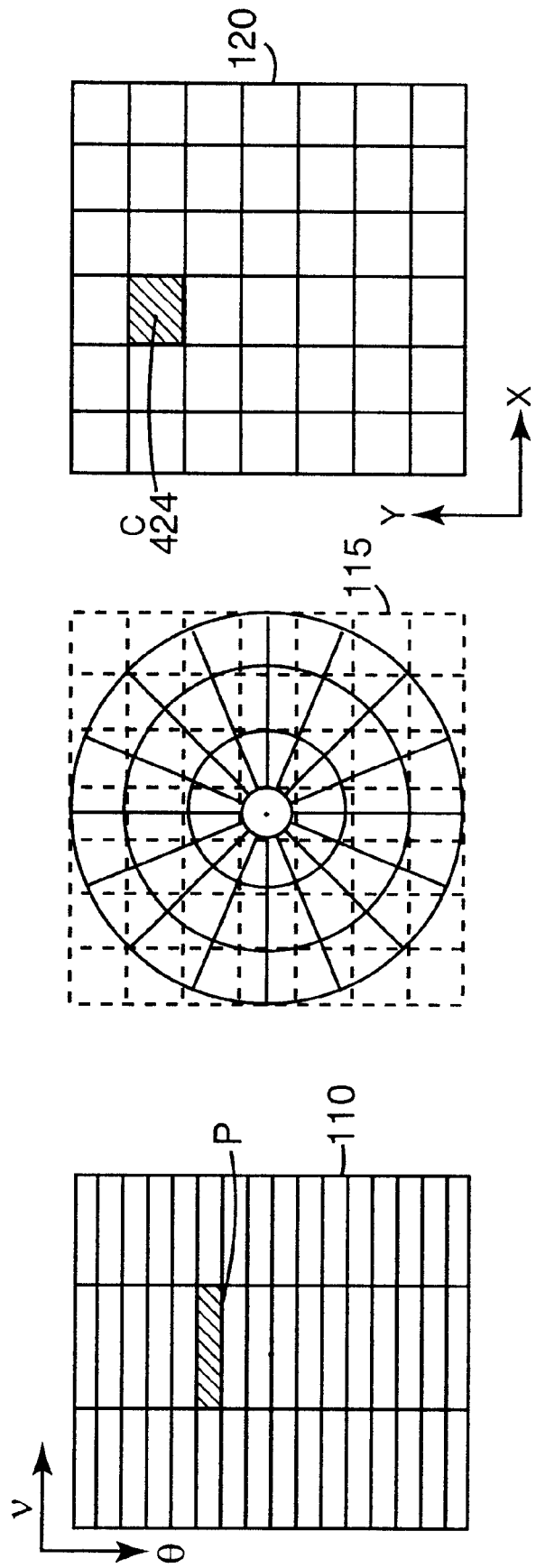
FIGS. 12A–B show a three sketches of a polar array, a sketch showing how polar data maps to Cartesian space, a Cartesian array, and lastly, a flow chart for converting from a polar data array into a Cartesian data array, respectively.

Processing circuitry 40 optionally converts the polar array into a Cartesian array, depending on the application. In FIG. 12A, polar array 110 shows multiple boxes, each representing a location in the array. Each line of polar array 110 represents the image of a stripe output from detector 46. (The detector is not drawn to scale, and are somewhat shorter for the purposes of illustration. Normally a detector would have 1024 or more elements.) Similarly, Cartesian array 120 shows multiple boxes, each representing a location in array 120. A gray value representative of one pixel from detector 46 is stored within each of the elements of array 110. Each point in each of the arrays corresponds to a unique point in the viewing plane, but since one pixel will include many points, there is no one-to-one correspondence between polar elements and Cartesian elements. Diagram 115 shows a mapping of polar array 110 mapped onto Cartesian array 120.

Figure 12B:
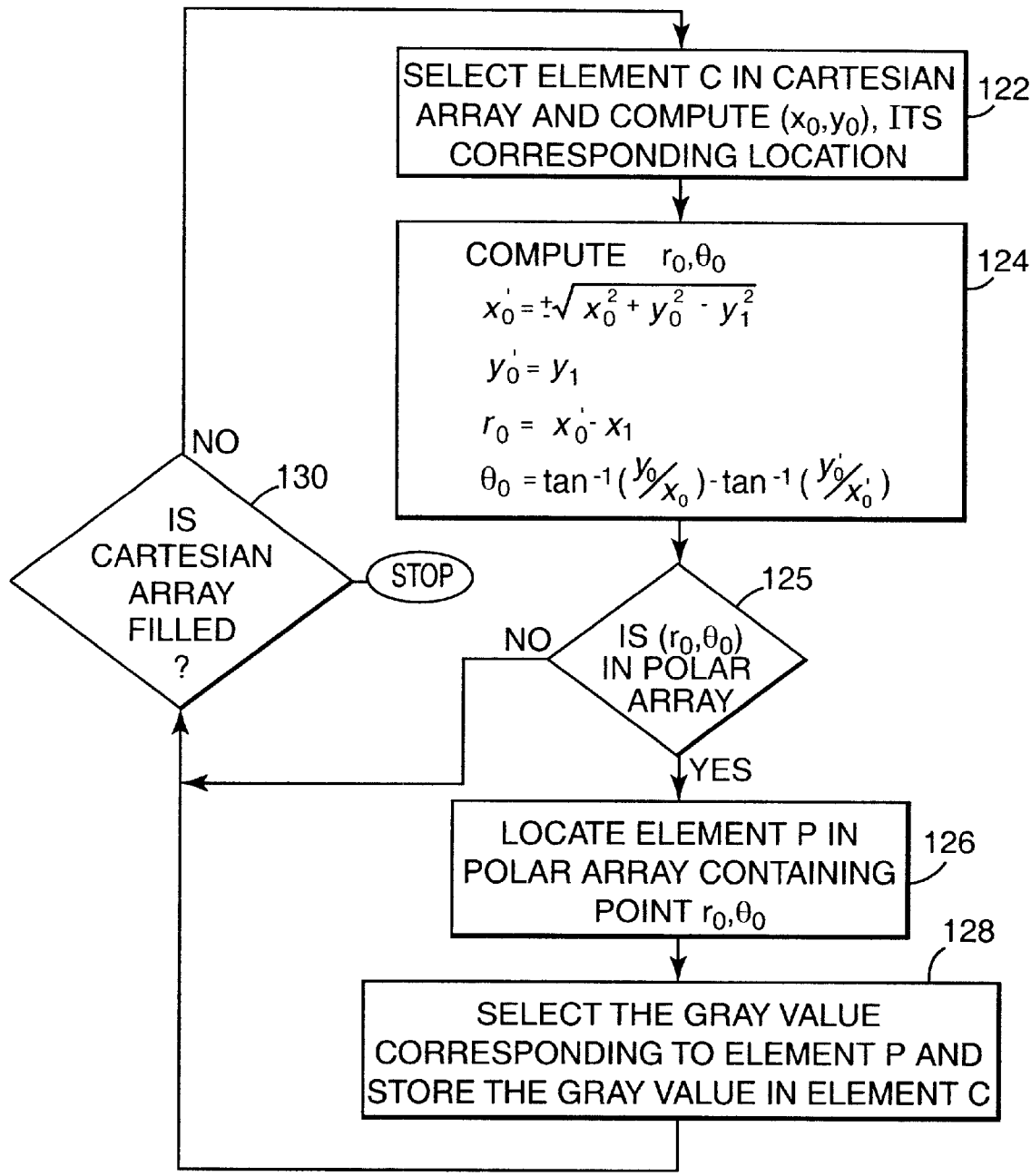
Figure 13:
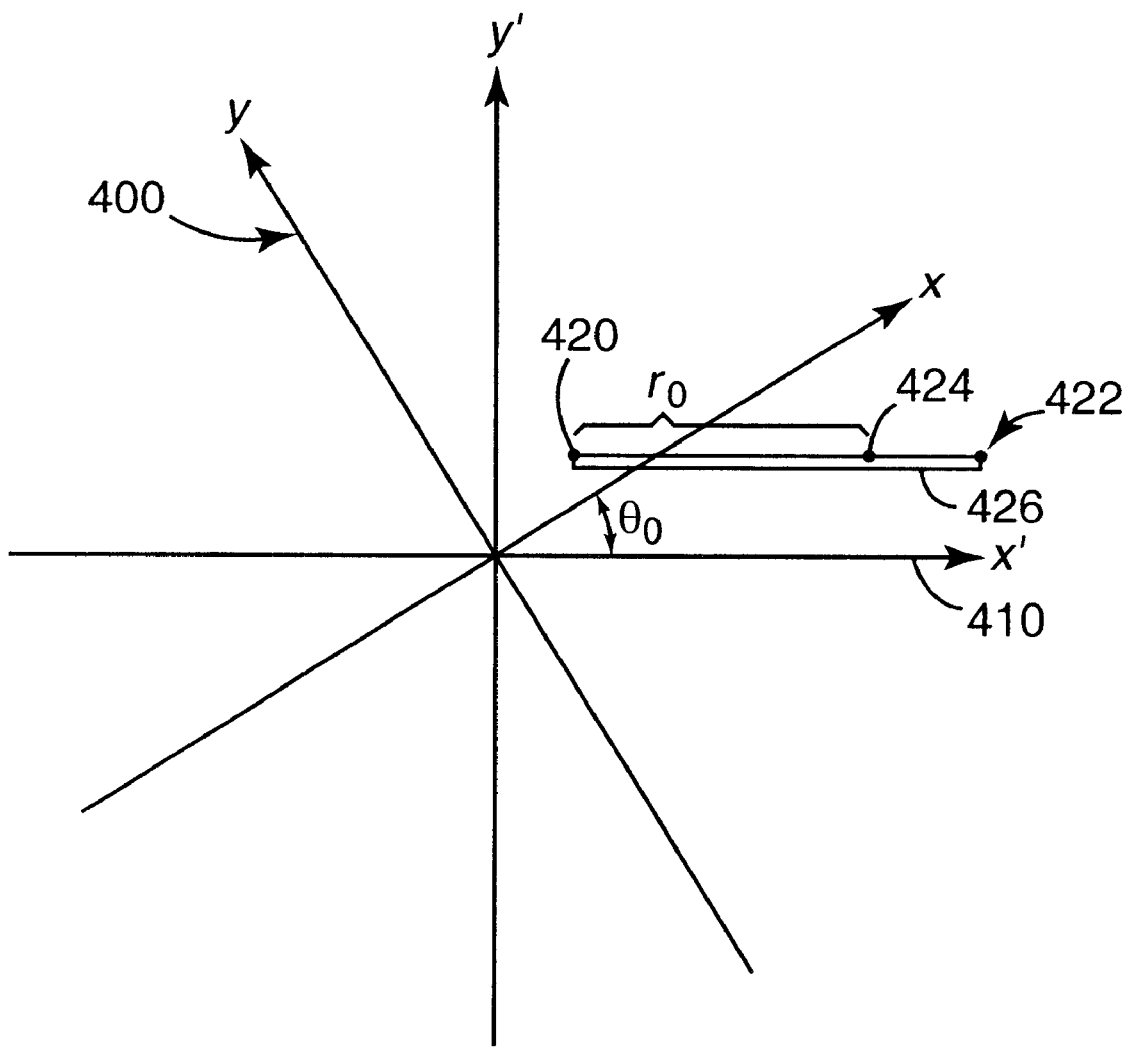
FIG. 13 shows a pair of coordinate system axes, for use in converting between polar and Cartesian coordinates.

The process of converting from polar array 110 into Cartesian array 120 for on-axis embodiments is shown in the flow chart in FIG. 12B, where the first step is to select a point 424 from array 120 (block 122) and then compute its corresponding (x,y) coordinates. Then, the polar coordinates corresponding to the point 427 are computed (block 124). FIG. 13 shows the x,y coordinate system 400 of the component, and the x'y' coordinate system 410 of stripe 66. These coordinate systems are rotated by an angle θ. Also shown are points 420 at $(x_1, y_1)$ (representing the left edge of stripe 66), 422 at $(x_2, y_2)$ (representing the right edge of stripe 66), and 424 at $(x_0, y_0)$ in the array. The goal is then to determine $\theta_0$ and $r_0$ corresponding to $(x_0, y_0)$. To begin, first find the location of point 424 in the $(x_1, y_1)$ coordinate system. The coordinate systems are rotated so that $y'_0 = y_1$, hence, $$x'_0 = \pm \sqrt{x_0^2 + y_0^2 - y_1^2} \tag{1}$$

If stripe 66 is located in a viewing plane of the component and runs from the center of the component to the edge, then x'≧0 and $$x'_0 = \sqrt{x_0^2 + y_0^2 - y_1^2} \tag{2}$$

$$y'_0 = y_1 \tag{3}$$

$$\theta_0 = \tan^{-1}\frac{y'_0}{x'_0} - \tan^{-1}\frac{y_0}{x_0} \tag{4}$$

$$r_0 = x'_0 - x_1 \tag{5}$$

where 0≦θ<360°. If stripe 66 runs from edge to edge (a cross-component stripe), then Equation 2 must be solved for both the positive and negative square roots and Equations 3 through 5 must be solved for both possible values of $y_0'$. One solution will yield 0<$\theta_0$<180 degrees, and that solution is chosen.

Once the $(r_0, \theta_0)$ values are computed, processing circuitry 40 decides if the $(r_0, \theta_0)$ values are within the polar array (block 125), and then locates the target element of array 110 which contains point $(r_0, \theta_0)$ (block 126) if appropriate. In block 128, the circuitry stores the gray value which corresponds to $(r_0, \theta_0)$ into the Cartesiaiarray 120. A variety of algorithms may be employed to locate an appropriate gray value, including a nearest neighbor and a linear interpolation algorithm, although the present invention is not limited to these algorithms. This process continues, until the Cartesian array 120 is filled to the extent necessary for computing the signal of interest (block 130).

Regardless of the algorithm employed for the conversion, processing circuitry 40 operates on the collected images to provide a) the orientation of component 8; b) the location of certain features on component 8, such as the location of pins, columns or leads (as appropriate for the component type in view); c) the absence of certain features on component 8, such as missing balls, columns or leads; d) the distance between leads on a leaded component (e.g., lead tweeze); or e) the height or features on component 8 or coplanarity of features on component 8. To determine the orientation of component 8, a minimum of two opposing features must be located and design information about the type of component must be retrieved from processor 22. Computing the orientation, once the Cartesian array is known, is a matter well known to those skilled in the art. The location of a desired feature on the component, sometimes used as an indicator whether the part is the expected component, may be computed as desired. For instance, the distance between leads on a leaded component is computed in two dimensions by computing the (x,y) distance between two points in array 120 corresponding to the desired leads. The height of a desired feature on a component is computed as discussed below in the off-axis embodiments, which are necessary to provide height information. The coplanarity of features on a component may also be computed. In this computation, a reference plane is selected which is formed by at least three of the features (balls, columns or pins) and the deviation of any particular feature from the plane is computed and reported, although in many instances the deviation, computed as an average, standard deviation or the like, is compared to a threshold value to determine whether the component should be discarded or placed. The reference plane may be the well-known best fit plane, or JEDEC seating plane, although the present invention is not limited to these algorithms.

Creating a Cartesian array is computationally intensive. It may be preferable to identify features in polar coordinates and convert only this set of feature locations to Cartesian coordinates. Referring again to FIG. 13, given the P (r,θ) location of point 424, the left edge 420 of stripe 66 at ($x_1,y_1$), its location in stripe 66 coordinate system 410 is given by:

$$x'=r_0+x_1 \quad (6)$$

$$y'=y_1 \quad (7)$$

Using the standard equations for rotating the coordinate system 410 the x,y coordinates of point 424 are given by:

$$x=(r_0+x_1)\cos\theta_0+Y_1\sin\theta_0 \quad (8)$$

$$y=-(r_0+x_1)\sin\theta_0+y_1\cos\theta_0 \quad (9)$$

When the height of a raised feature on a component is desired, one of the off-axis configurations of FIGS. 16–21 must be employed, since these embodiments are able to provide height information about a feature. The height of the feature must be calculated before the location of the feature can be calculated, because the image of a raised feature will necessarily shift on the detector as the height of the feature varies.

Figure 14A:
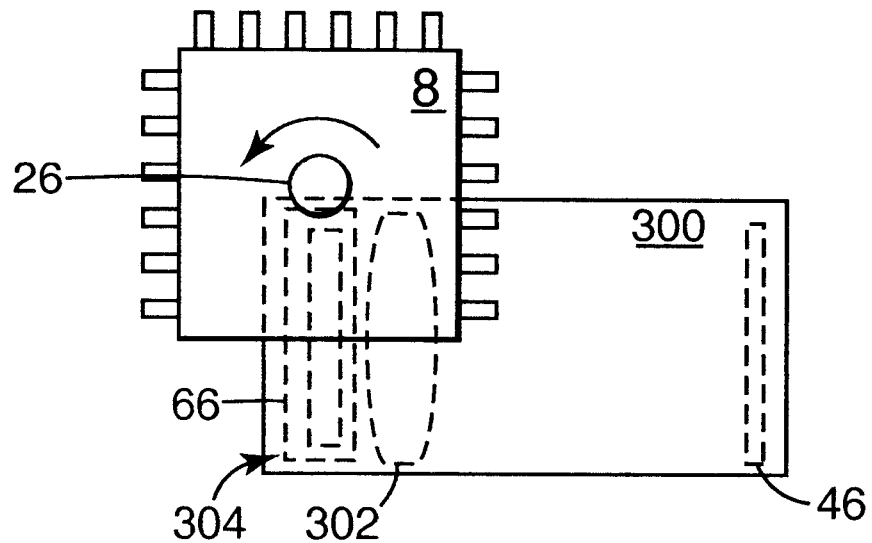
FIGS. 14A–G show a plan view of a housing, positioned in place under a component, an isometric view of the housing, a sequenced time plan-view sketch of the method of present invention as performed on the present embodiment, and the embodiment of FIG. 14A with front-lit diffuse illumination, front-lit specular illumination, back-lit illumination and shadow casting illumination, respectively.
Figure 14C:
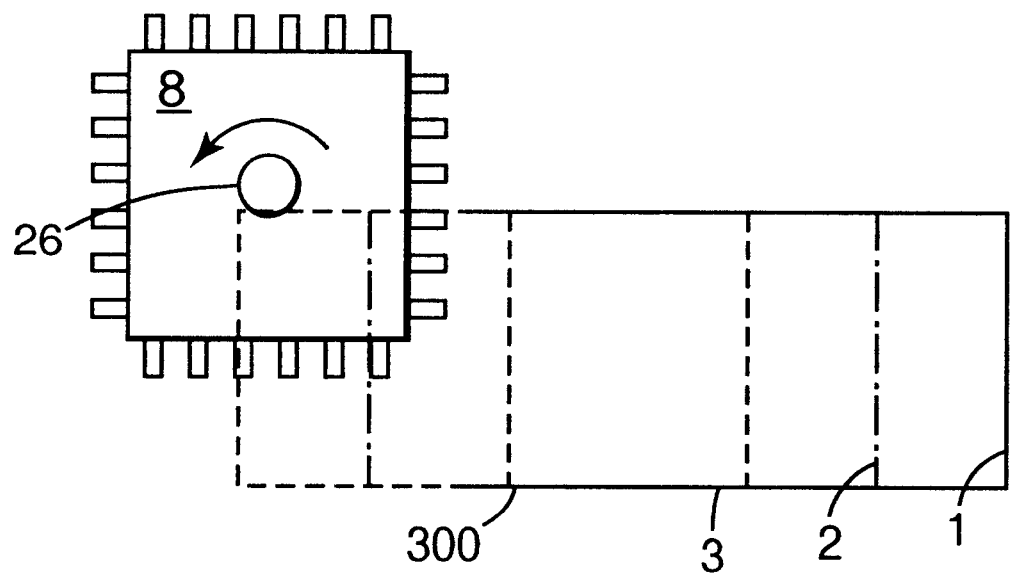
Figure 14B:
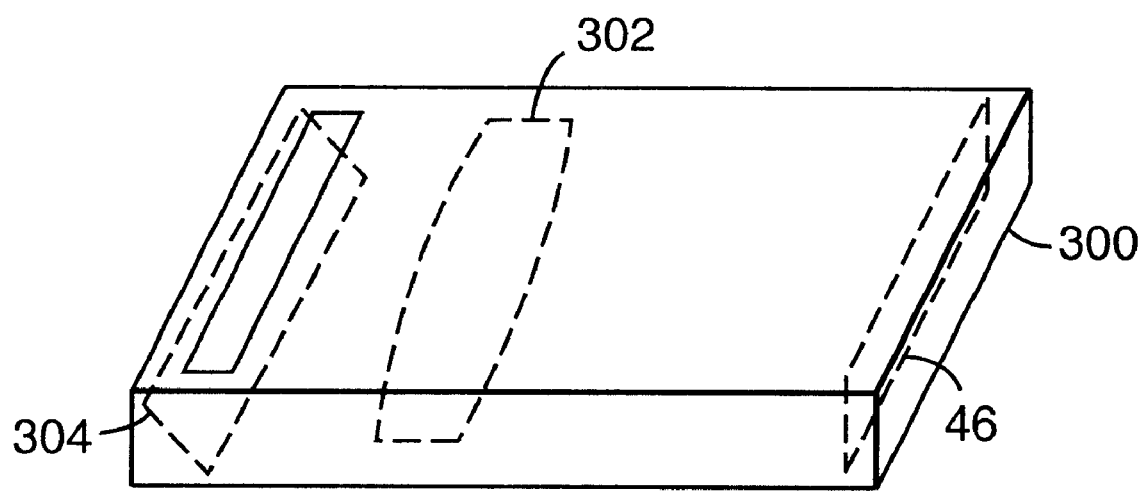
Figure 14E:
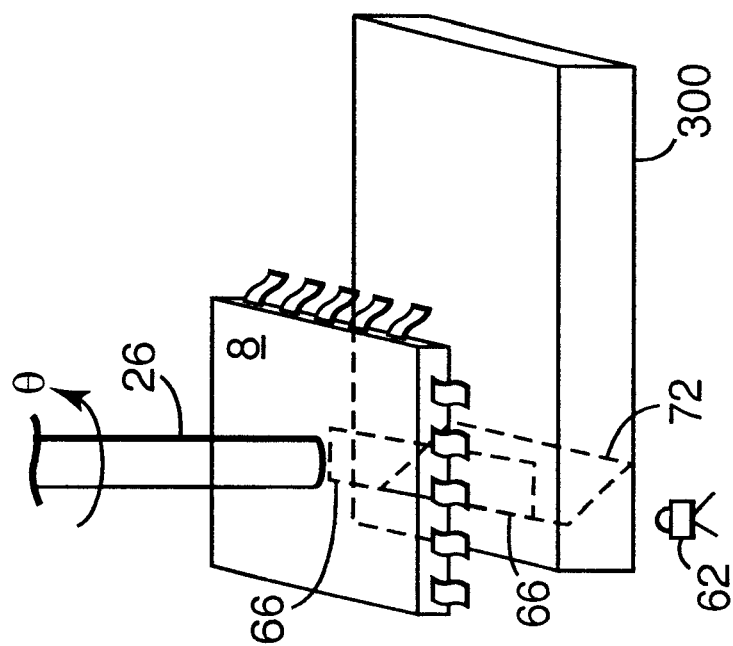
Figure 14D:
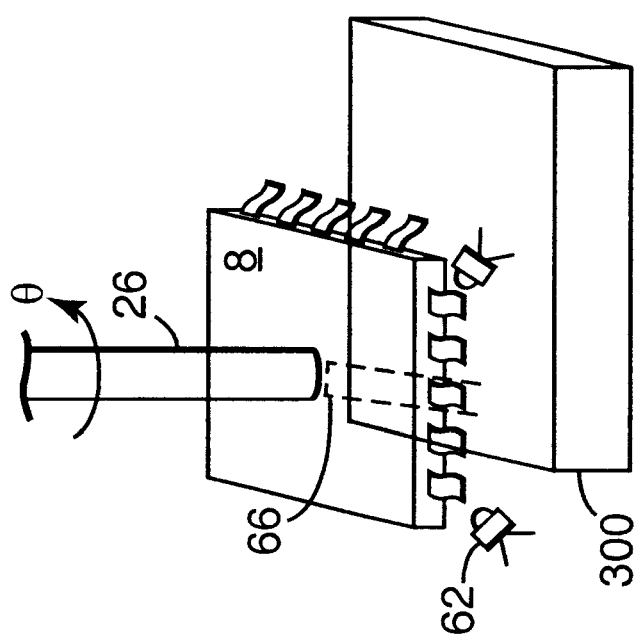
Figure 14G:
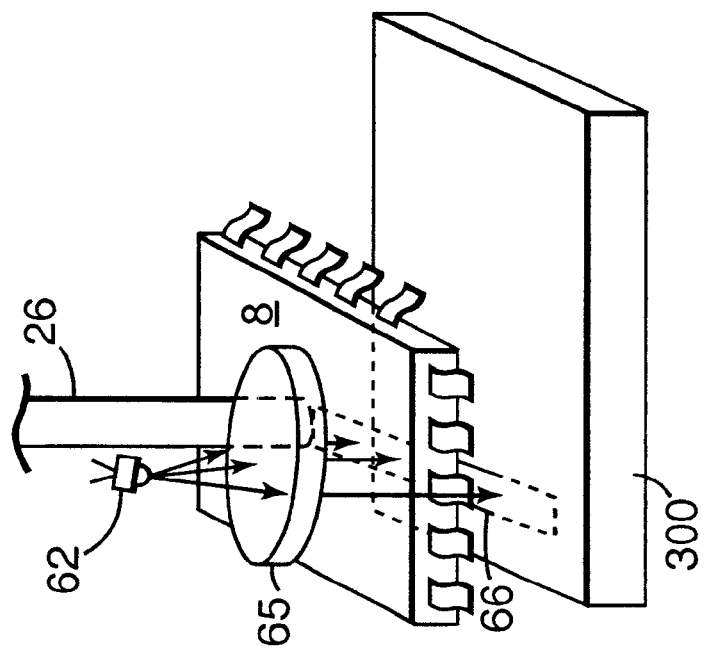
Figure 14F:
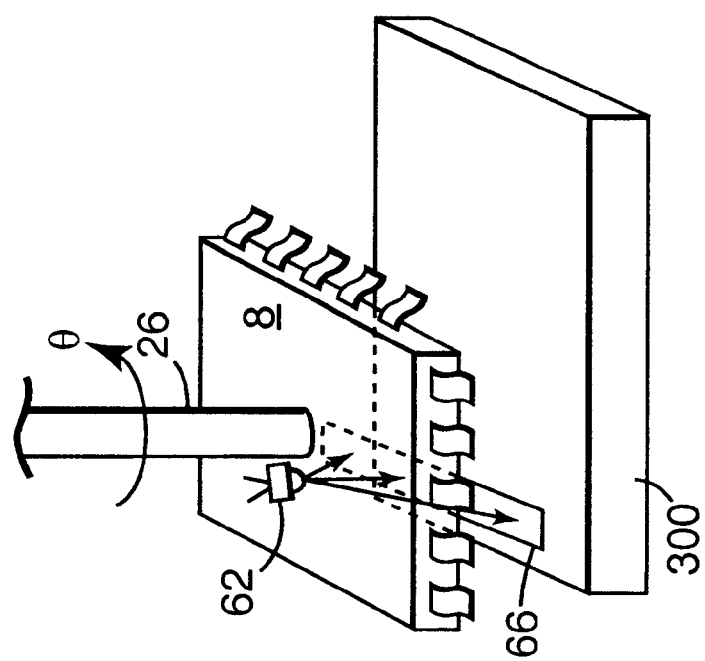

One embodiment of the present invention which minimizes the space necessary for a measurement is shown in FIG. 14A, where a housing 300 incorporates detector 46, an optional lens system 302 and a mirror 304. FIG. 14B shows an isometric view of housing 300. In the sequenced time sketch shown in FIG. 14C, housing 300 is slidably moved by an arm driven by separate pick and place motors into place under component 8 for viewing stripes on the underside of component 8. A kinematic mount (not shown) may also be used to repeatably position housing 300 at location 3. In general, quill 16 will be spinning component 8 while housing 300 is moved into place, but rotation may also be started once all the movement of housing 300 is completed. After all the images necessary to provide the desired signal are acquired, housing 300 is moved away and once head 26 transports component 8 to the printed circuit board, component 8 is placed on the board. FIGS. 14D–G show the present embodiment with front-lit diffuse, front-lit specular, diffuse back-lit, back-lit shadow cast illuminations, respectively.

Figure 15B:
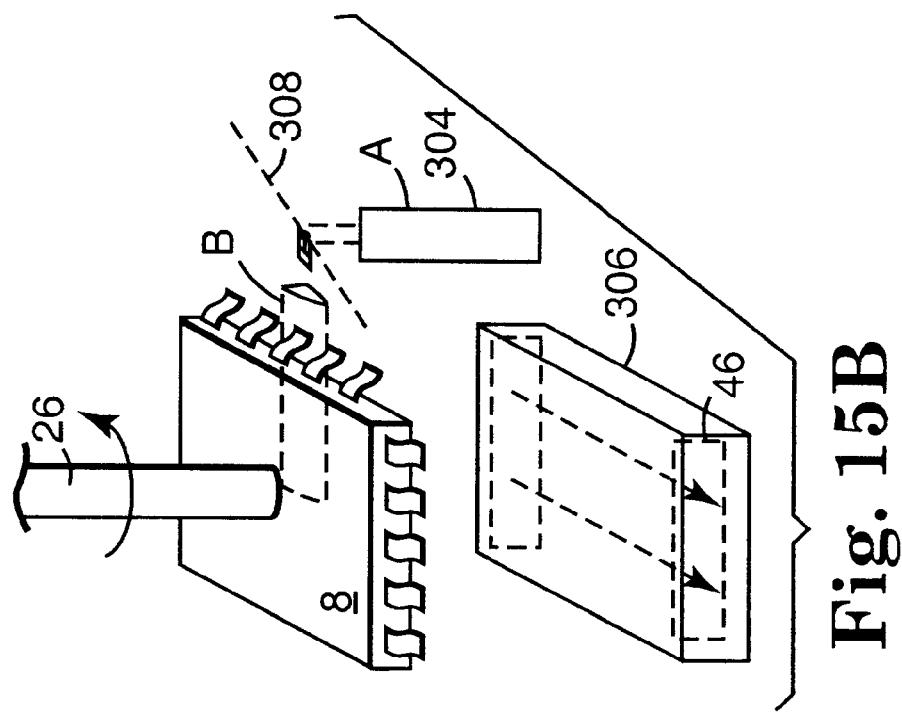
FIG. 15B shows a rotatable mirror embodiment of the present invention.
Figure 15A:
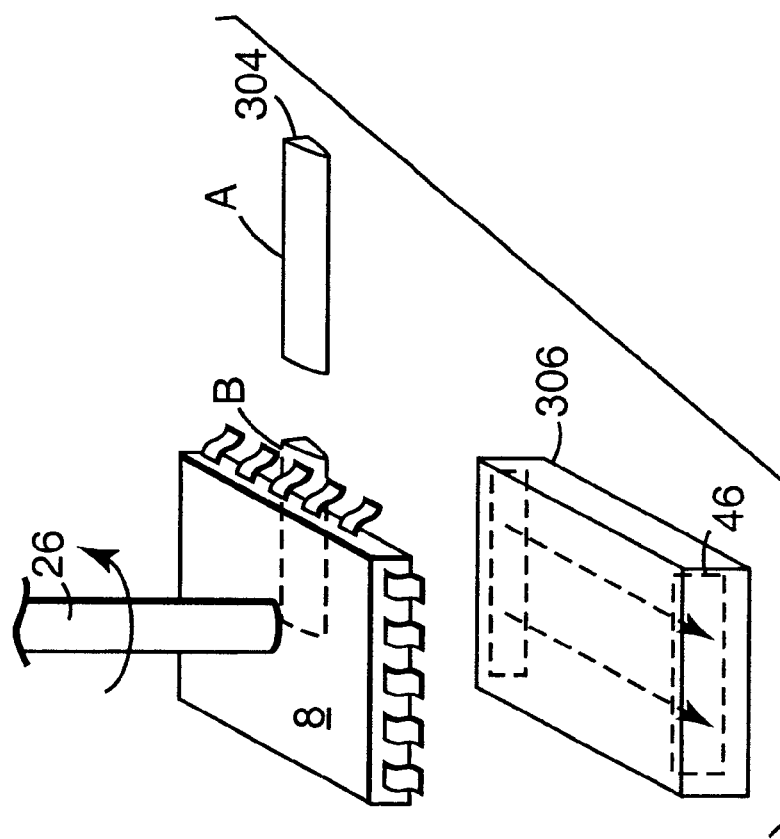
FIG. 15A show an isometric view of another embodiment of the present invention with a mirror positioned outside of the housing, including two positions of the sliding mirror.

One variation of this embodiment is shown in FIG. 15A, where mirror 304 is positioned outside of a housing 306. In this variation, housing 306 is stationary and mirror 304 is moved into place under component 8 in order to acquire images of stripes 66. In position A, mirror 304 is stored away from component 8, while position B shows position of mirror 304 while stripes are acquired. The sequence of placing component 8 on the printed circuit board is then the same as for the embodiment of FIG. 14A, but mirror 304 rather than housing 306 moves. Since the mirror weighs less than the housing, this embodiment which moves the mirror rather than housing assembly minimizes the mass which must be moved and thereby decreases the time required to inspect a component. Preferably, mirror 304 slides parallel to its surface, which relaxes the positional tolerances on the mirror's stopping position in the direction of travel. A second variation on the embodiment of FIG. 14A is shown in FIG. 15B, where mirror 304 rotates about an axis 308.

A preferred method and apparatus of the present invention is an off-axis configuration where detector 46 is positioned away from the component during the time the detector acquires data, so that when component 8 spins, detector 46 views each feature from at least two views, thereby providing the opportunity for information about the height and coplanarity of the features on components to be reported. The main benefit of an off-axis configuration is that the sensor housing does not obstruct placing the component (i.e. the sensor does not have to be moved out of the way before the component is placed). In this off-axis configuration in FIG. 16A, dotted lines projecting upwards and downwards from the outline of component 8 form a space 310, and detector 46 is located outside that space. An-observation plane 312 is formed between the detector 46 and stripe 66 viewed on the underside of component 8, the observation plane coincident with a central axis of rotation 316 of component 8.

It is understood that two different widths of detector 46 may be used in this configuration: the first width corresponding to a radially oriented stripe as shown in FIG. 10A, and the second detector corresponding to the cross-component stripe as shown in FIG. 11A. When the first type of detector 46 is used in any off-axis embodiment of the present invention, the stripes must image the component over 360 degrees of rotation in order to image all the features which are flush with the major surface of the component. When the second type of detector 46 is used in any off-axis embodiment, the stripes only need to image over substantially 180 degrees of rotation in order to image all the features which are flush with the major surface of the component. It is understood, however, that in order to determine the location of any raised (as opposed to a substantially flush feature (i.e. substantially flat) feature on the major surface of a component, the height of the feature must be first calculated, which necessitates two views of each feature, thereby precluding the use of the first type of detector 46 when information about raised features is desired. Further, the component must be rotated through 360 degrees to obtain two views of each features with the second type of detector 46.

This embodiment as used with cross-component stripes is preferred over other off-axis configurations, because regardless of the registration error in the z positioning of component 8 with respect to detector 46, acquiring data over 180 degrees of rotation will necessarily provide information about all the features which are flush with the underside of component 8. In other off-axis configurations, as discussed below, rotating the component over 180 degrees when the component is off-set from an ideal z position will not necessarily include all of the features which are flush with the major surface of component 8.

Figure 16A:
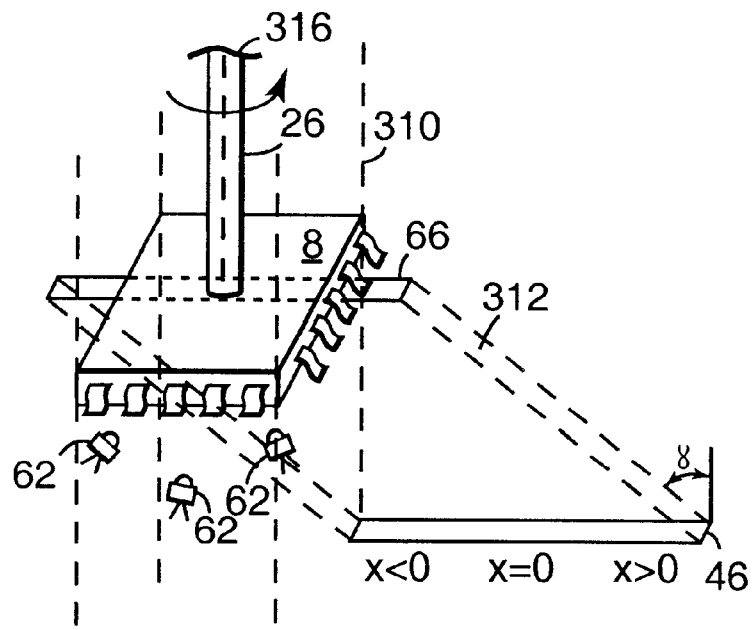
FIGS. 16A–D show a first off-axis embodiment of the present invention with diffuse, front-lit, back-lit, front-lit specular and shadow casting illumination, respectively.
Figure 16B:
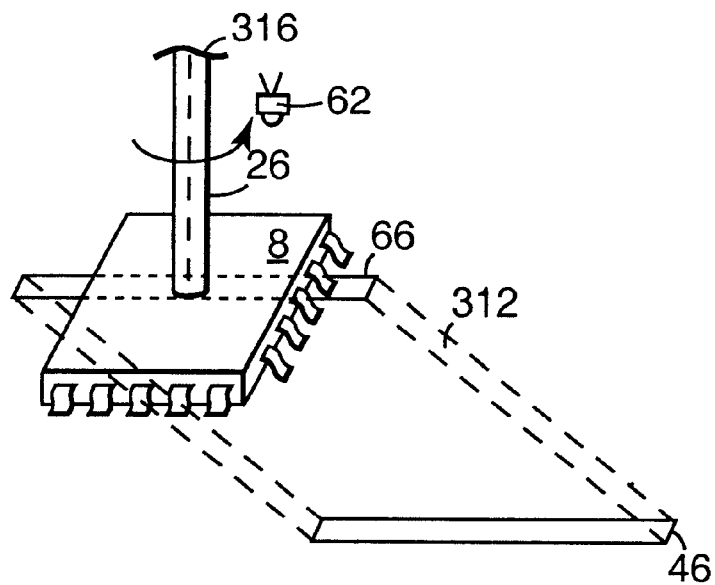
Figure 16C:
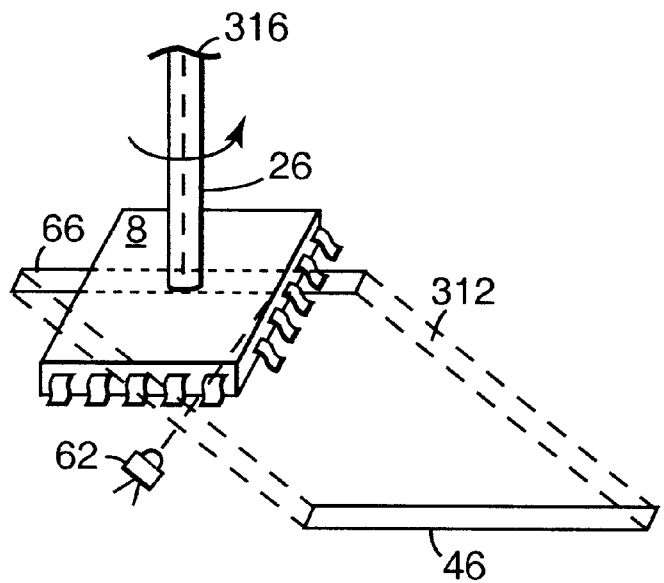
Figure 16D:
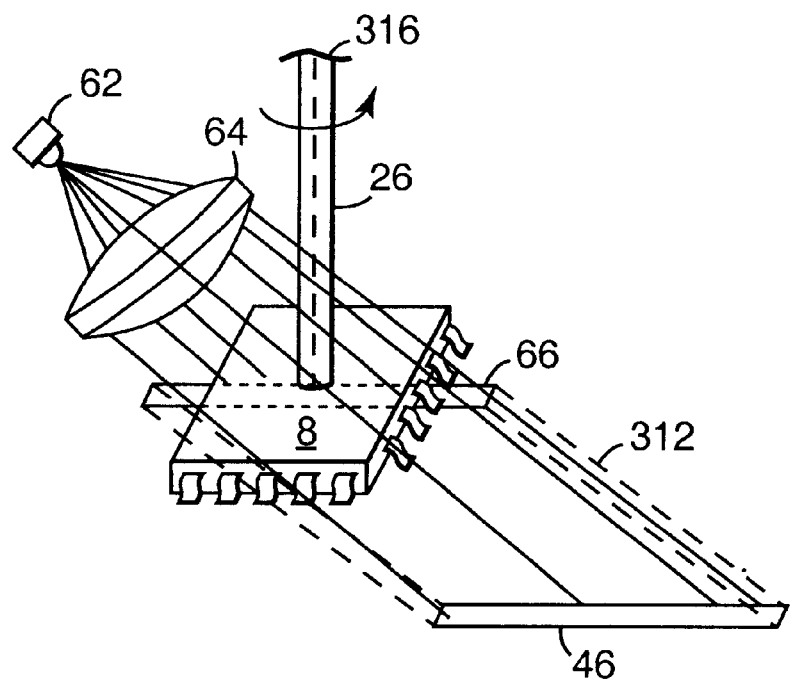
Figure 16E:
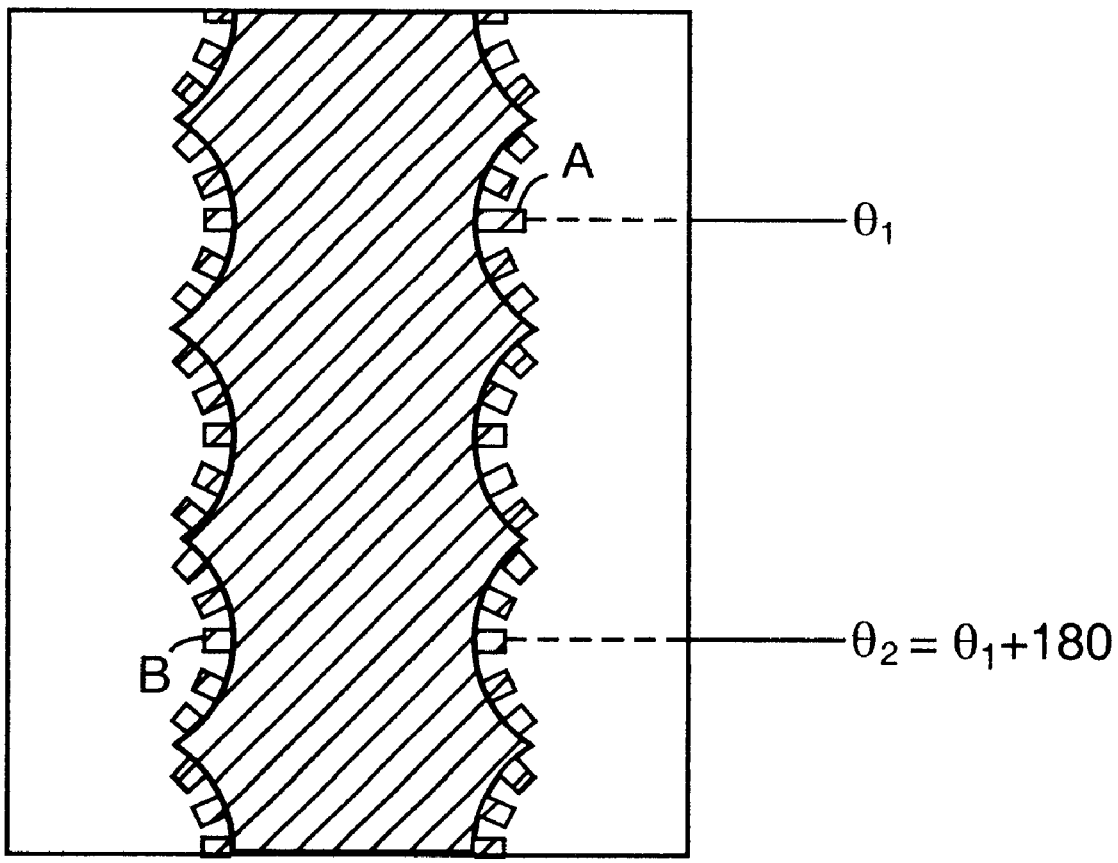
FIG. 16E shows two orientations of a component which allow a particular feature to be viewed in the embodiment shown in FIGS. 16A–D.

Furthermore, when height information is required, one needs to identify two locations in an acquired image which each correspond to the same feature. In general, one must rotate component 8 over 360 degrees in order to view all features. FIGS. 16A–D show. front-lit, diffuse, back-lit, front-lit specular and back-lit shadow casting illuminations respectively. An optional lens system is omitted from FIGS. 16A–D for clarity, which functions to image stripe 66 onto the detector. FIG. 16E shows that two data points A,B which correspond to the same physical location on component 8 are found 180 degrees apart in the polar image acquired from this embodiment.

Figure 17:
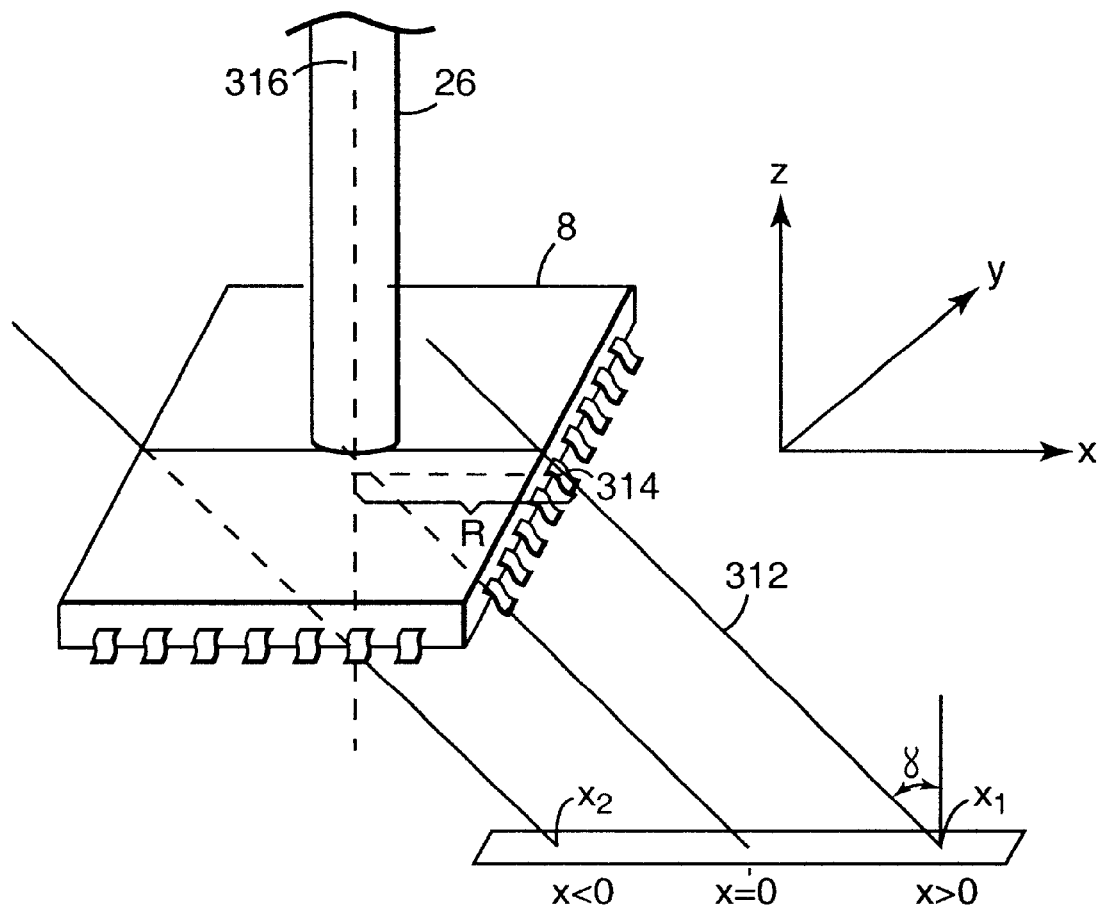
FIG. 17 shows the coordinate system for computing heights and correcting feature locations in the geometry of the first off axis embodiment.

In this off-axis configuration, heights of raised features may be computed because there are two views of each feature, each view taken from different angles as can be seen from FIG. 17. When the detector images a cross-component stripe, as the component rotates during a 360° scan, any feature is imaged twice; once when the feature is on the left side of quill 26 and once while on the right side. These two images are separated by 180° of angular rotation of quill 26. If the two observations of feature 314 are at position $x_1$ when feature 314 is on the right side of quill 26, and at $X_2$ when feature 314 is on the left side of quill 26, the height of the feature is given by:

$$h = \frac{x_1 + x_2}{2} \cot\gamma \quad (10)$$

The distance, R, of feature 314 from a central axis 316 is given by:

$$R = \frac{x_1 - x_2}{2} \quad (11)$$

Figure 18:
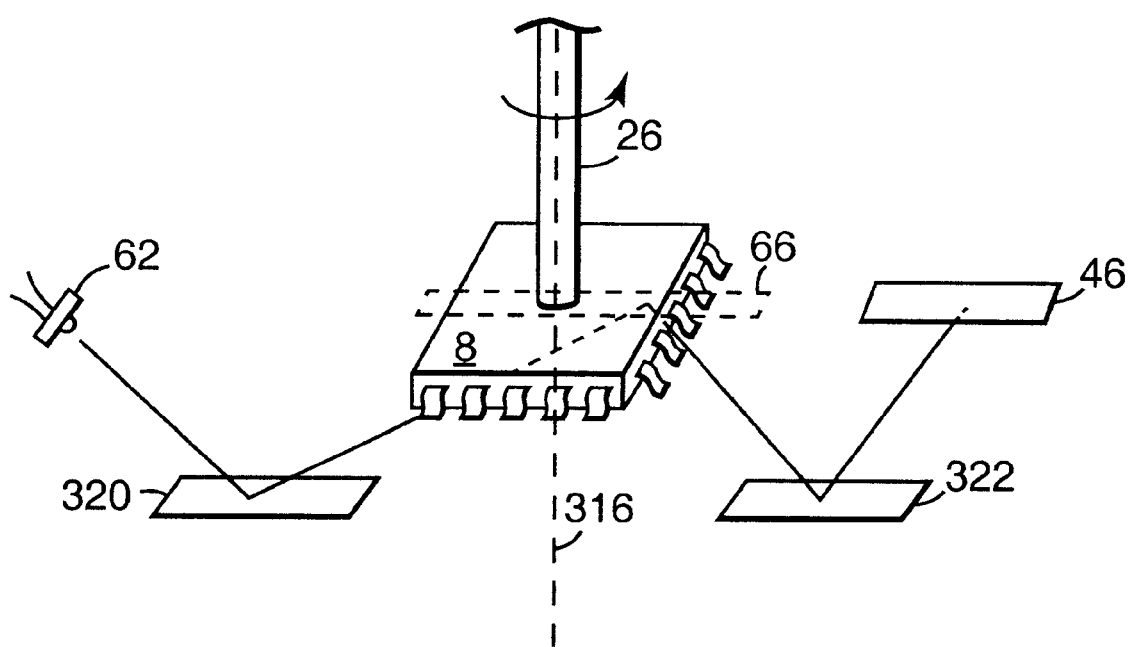
FIG. 18 shows a version of the embodiment shown in FIGS. 16A–D, with mirrors in the transmit and receive optical paths.
Figure 19E:
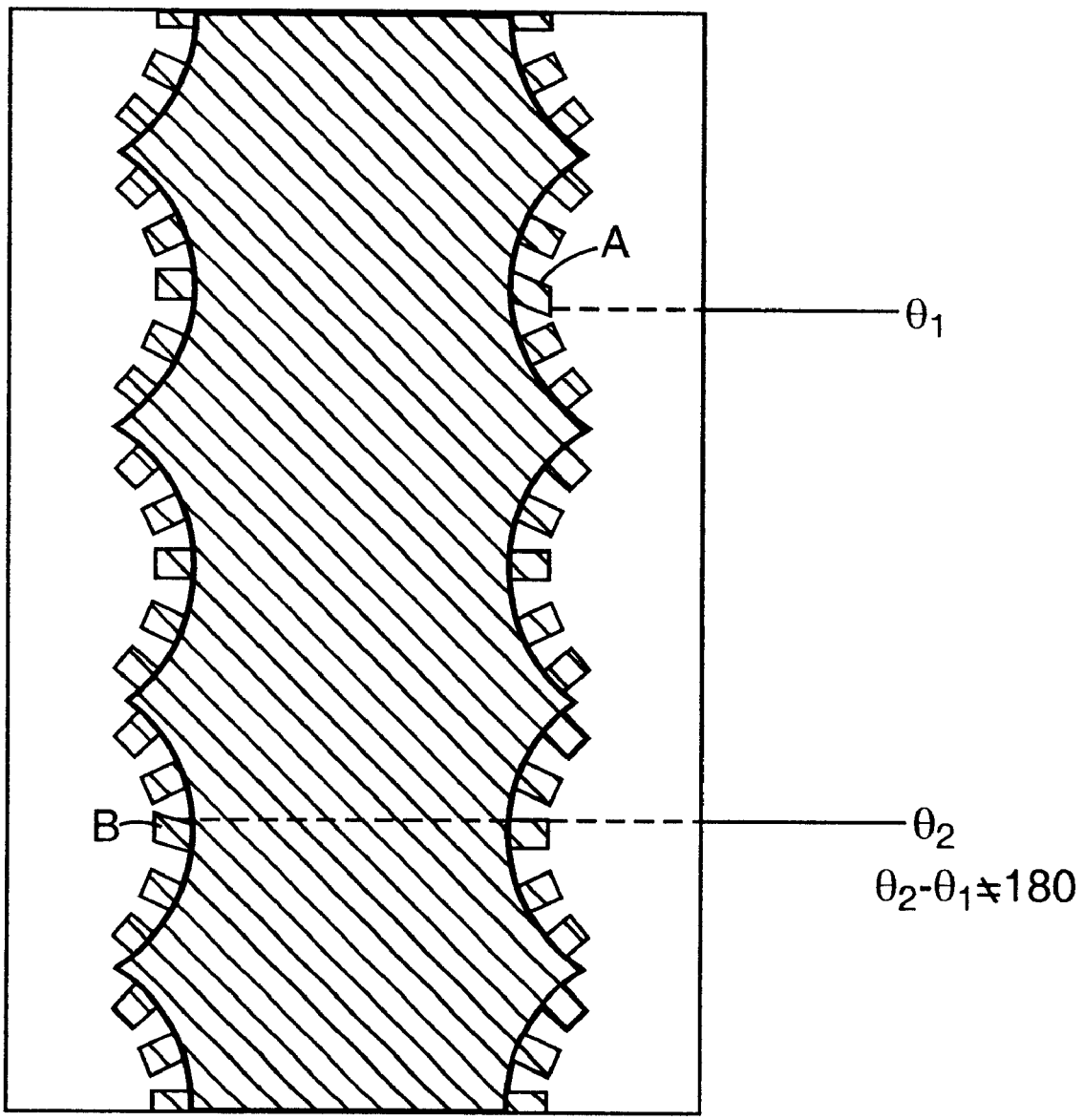
FIG. 19E shows two orientations of the component that allow a particular feature to be viewed twice in the embodiment of FIGS. 19A–D.

FIG. 18 shows a more compact version of the embodiment of FIGS. 16A–E with mirrors interposed in the receive and the transmit optical paths. In particular, a mirror 320 is positioned in the optical path between source 62 and component 8, and another mirror 322 is positioned in the optical path between component 8 and detector 46, the configuration forming the letter "W". The mirrors should be substantially the same size as the detector 46. The present invention as practiced in this configuration is well suited to front-lit, especially specular, illumination.

Another preferred method and apparatus is shown in FIGS. 19A–D, which operates in substantially the same manner as the embodiment shown in FIGS. 16A–D, except that detector 46 is positioned 90 degrees from the detector orientation in FIGS. 16A–D. In this off-axis shown in FIG. 19A, dotted lines projecting upwards and downwards from the outline of component 8 form a space 310, and detector 46 is located outside that space. An observation plane 312 is formed between detector 46 and stripe 66 viewed on the underside of component 8, the observation plane slicing through a central axis of rotation 316 of component 8 in a point. In this embodiment as compared with the embodiment shown in FIG. 16A, however, rotating the component over 180 degrees when the component is off-set from an ideal z position will not necessarily include one view of each of the flush features on the underside of component 8. Furthermore, FIG. 19E shows embodiment presents a more complicated geometry when height information is desired, as compared to FIG. 16E, two data points A,B which correspond to the same physical location on component 8 are found at angles $\theta_1$ and $\theta_2$ in the polar array of this embodiment. The difference between these two angles ($\theta_1 - \theta_2$) depends on the height of the feature and its distance from the center.

It is understood that two different widths of detector 46 may be used in this configuration: the first width corresponding to a radially oriented stripe as shown in FIG. 10A, and the second detector corresponding to the cross-component stripe as shown in FIG. 11A. When the first type of detector 46 is used in any off-axis embodiment of the present invention, the stripes must image the component over 360 degrees of rotation in order to image all the viewable features which are flush with the major surface of the component. When the second type of detector 46 is used in any off-axis embodiment, the stripes only need to image over substantially 180 degrees of rotation in order to image all of the viewvable features which are flush with the major surface of the component. It is understood, however, that in order to determine the location of any raised feature (as opposed to a feature which is flush, or substantially flat) on the major surface of a component, the height of the feature must be first calculated, which necessitates two views of each feature, thereby precluding the use of the first type of detector 46 when information about raised features is desired.

FIGS. 19A–D schematically show front-lit diffuse, back-lit, front-lit specular, and back-lit shadow casting illumination respectively. An optional lens system which functions to image stripe 66 onto the detector is omitted for clarity.

Figure 20A:
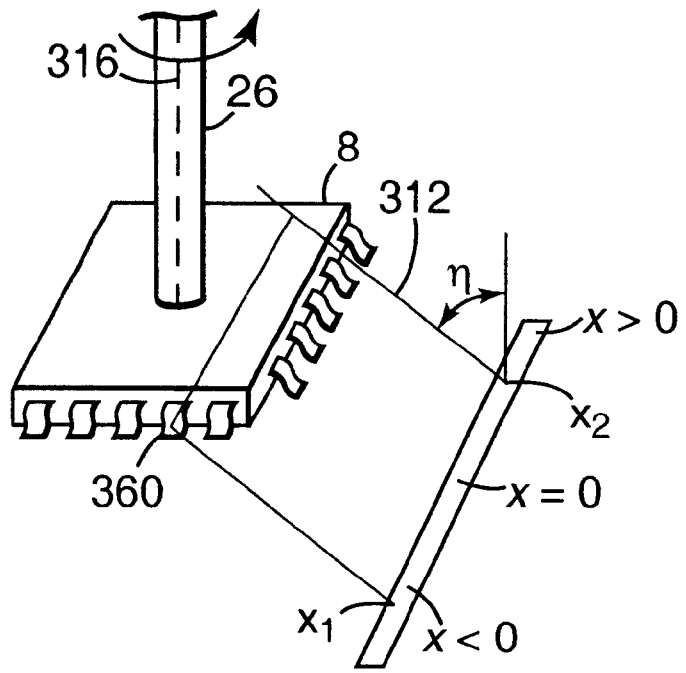
FIGS. 20A–B show the coordinate system for computing heights and correcting feature locations in the geometry of the second off-axis embodiment shown in FIGS. 19A–D.
Figure 20B:
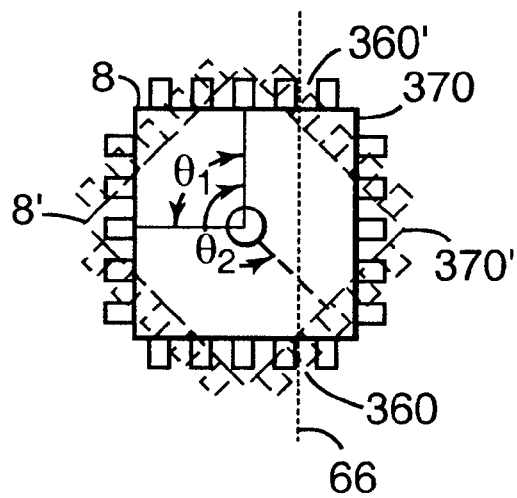

In order to compute height information from the configuration of either FIGS. 19A–D or FIG. 21, consider feature 360, as labeled in FIG. 20A. Feature 360 will be observed twice as the component rotates through 360° as shown in FIG. 20B. It will be observed once with component 8 in a first orientation 370 at polar coordinates ($x_1,\theta_1$), and later in a second orientation 370' at polar coordinates ($x_2,\theta_2$). In each case, the detector will observe the component in a plane of observation 312 that is tilted from vertical at an angle $\eta$.

If point 360 is at the height where the plane of observation 312 intersects the central axis 316, the two observations will be 180° apart. The height away from this plane can be computed as:

$$h = \frac{x_1 - x_2}{2} \cdot \cot\left(\frac{\theta_2 - \theta_1}{2}\right) \cdot \cot\eta \quad (12)$$

The polar point (r,θ) that would have been obtained if the point 360 had been at the same height as where the plane of observation 312 intersects the central axis 316 is given by:

$$\theta = \frac{\theta_1 + \theta_2}{2} - 90 \quad (13)$$

$$r = \frac{x_1 - x_2}{2} \sec\left(\frac{\theta_2 - \theta_1}{2}\right) \quad (14)$$

Figure 21:
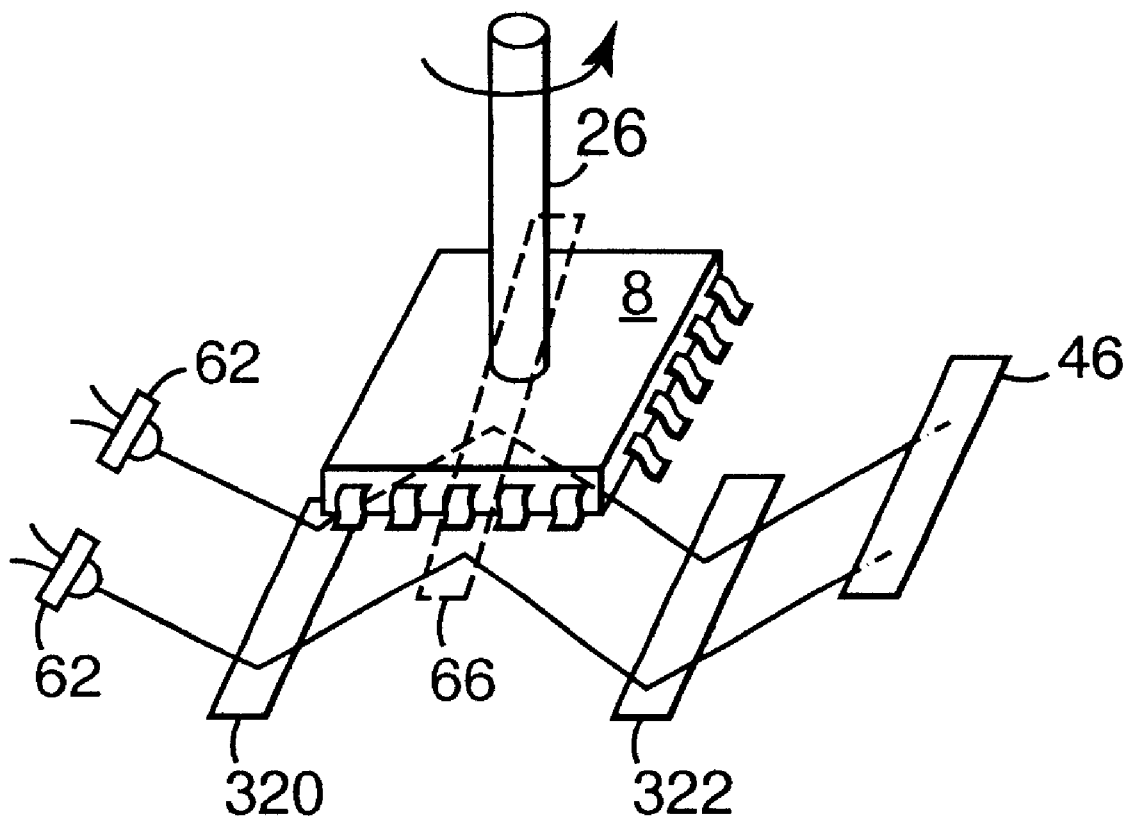
FIG. 21 shows a version of the embodiment shown in FIGS. 19A–D with mirrors in the transmit and receive optical paths.

FIG. 21 shows a more compact version of the embodiment of FIGS. 19A–D with mirrors interposed in the receive and the transmit optical paths. In particular, a mirror 320 is positioned in the optical path between the source and the component, and another mirror 322 is positioned in the optical path between the component and the detector, the configuration forming the letter "w". The mirrors should be substantially the same size as the detector. The present invention as practiced in this configuration is well suited to front-lit (especially specular) illumination when both mirrors are employed.

Figure 22A:
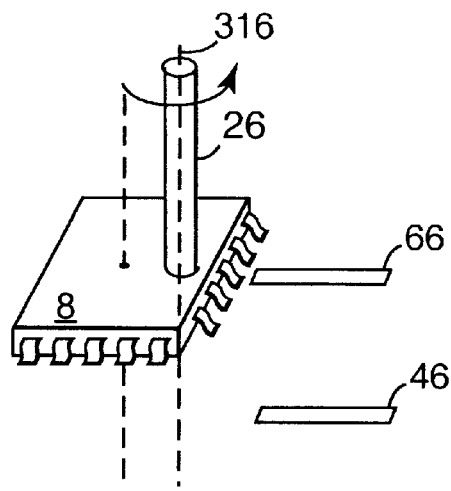
FIGS. 22A–C show a component picked-up off center by a quill, time sequence plan-view sketches of the method of the present embodiment, and a corresponding Cartesian array image as acquired in the embodiment of the present invention shown in FIG. 22A, respectively.
Figure 22B:
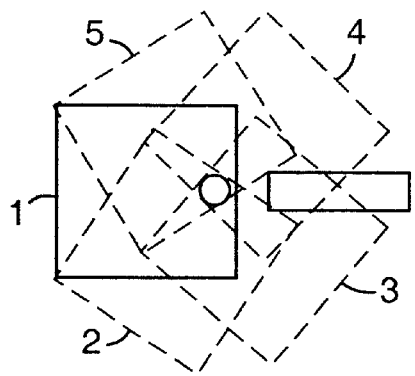
Figure 22C:
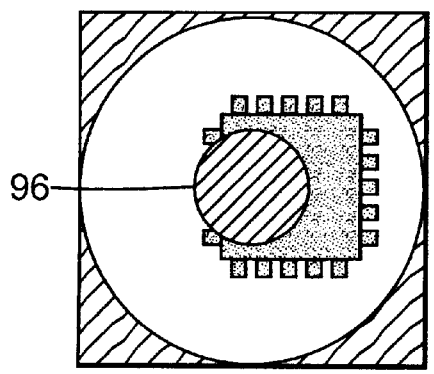

The previously described embodiments require either moving elements of the sensor system or off axis viewing for on head applications. In another approach, shown in FIG. 22A, a quill 26 picks up component 8 off center, so that the central axis 316 of the quill 26 rotation and the center of component 8 are not coincident. FIG. 22B shows sequenced sketches, as viewed from directly above detector 46, of component 8 in five positions 1–5 as it is rotated around the central axis 316. For clarity, the leads were omitted from FIG. 22B. FIG. 22C shows a Cartesian array image of the part once all the stripes have been acquired, assembled and converted. As the detector 46 does not extend to the central axis 316, there is an area 96 within the Cartesian array that contains no data. This technique of picking up component 8 off-center may be practiced with any of the embodiments of the present invention, and is well-suited to large components, since it is difficult to reliably pick up a small component off-center. This embodiment is also preferred in that it reduces the number of motor drive and associated electronics, since the sensor housing may be in the same place during measurement (i.e., the tasks of imaging and providing the desired signal) and placement of the part, as contrasted with other embodiments where the housing must be moved out of the way of head 6 before component 8 may be placed on the printed circuit board.

Figure 23A:
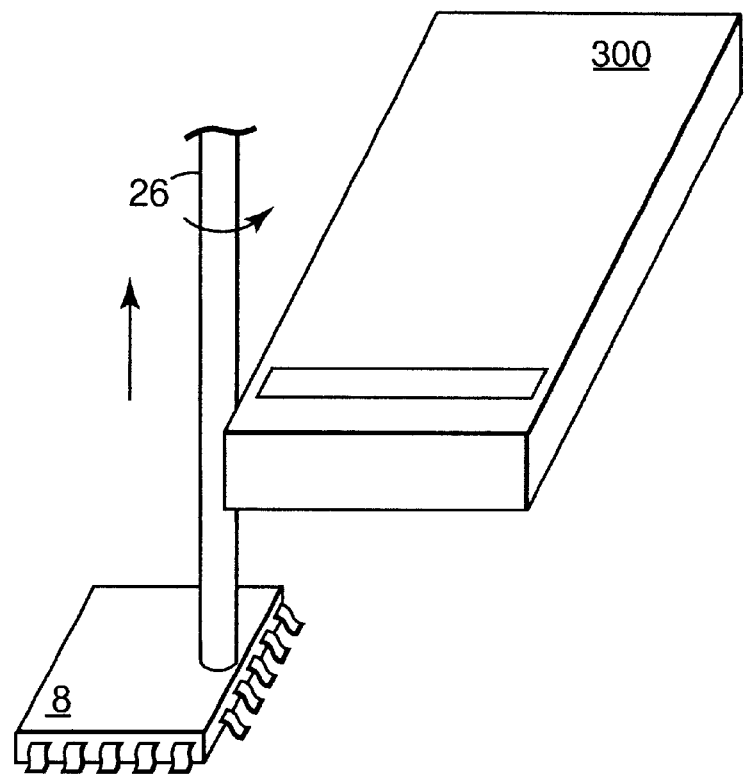
FIGS. 23A–E show five isometric views of a method for picking up the component, elevating the component to a measurement position, rotating the component during measurement, moving the component out of the way of the sensor housing, and lowering the component.
Figure 23B:
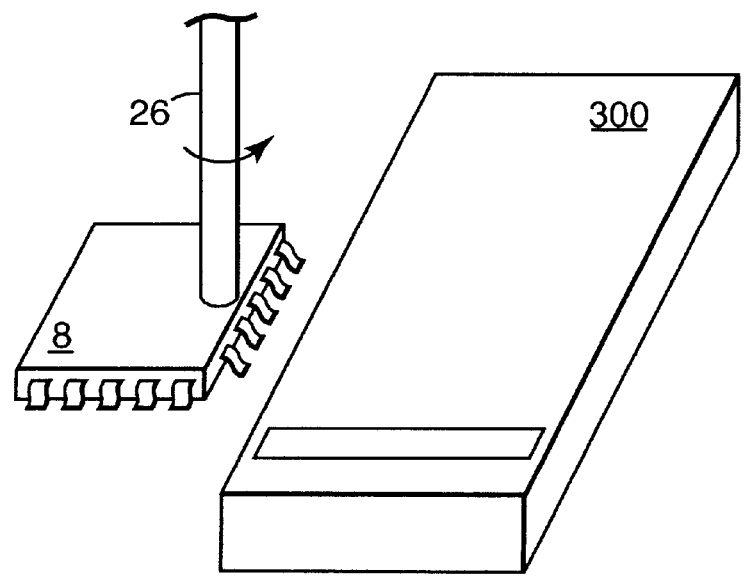
Figure 23C:
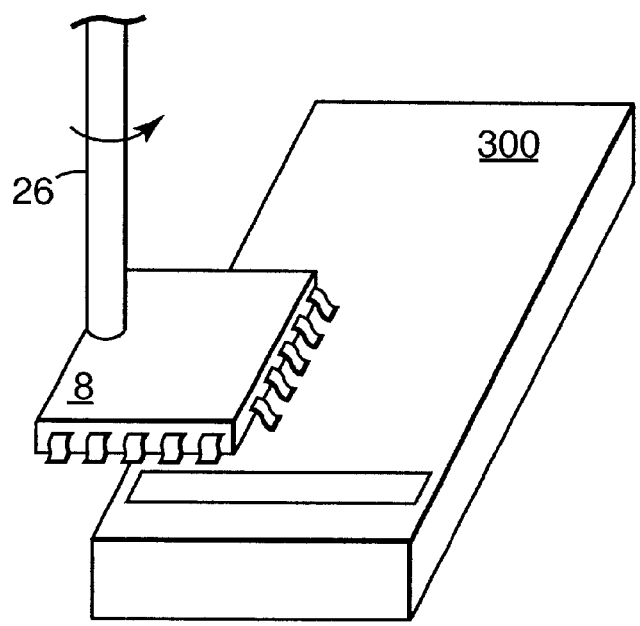
Figure 23D:
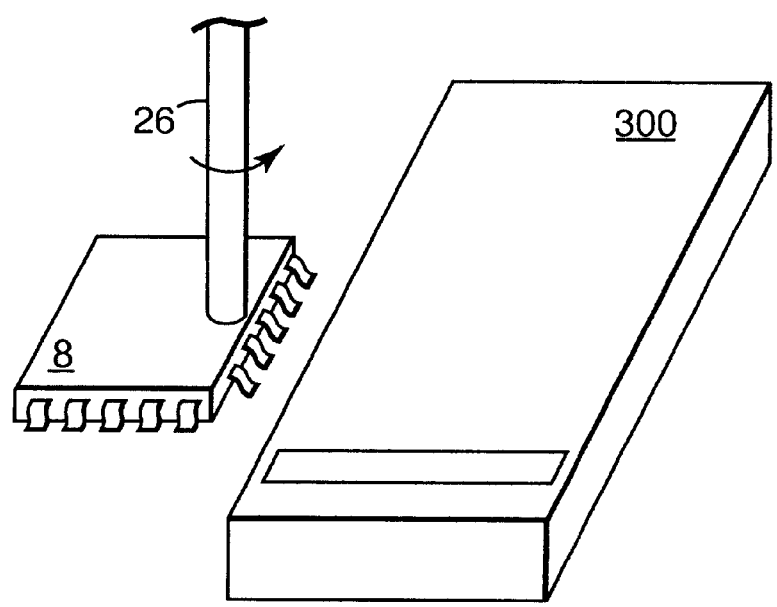
Figure 23E:
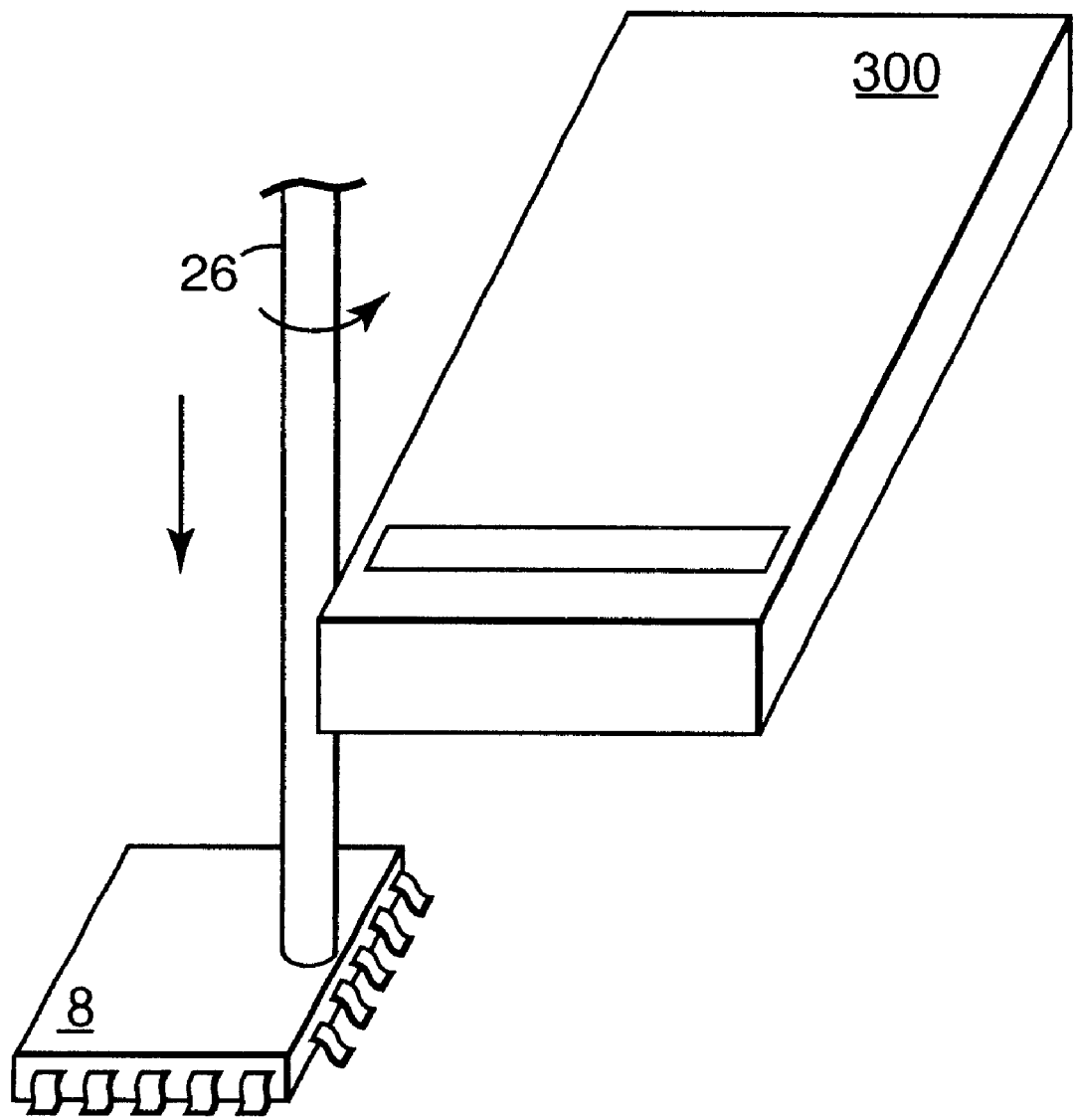

FIGS. 23A–E show a method of the present invention for acquiring data in the present embodiment. In FIG. 23A, the component 8 is picked up by quill 26 in an orientation away from the sensor housing 300. The quill 26 and component 8 are raised (in the z direction) above sensor housing 300 with component 8 remaining oriented away from the sensor housing 300. FIG. 23B shows the component now in place for data acquisition to begin. Rotation may begin while the component 8 and quill 26 are raised so long as contact between the component 8 and the sensor housing 300 is avoided as shown in FIG. 23B. Now that component 8 is raised to the measurement height above detector 46 in sensor housing 300, component 26 is rotated over the detector 46 for data acquisition as shown in FIG. 23C. In certain embodiments, it is unnecessary to rotate component 8 a fall 90 degrees. After data acquisition is completed, component 8 is rotated into a position oriented away from the sensor as shown in FIG. 23D. The component 8 is then lowered as shown while it remains oriented away from the sensor housing 300 as shown in FIG. 23E. Once lowered, the component 8 may be placed in any orientation as needed for proper placement.

Figure 24A:
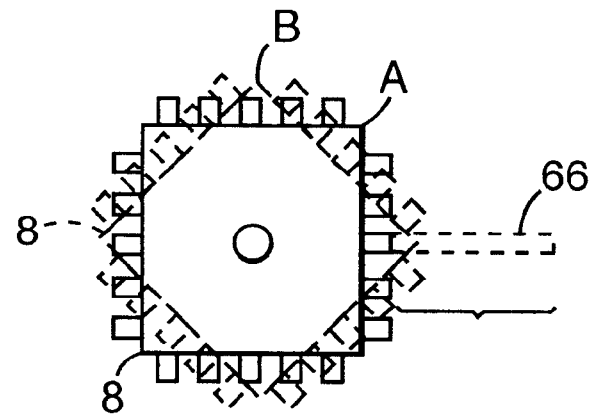
FIG. 24A shows time sequence plan-view sketches of an embodiment of the present invention where only the corners of the object are imaged by the detector and FIG. 24B shows a corresponding Cartesian array image.
Figure 24B:
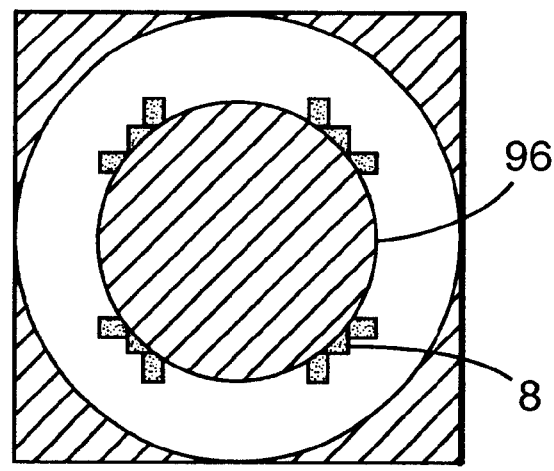

Previous embodiments disclose the use of a detector with either half the width of the component or the entire width of the component in order to provide an image of the entire component. The present embodiment (with a detector of reduced width) is able to provide about as much information about relevant features on the component as taught in previous embodiments when the component is properly oriented above the detector. FIG. 24A shows a plan view of this embodiment where the detector is positioned to view only the comers of component 8. FIG. 24B shows a Cartesian array image of the component once all the stripes have been acquired, assembled and converted. This array has a large central area 96 that contains no data. This embodiment allows a very short detector to provide sufficient information to place even large components. For example, a 50 mm QFP imaged at 1:1 is able to be "corner" imaged according to the present embodiment with a 15 mm detector, because the comer package dimension is approximately between 10 mm larger than the edge dimension (35 mm vs. 25 mm).

Figure 25A:
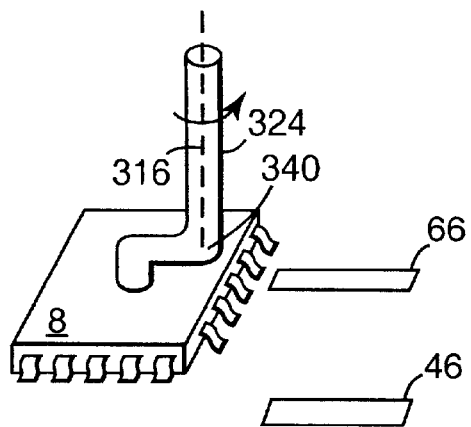
FIGS. 25A–C show an embodiment of the present invention with a quill with an off-set pick-up point, time sequence plan-view sketches of the method of the embodiment of the present invention and a corresponding Cartesian array image, respectively.
Figure 25B:
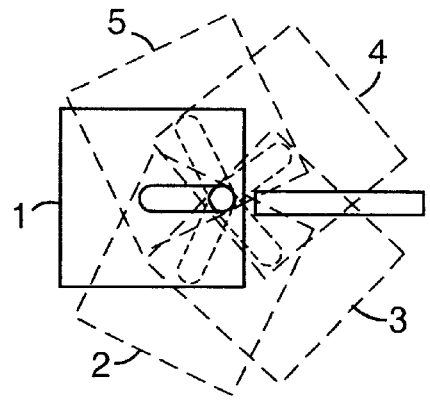
Figure 25C:
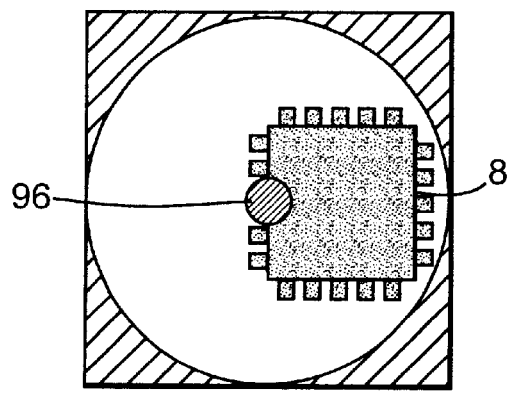

Another method of minimizing the amount of data to be processed and stored is shown in FIG. 25A, which shows another quill 324 with a turn (i.e. kink) 340 in the quill. The kinked quill allows component 8 to be picked-up in the center of the component, but with an offset between the center of rotation and the center of the component. This arrangement allows component 8 to rotate around a center of rotation 316 which is within the outline of the component. FIG. 25B shows sequenced sketches, as viewed from directly above detector 46, of component 8 in five positions 1–5 as the component rotates. For clarity, the leads were omitted from FIG. 25B. FIG. 25C shows a Cartesian array image of the component once all the stripes have been acquired, assembled and converted. As the detector does not extend to the central axis 360, there is a hole 96 in the image. This embodiment is also preferred in that it reduces the number of motor drives and associated electronics, since the detector 46 may be in the same place during pickup, placement, and measurement (i.e., the tasks of imaging and providing the desired signal), as contrasted with other embodiments where the housing must be moved out of the way of head 6 before component 8 may be placed on the printed circuit board. The process for acquiring data with this embodiment is similar to that used with the embodiments shown in FIGS. 23A–D. Unlike the embodiment shown in FIGS. 23A–D, the present embodiment works equally well with components of any size and provides a more stable attachment by contacting the component 8 about its center.

Figure 26A:
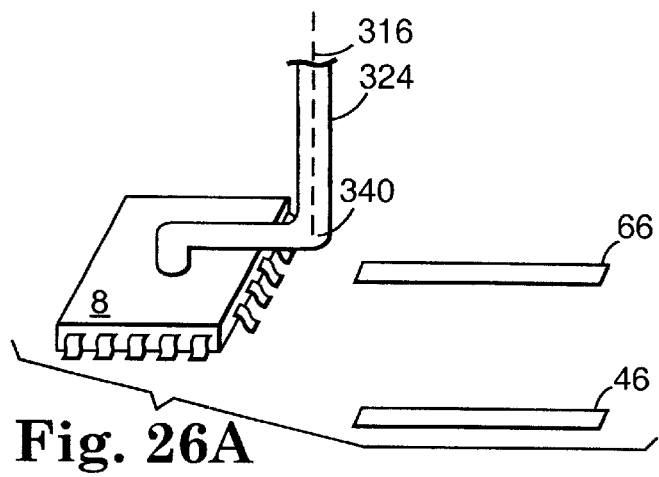
FIGS. 26A–C show an embodiment of the present invention with a quill with an off-set pick-up point, time sequence plan-view sketches of the method of the embodiment of the present invention, and a corresponding Cartesian array image, respectively.
Figure 26B:
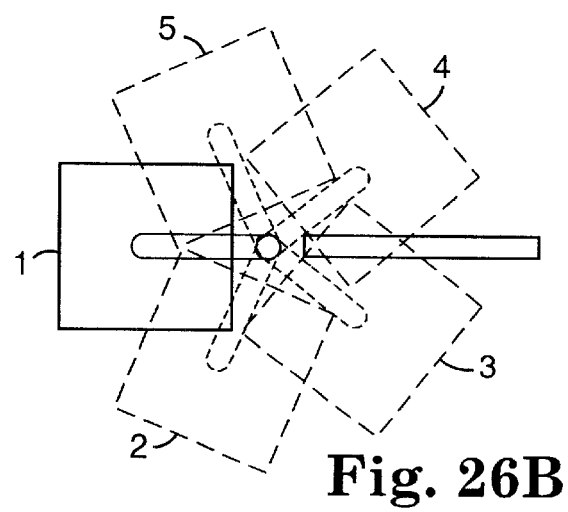
Figure 26C:
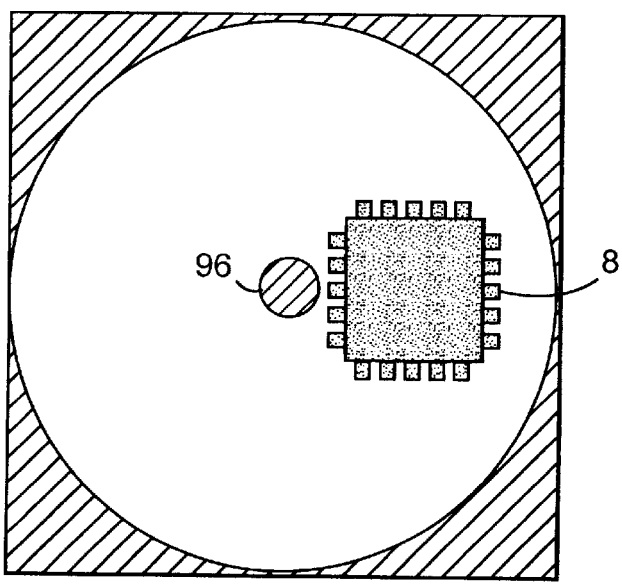

FIG. 26A shows another quill 342 with a turn, where a turn 340 in quill 342 is extended beyond the outline of component 8, so that the entire component may be viewed. FIG. 26B shows sequenced sketches, as viewed from directly above detector 46, of component 8 in five positions 1–5 as the component rotates. For clarity, the leads have been omitted. FIG. 26C shows a Cartesian array image of the component once all the stripes have been acquired, assembled and converted. Unlike other embodiments, component 8 is offset sufficiently so that the hole 96 in the Cartesian image array does not obscure any part of component 8. The process for acquiring data with this embodiment is similar to that used with the embodiments shown in FIGS. 23A–D.

Figure 27A:
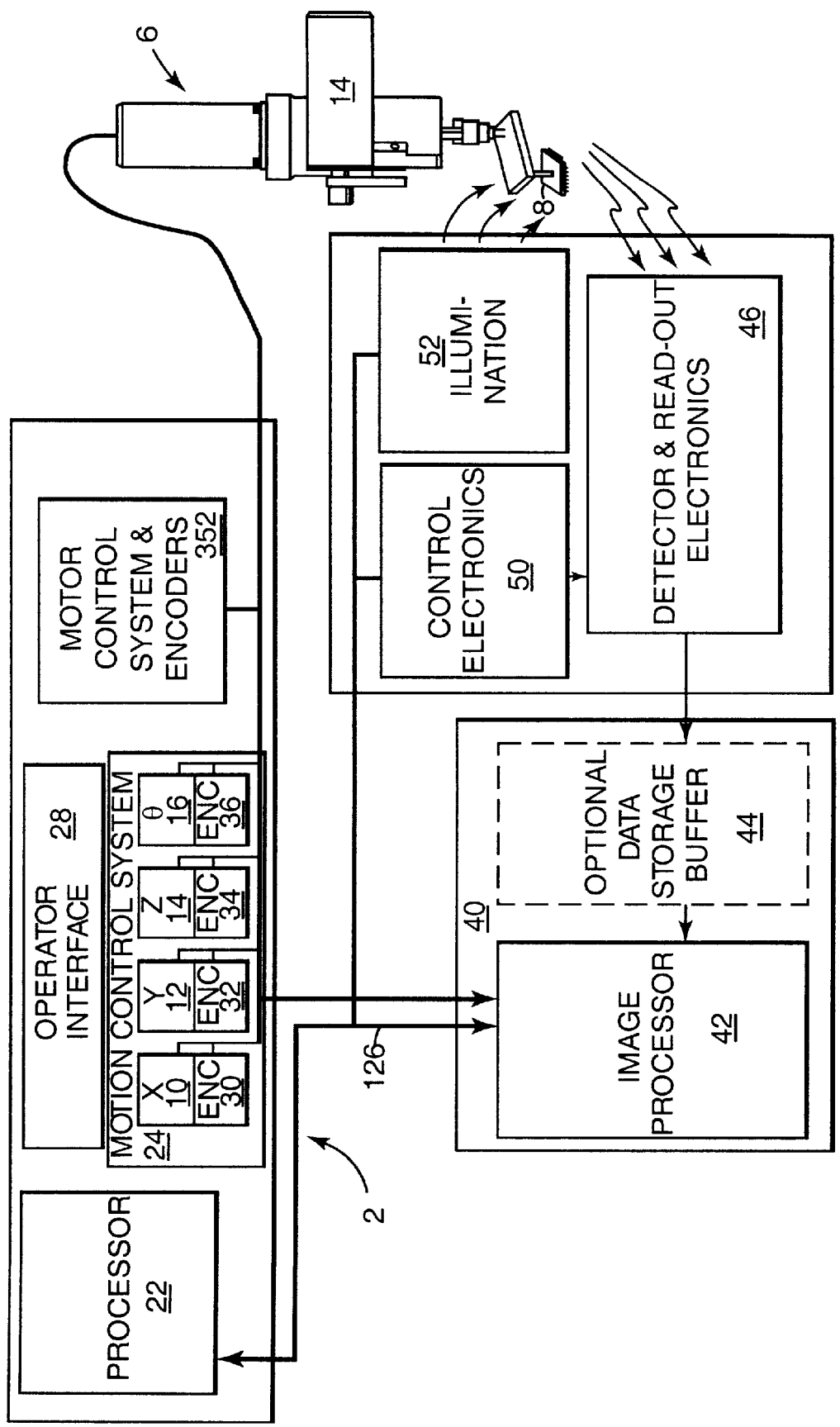
FIGS. 27A–D show a block diagram for an embodiment of the present invention with a quill with two axes of rotation, an isometric view thereof, time sequence plan-view sketches of the method of the embodiment of the present invention, and a corresponding Cartesian array image as acquired in the embodiment of the present invention shown in FIG. 27B.
Figure 27B:
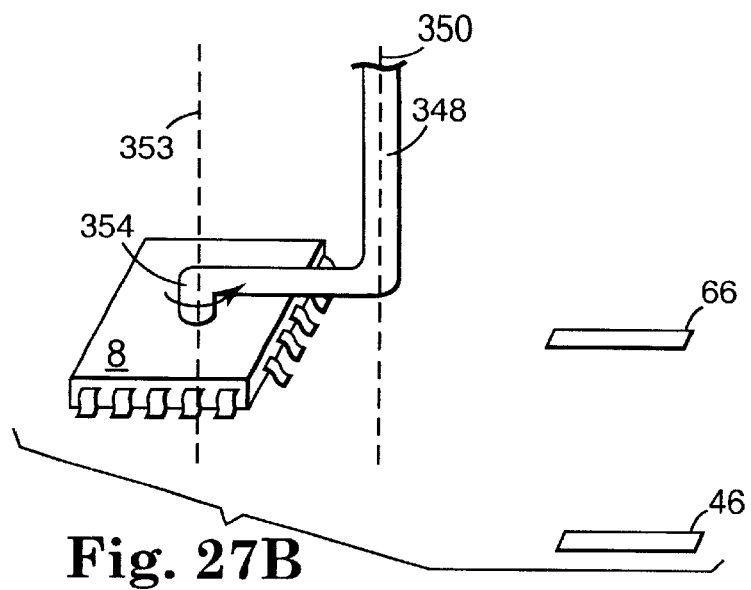
Figure 27C:
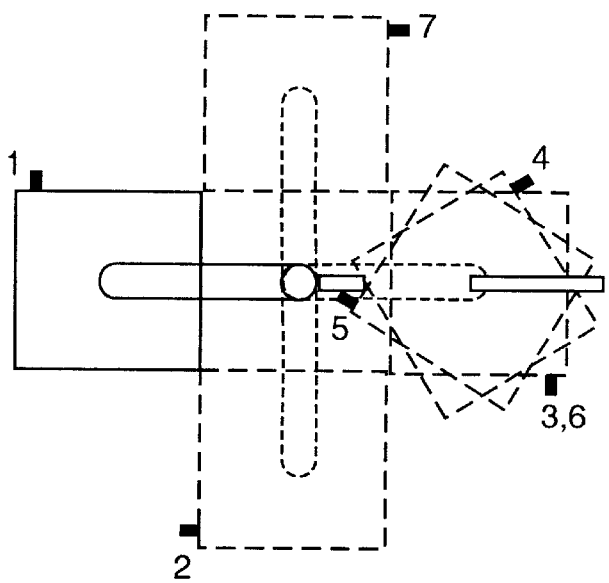
Figure 27D:
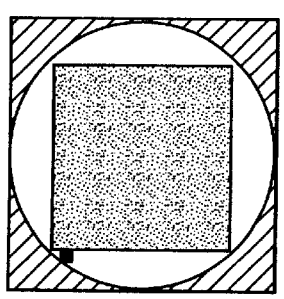
Figure 28B:
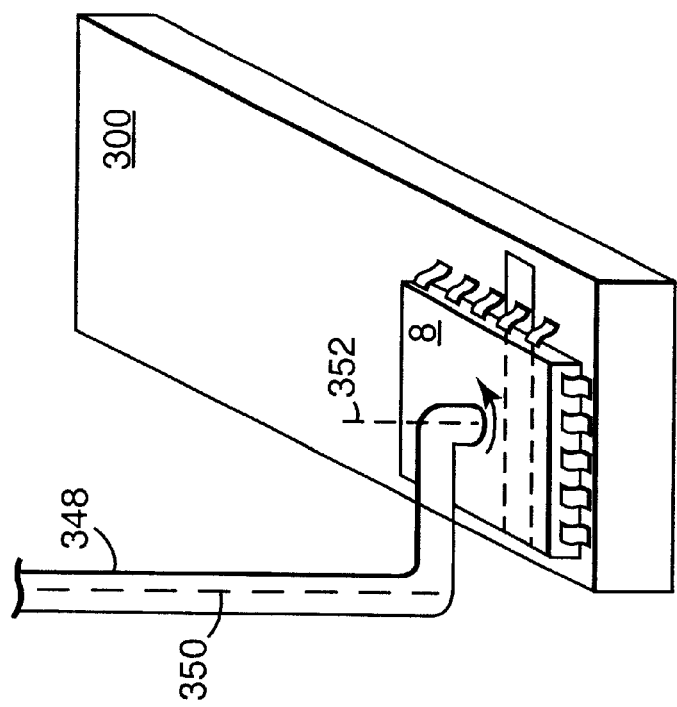
FIGS. 28 A–E show five isometric views of a method for picking up the component, elevating the component to a measurement position, rotating the component during measurement, moving the component out of the way of the sensor housing, and lowering the component.
Figure 28A:
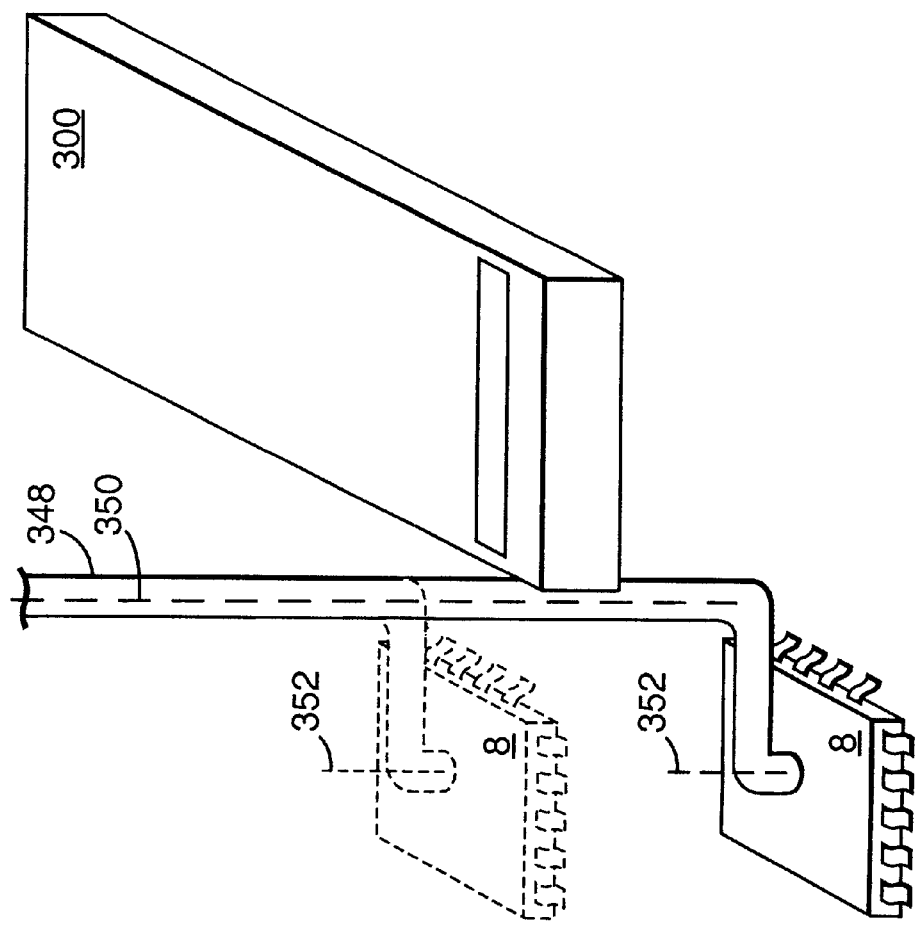
Figure 28D:
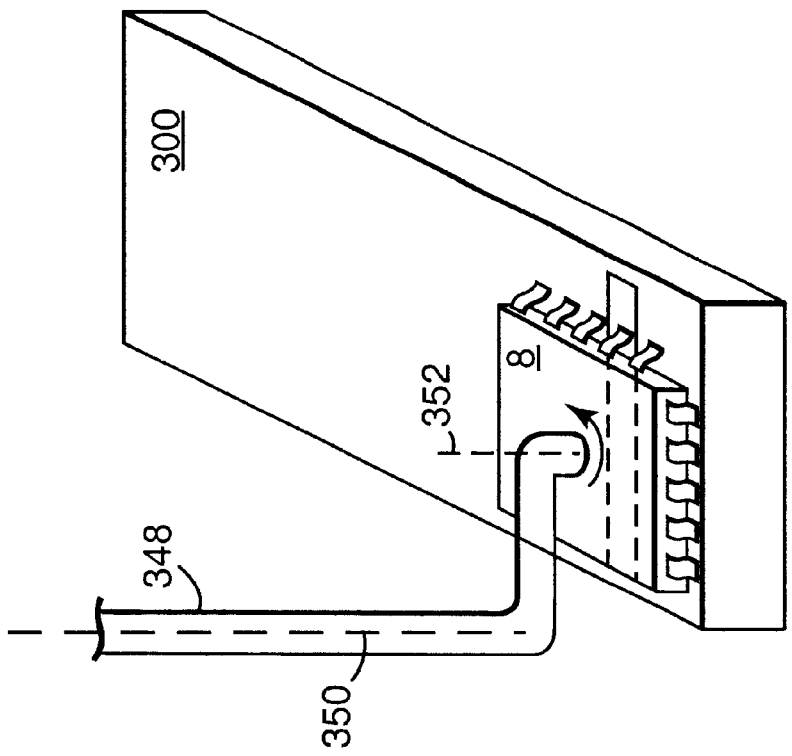
Figure 28C:
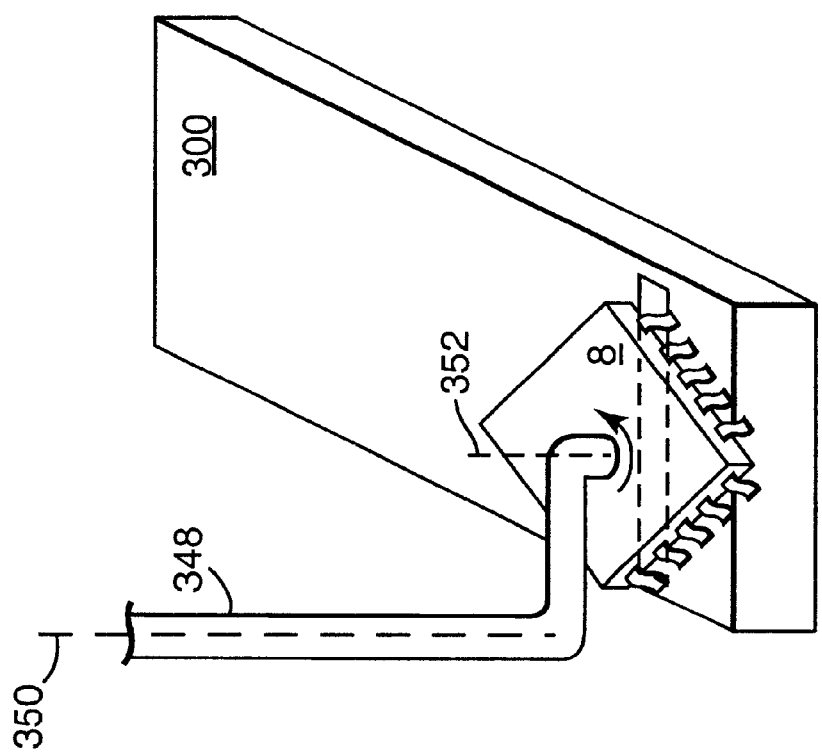
Figure 28E:
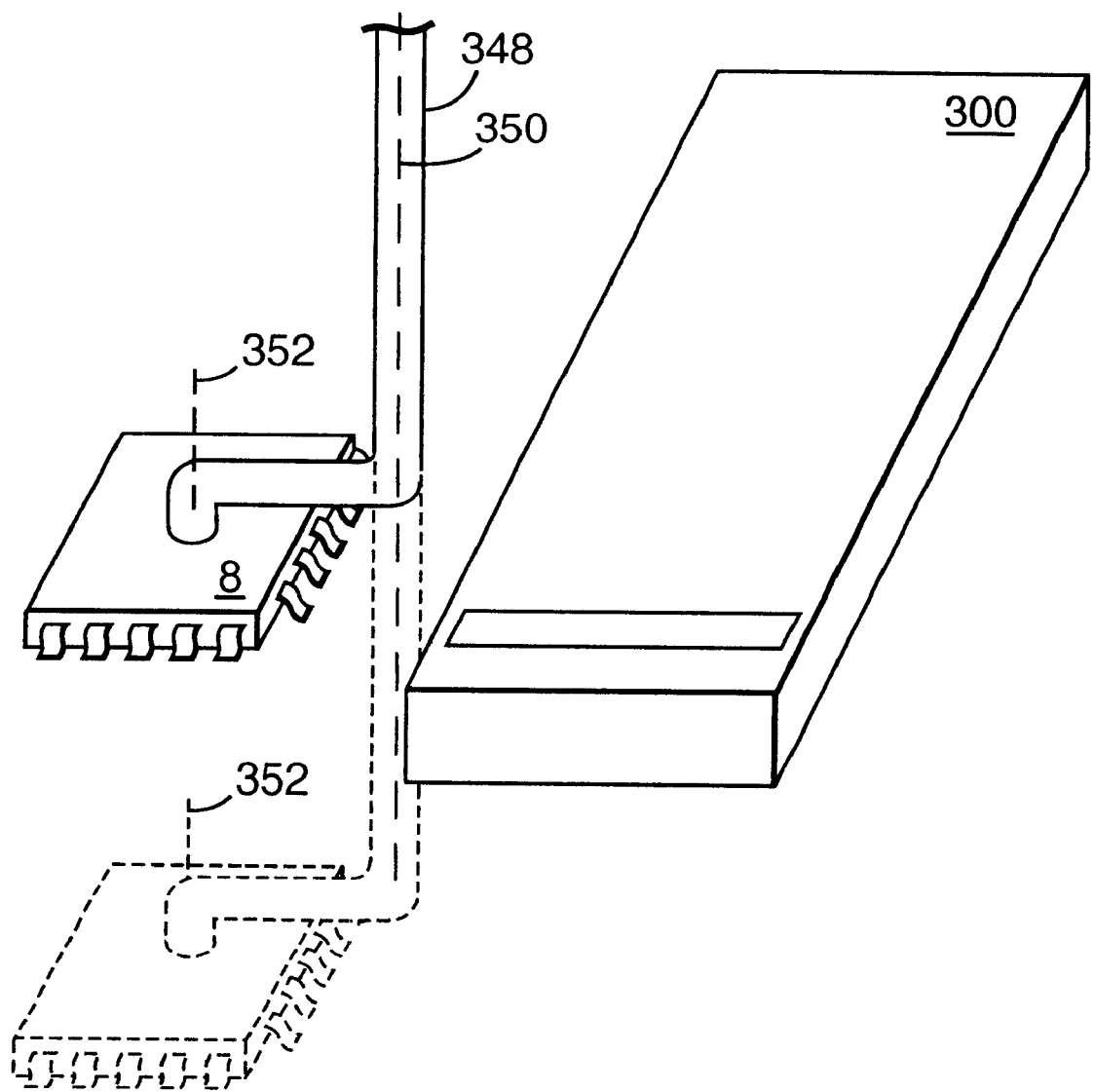

For particularly high speed placing applications, the moment of inertia of the 120 rotating assembly should be minimized. FIG. 27A shows an electronics assembly for the system of the present invention, with an additional motor control systems and encoders 352. Motor control system and encoders 352, has the same function and make-up as motor control system 24. FIG. 27B shows a detail of another embodiment of a quill 348, which has a first axis of rotation 316 and an additional axis of rotation 353, so that quill 348 and nozzle 354 have distinct 25 axes. FIG. 27C shows sequenced sketches, as viewed from directly above detector 46, of component 8 in seven positions 1–7 as the component rotates during data acquisition. For clarity, the leads have been omitted. This embodiment requires two angular encoders 36,353; one each on the first axis 350 and the additional axis 352. Encoder 16 on the first axis 350 must be high precision to position the additional axis 354 precisely above the detector 46 for data acquisition. FIGS. 27A–D show a Cartesian image of the component once all the stripes have been acquired, assembled and converted.

FIGS. 28A–E show the process for acquiring data in the present embodiment, which includes the steps of moving quill 348 upwardly in the z direction, rotating component 8 around the first axis of rotation 350, rotating the component 8 about the second axis 352 during data acquisition, rotating away from housing 300 about the first axis 350, then moving quill 348 downwardly, and finally placing component 8.

Figure 29A:
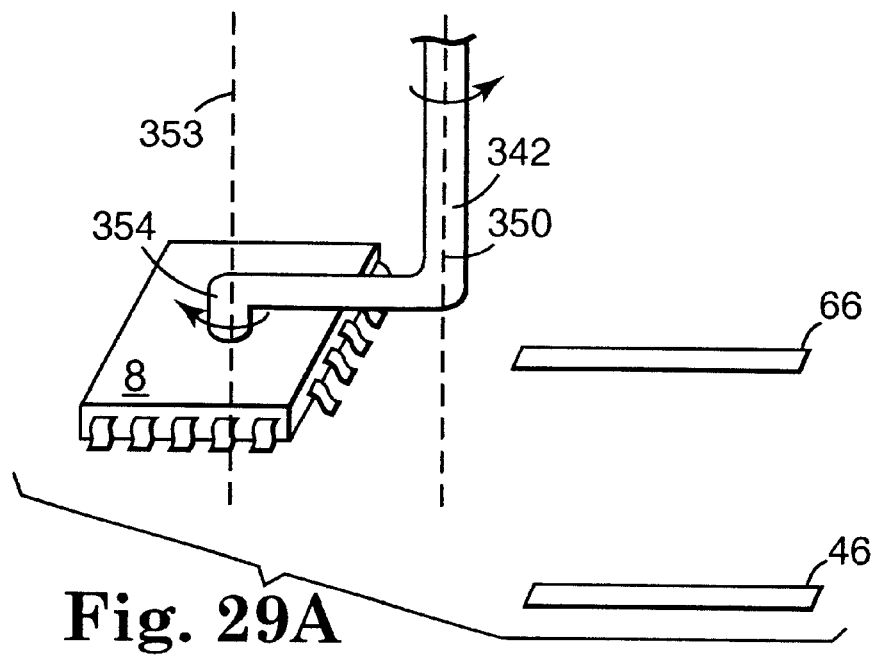
FIGS. 29A–E show an embodiment of the present invention with a quill with two axes of rotation, time sequence plan-view sketches of the method of the present embodiment, a set of images from the detector, a collection of stripe images from the detector assembled into a polar array, and a corresponding Cartesian array derived from the polar image assembled in FIG. 29D, respectively.
Figure 29B:
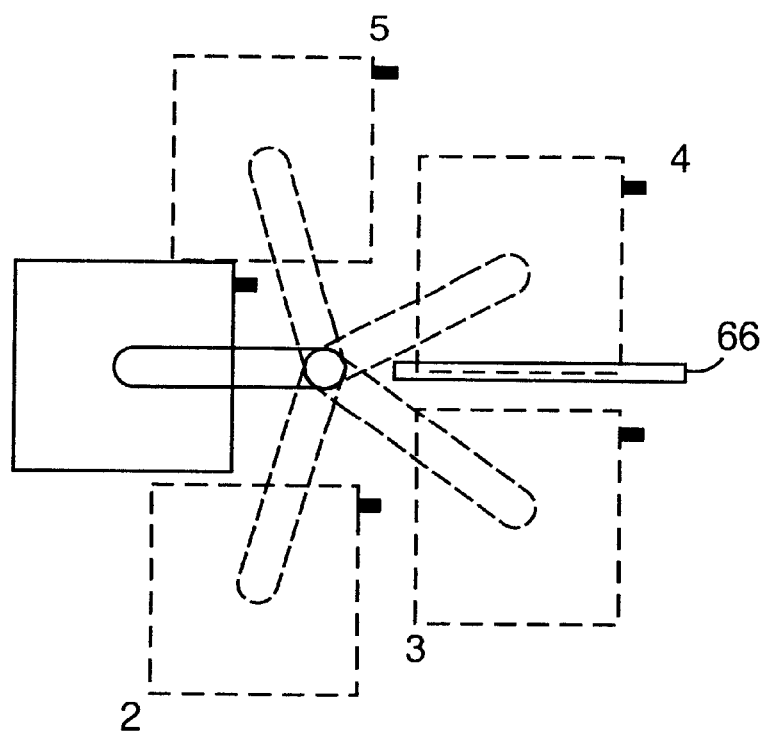
Figure 29C:
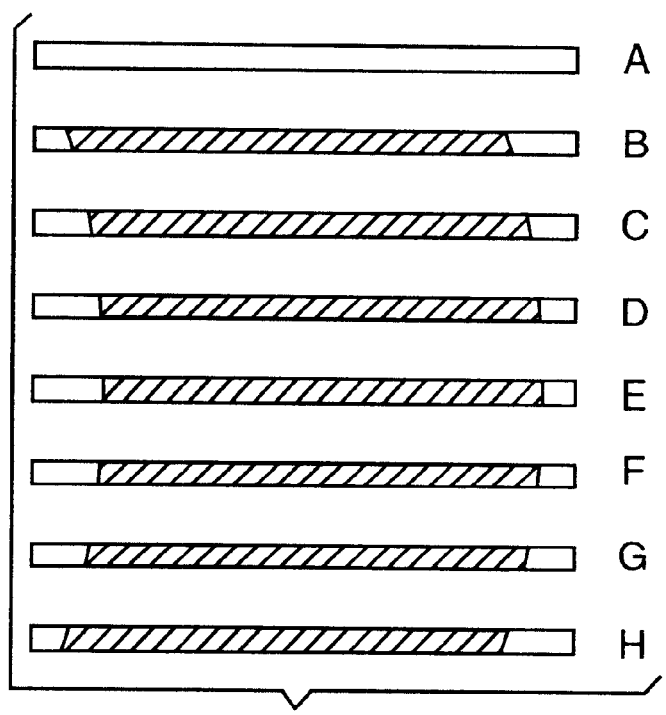
Figure 29D:
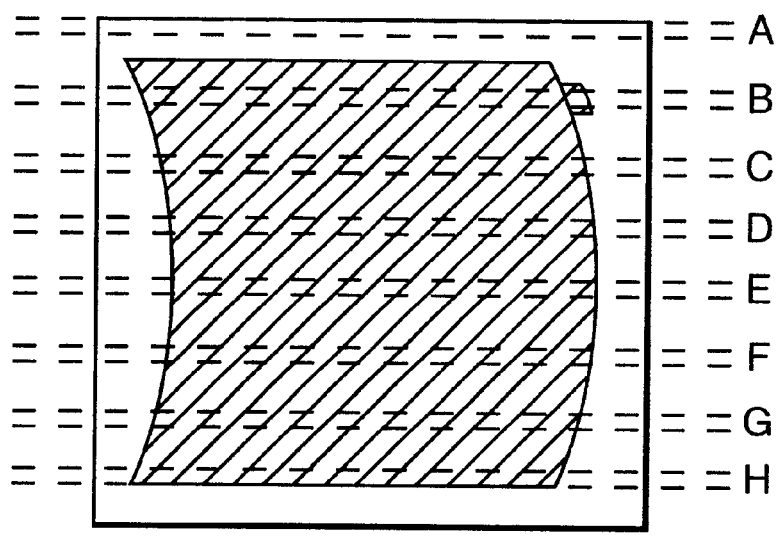
Figure 29E:
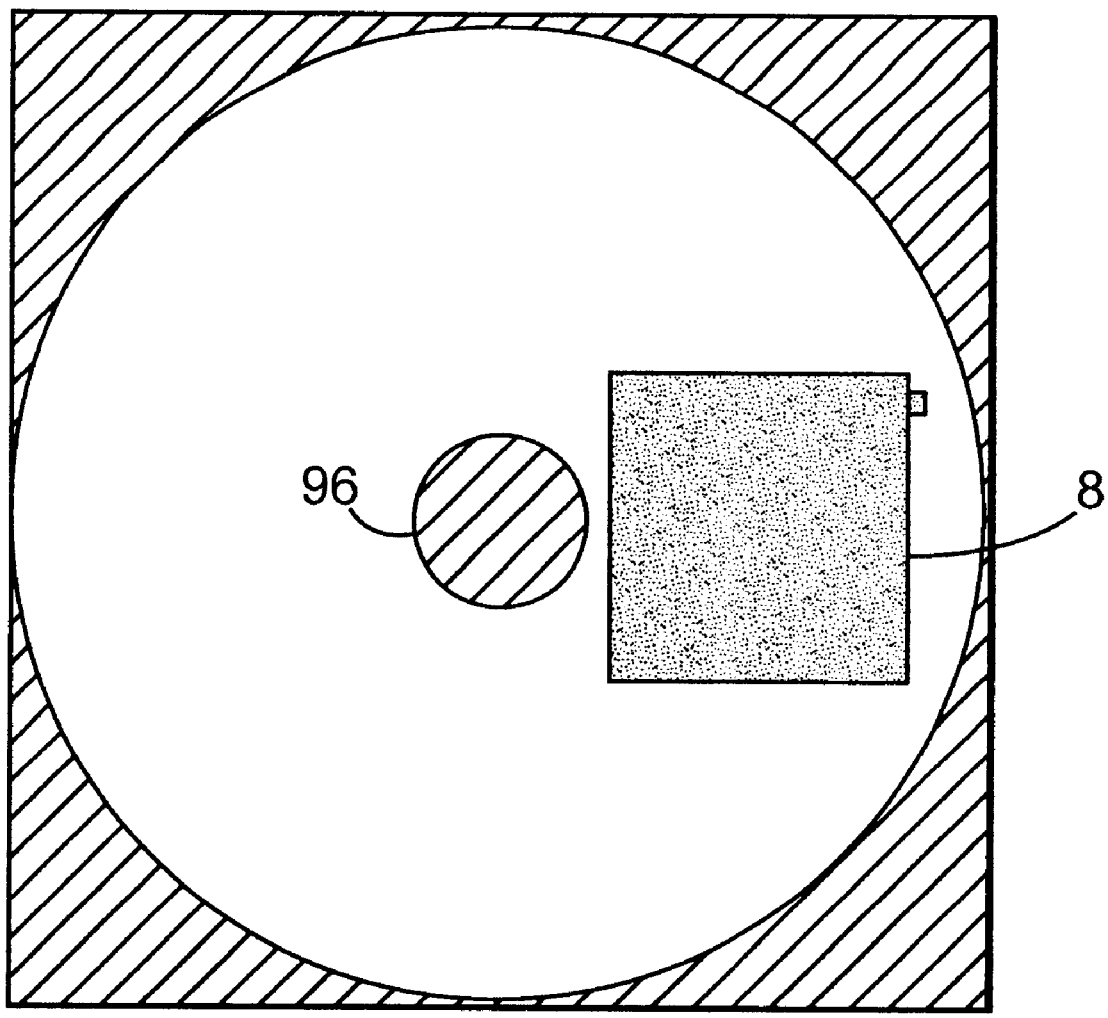

Another embodiment which employs two independent axes of rotation is shown in FIG. 29A, where nozzle 354 on quill 342 picks up component 8 and has a first axis of rotation 350, and where quill 342 has an independent axis of rotation 353. The method of FIGS. 28A–E may be used with the present embodiment. The block diagram of FIG. 27A applies to this embodiment as well, since this embodiment requires an additional axis of rotation. FIG. 29B shows sequenced sketches, as viewed from directly above detector 46, of component 8 in five positions 1–5 as the quill 342 rotates about the first axis 350. For clarity, the leads have been omitted. The orientation of the component 8 in FIG. 29B should be contrasted with that shown in FIG. 26B. In FIG. 26B the quill 26 and the component 8 rotate together. In contrast, the additional axis 354 in FIG. 29B allows the orientation of component 8 to remain fixed while quill 342 rotates. FIG. 29C shows a collection of stripe images acquired by the detector and FIG. 29D shows an assembled polar image of the component. FIG. 29E shows the resulting Cartesian image array after performing the necessary coordinate conversion. This embodiment reduces the amount of time to process a signal, since all the information acquired by other embodiments in 360 degrees is now acquired in fewer degrees of rotation. Series of pulleys, gears or belts is used to achieve equal and opposite rotations about axes 350,353.

Figure 30A:
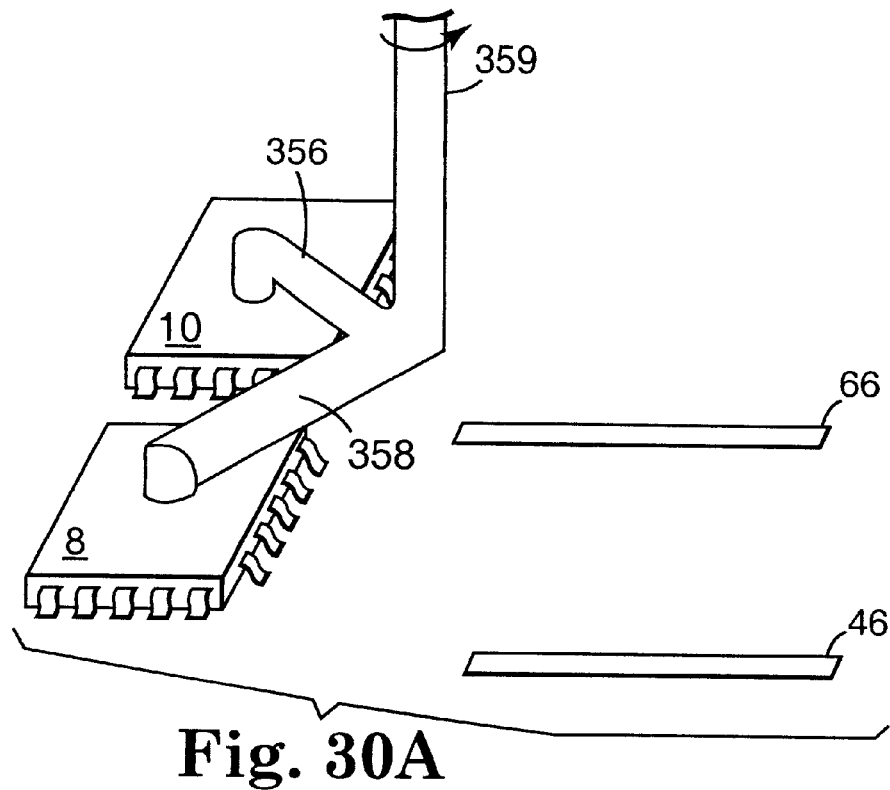
FIGS. 30A–C show an embodiment of the present invention with a quill with vacuum pick-ups, time sequence plan-view sketches of the method of the present embodiment, and a corresponding Cartesian array image as acquired in the embodiment of the present invention shown in FIG. 30A, respectively.
Figure 30B:
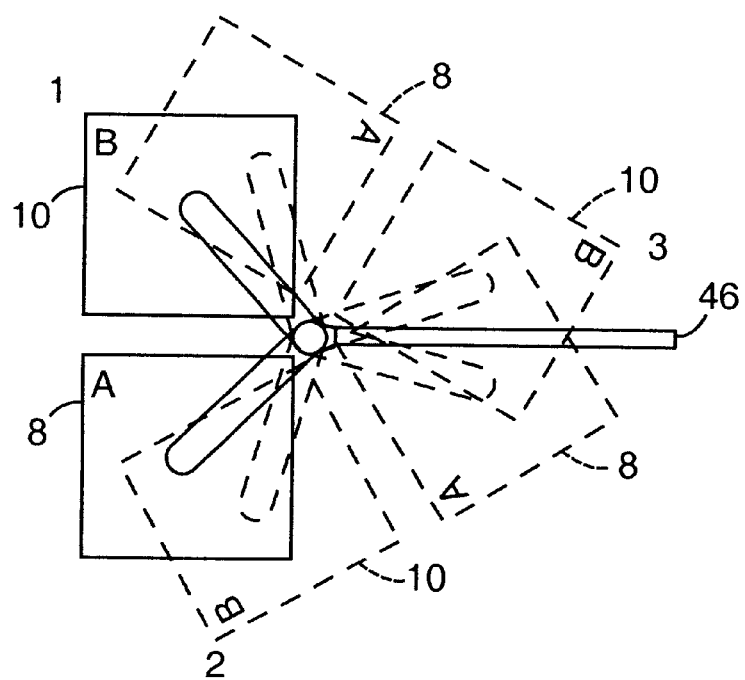
Figure 30C:
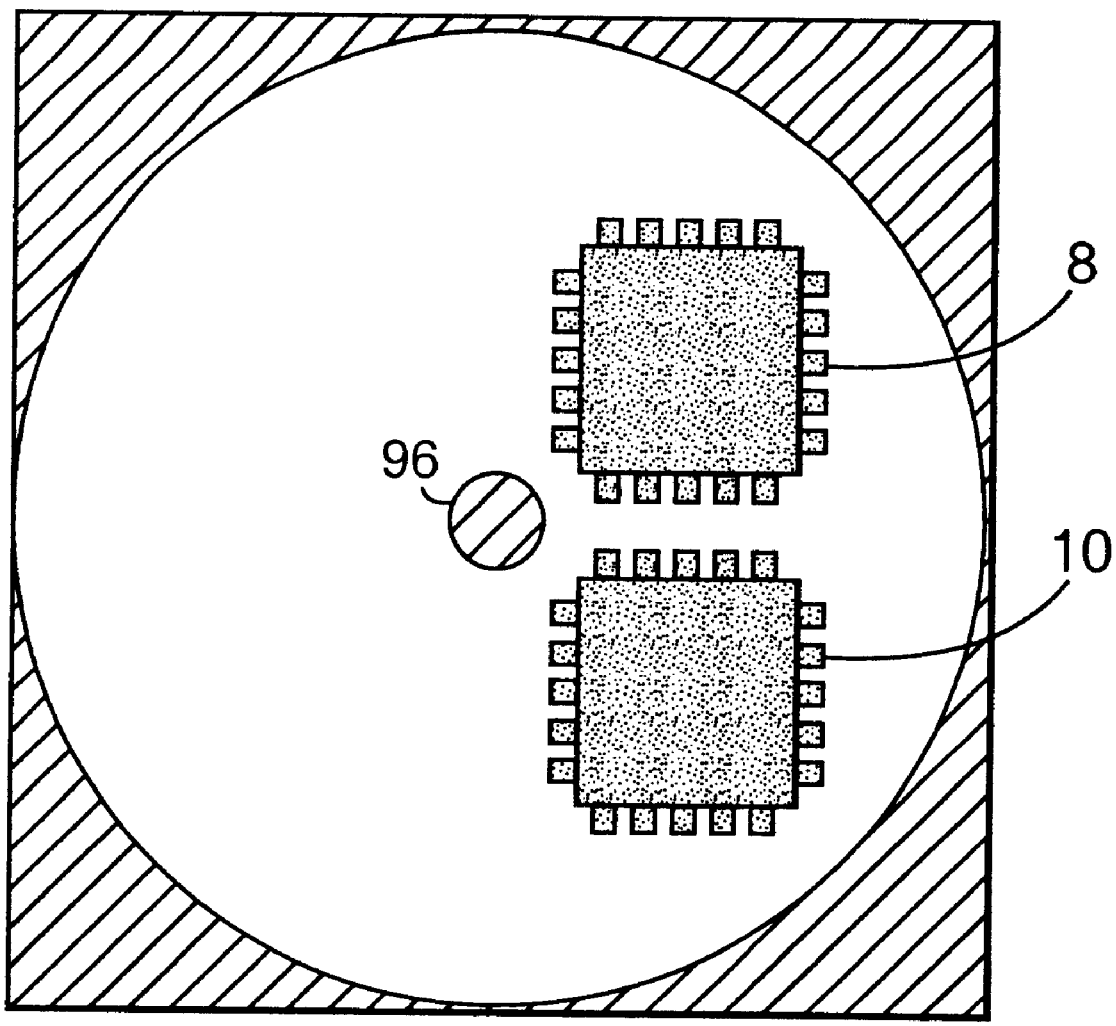

Another embodiment of a quill 359 is shown in FIG. 30A, where two extensions 56 and 358 extend from a joint in quill 359 and pick-up components 8 and 10. This embodiment increases the placing throughput of machine 2, by acquiring data on two components in substantially the same amount of time as it would take to acquire data for one component. FIG. 30B shows sequenced sketches, as viewed from directly above detector 46, of components 8,10 in three positions 1–3 as quill 359 revolves. FIG. 30C shows a Cartesian array image of the component once all the stripes have been acquired, assembled and converted. The process for acquiring data for this embodiment is similar to that used with the embodiments shown in FIGS. 23A–E.

Figure 31A:
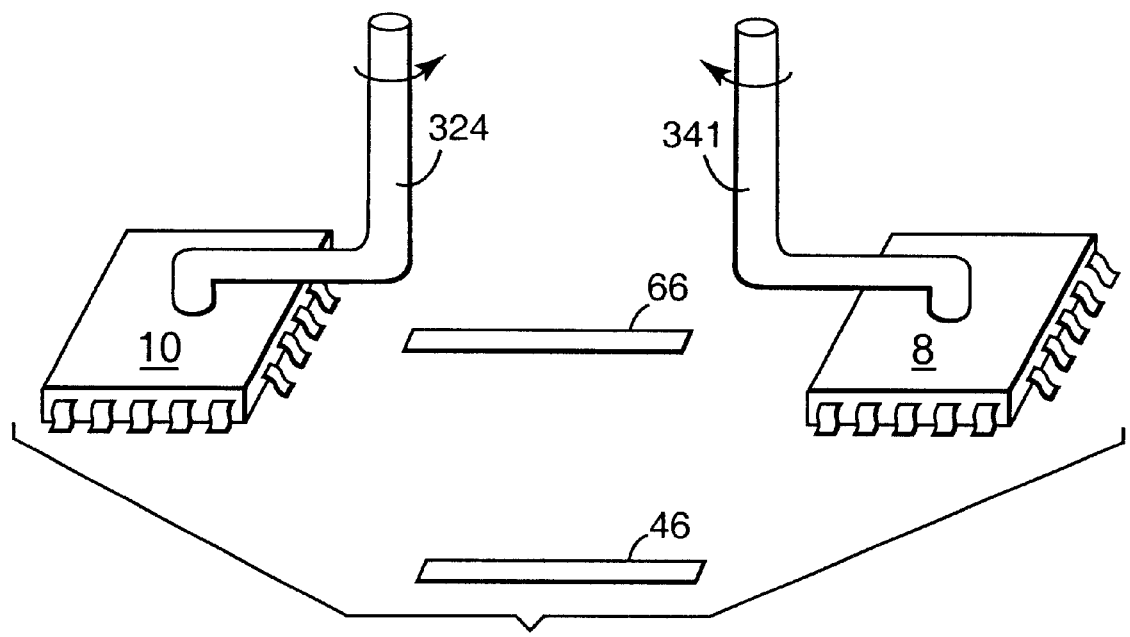
FIGS. 31A–D show an embodiment of the present invention with two turned quills, time sequence plan-view sketches of the method of the present embodiment, a Cartesian array image as acquired from the left quill, and a Cartesian array image as acquired from the right quill, respectively.
Figure 31B:
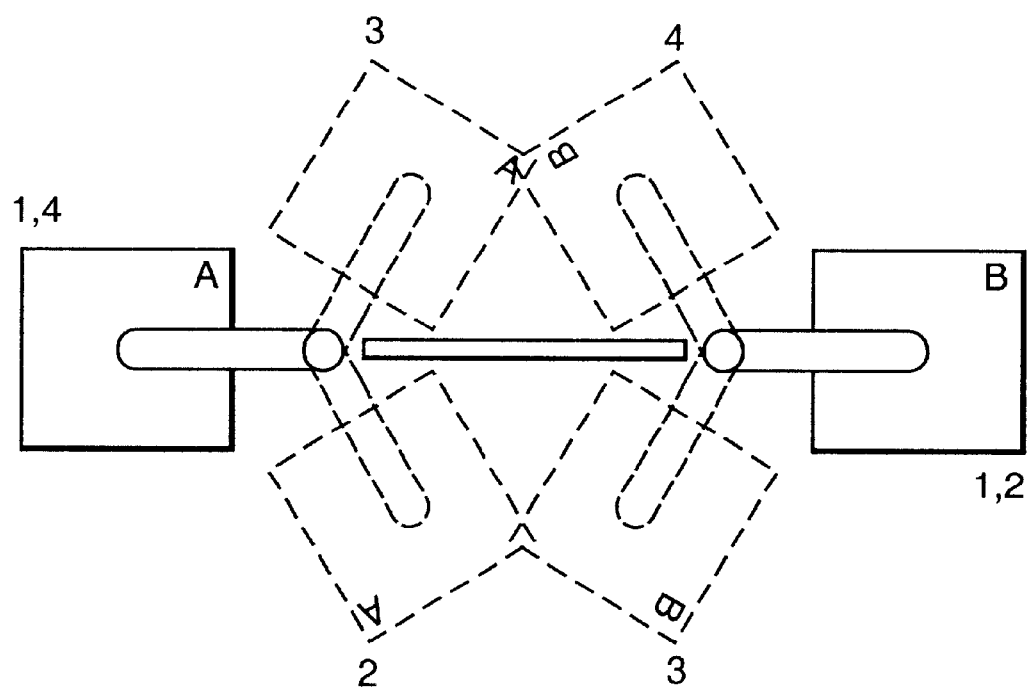
Figure 31C:
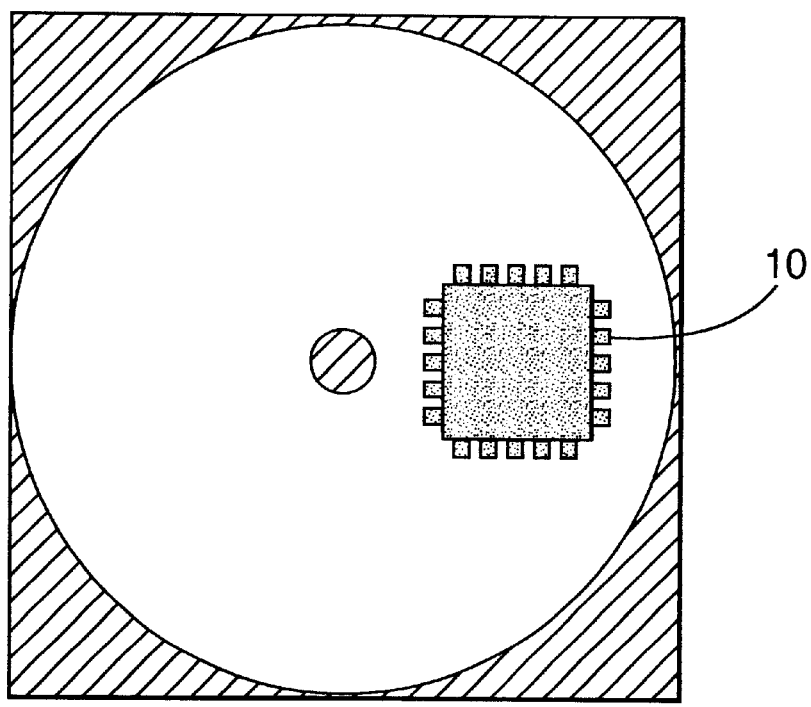
Figure 31D:
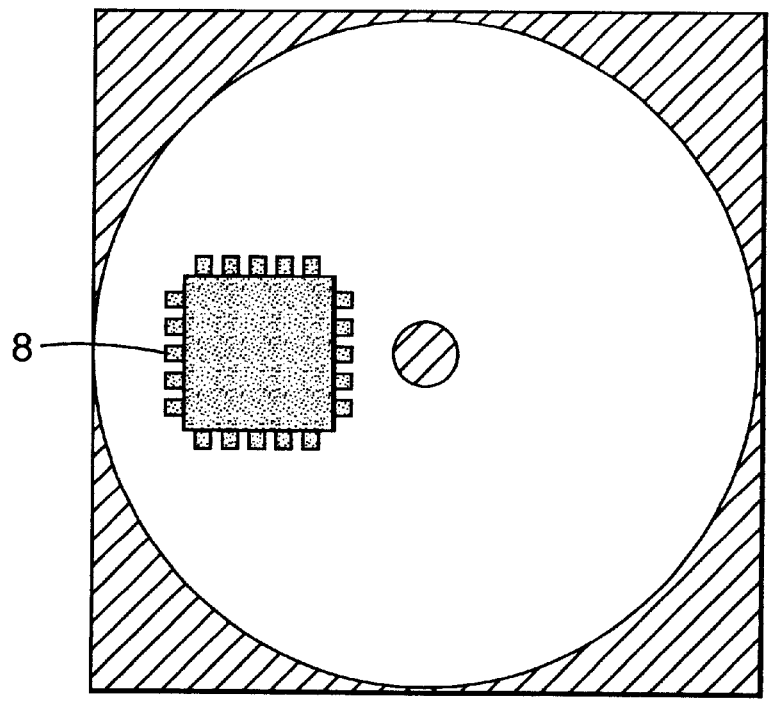

Another embodiment of the present invention designed to reduce system cost is to employ one detector 46 which acquires data from two components 8,10 mounted on separate, but identical, quills 324, and 341 as shown in FIGS. 31A–D. FIGS. 31A–D show sequenced sketches, as viewed from directly above detector 46, of components 8,10 in four positions 1–4 as quills 324 and 341 rotate. For clarity, the leads have been omitted. FIGS. 31C–D show a Cartesian array image of the component once all the stripes for components 8,10 have been acquired, assembled and converted. Each quill (324, 341) follows the same process for acquiring data as described for the embodiments shown in FIGS. 23A–E. The timing sequence shown in FIGS. 31A–D shows the start of rotation of quill 341 delayed compared to quill 324 to avoid collision of components 8 and 10.

Figure 32A:
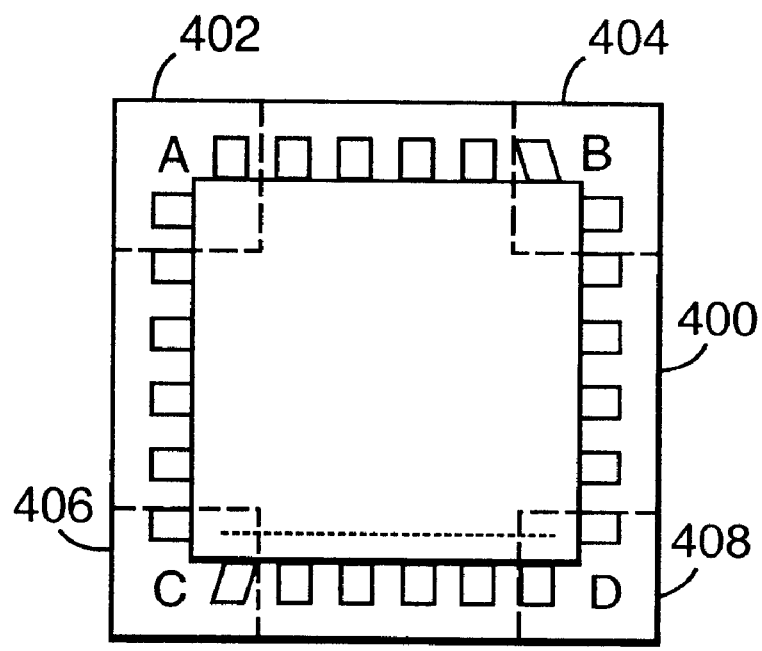
FIGS. 32A–B show an initial Cartesian array image and a final Cartesian array image from an embodiment of the present invention, where selectable areas of interest have been extracted and re-assembled into a final Cartesian image array.
Figure 32B:
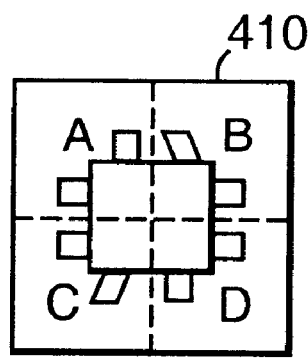
Figure 33A:
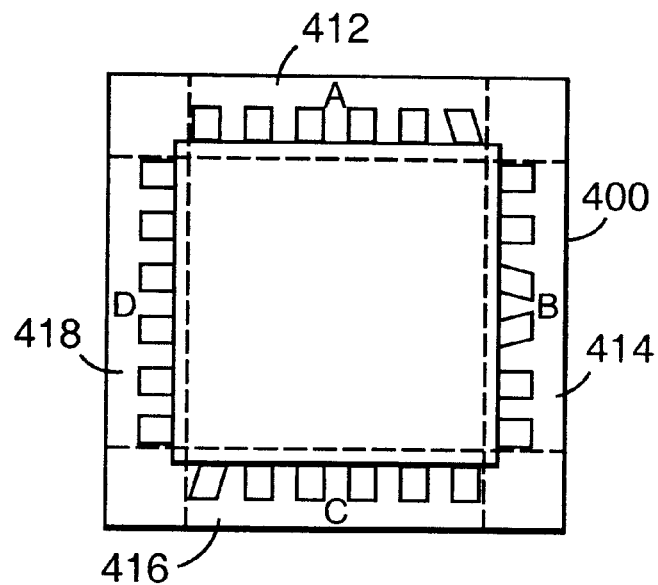
FIGS. 33A–B show an initial Cartesian array image and a final Cartesian array image from an embodiment of the present invention, where selectable areas of interest along the four perimeters of a component have been extracted and re-assembled.
Figure 33B:
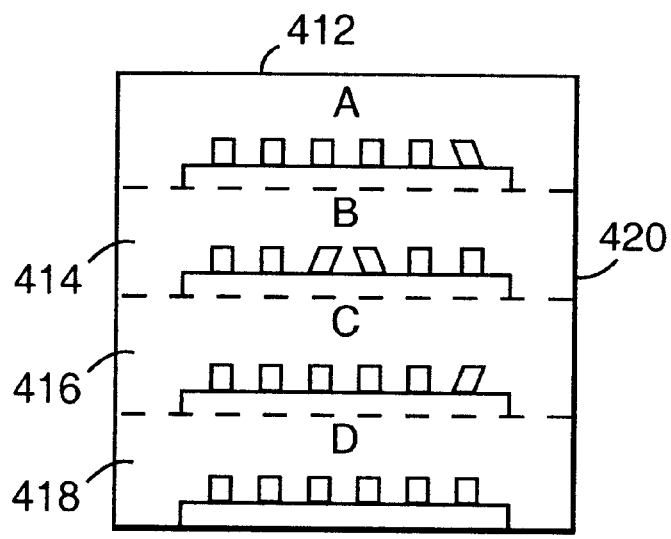

Once the data is converted into a Cartesian array image 400 of component 8, the image may be resampled using commercially available products such as PaintShop Pro by Jasc Software to reduce the size of the array. One standard format for resampled data is 640×480 pixels, which is easily transferable to commercially available processing engines via EIA RS-170 protocol. As appropriate, images of the corners 402–408 are extracted from the Cartesian image array, and sent to processor 22 for improved resolution in placing component 8, as shown in FIG. 32A. Once the images of corners 402–408 of the image 400 of component 8 are extracted from the array 400, these images of the corners may be re-assembled into one extracted Cartesian image 410 and sent to processor 22 for further processing, as shown in FIG. 32B. This image extraction and reconstruction process provides condensed data representative of essential features for determining the orientation of component 8. Another method to reduce the amount of data sent to processor 22 is to extract vertical and horizontal sections 412–418 from the Cartesian array 400 as shown in FIG. 33A. The location of a leaded component can be determined from information derived only from its periphery. Once the images of sections 412–418 are extracted from array 400, these images are re-assembled into one extracted Cartesian array 420 shown in FIG. 33B, which includes sections 412–418. This method reduces the amount of data sent from the processing circuitry 40 to the processor 22.

While a number of alternative embodiments have been disclosed, combinations of one embodiment with another and variations on explicitly disclosed embodiments will be obvious to those skilled in the art. Within the teaching of the present invention, each of such modifications, combinations and variations are within the spirit and scope of the invention. For example, there are three types of quills discussed in this document, and each type is equally able to be used in all the embodiments of this application. Furthermore, variations or additional steps in the methods of practicing the present invention, such as steps of pre-rotating components or post-rotating components, or translating various parts of the claimed system out of the way while other parts are moved into place to be viewed by the detector, are understood to be obvious to those already disclosed, or equivalent thereto. Component substitutions for various parts of the claimed system, especially optical substitutions which accomplish the same function as a disclosed part, shall also be considered to be obvious or equivalent to those already disclosed. Finally, additional components which are introduced into the disclosed embodiments and serve no purpose other than sharpening images, or additional mirrors which function to bend a light path in between two essential component in the present invention or the like, shall also be considered to be obvious and equivalent to those optical-mechanical embodiments of the present invention disclosed in this application.

What is claimed is:

1. A system for providing a signal related to a physical condition of an object, the system comprising:
   a quill for releasably holding the object;
   a motion control system for rotating the quill about a central axis, the central axis having a viewing plane substantially perpendicular thereto;
   control electronics for providing a plurality of trigger signals;
   a detector adapted to view a stripe in the viewing plane upon receipt of a trigger signal and to provide an image of the stripe, the detector viewing a plurality of stripes while the motion control system rotates the quill; and
   processing circuitry for processing the plurality of images of the stripes to provide the signal related to the physical condition of the object.

2. The system of claim 1 further comprising a light source for illuminating at least a portion of the stripe.

3. The system of claim 2 where the light source is adapted to provide front-lit illumination of the stripe.

4. The system of claim 3 where the front-lit illumination is specular.

5. The system of claim 3 where the front-lit illumination is diffuse.

6. The system of claim 3 where the front-lit illumination is diffuse and specular.

7. The system of claim 2 where the light source is adapted to provide back-lit illumination.

8. The system of claim 2 where the light source is adapted to provide back-lit shadow casting illumination.

9. The system of claim 2 where the light source is adapted to provide reflective shadow casting illumination.

10. The system of claim 2 where the light source is a laser.

11. The system of claim 2 where the light source is an LED.

12. The system of claim 2 where a transmit optical path is formed between the light source and the stripe in the plane, and where a mirror is interposed in the transmit optical path.

13. The system of claim 1 farther comprising:
a head mechanically coupled to the quill;
a motor drive unit for translatably moving the head, where the head and the quill move to transport the object.

14. The system of claim 13 where the head moves in the x direction.

15. The system of claim 13 where the head moves in the y direction.

16. The system of claim 13 where the detector is mechanically coupled to the head so that the detector moves with the head.

17. The system of claim 13 where the detector is at a fixed location and the head moves the object to the fixed location.

18. The system of claim 1 where the motion control system rotates the quill at a substantially constant angular velocity.

19. The system of claim 1 where the motion control system rotates the quill at a variable angular velocity.

20. The system of claim 1 where the motion control system includes a rotary encoder with a rotary encoder output representative of an angular position of the quill, and where the control circuitry receives the rotary encoder output.

21. The system of claim 20 where the control electronics issues the trigger signals as a function of the rotary encoder output.

22. The system of claim 1 where the processing circuitry further comprises a storage buffer for holding a Cartesian image array, the array comprising a plurality of locations, the processing circuitry receiving a gray value representative of an area on the plane and computing an (x,y) location corresponding to the area, the (x,y) location corresponding to a target element of the Cartesian image array, the processing circuitry storing the gray value in the target element.

23. The system of claim 1 where the processing circuitry assembles the plurality of the images of the stripes into a polar array, each image of the stripe uniquely associated with a rotational position of the object, and further that each image of the stripe comprises elements therein, each element represented numerically as a gray value in the polar array and each element representative of brightness of an area on the plane.

24. The system of claim 23 where the processing circuitry includes an image processor for mapping the polar array into a Cartesian image array, the Cartesian image array having a plurality of elements therein.

25. The system of claim 24 where the polar array has a plurality of elements therein, and the image processor interpolates among the elements of the polar array to compute the elements of the Cartesian image array.

26. The system of claim 24 where the image processor comprises:
A selector for selecting an (x,y) point corresponding to a target element in the Cartesian image array, the target element representative of an area on the object;
A computer for computing a (r,θ) point from the (x,y) point;
An algorithm for finding a desired element in the polar array which includes the (r,θ) point, the algorithm extracting the gray value from the desired element and placing that gray value in the target element of the Cartesian image array.

27. The system of claim 26 where the algorithm is a nearest neighbor algorithm.

28. The system of claim 26 where the algorithm is a linear interpolation algorithm.

29. The system of claim 24 where the Cartesian image array comprises sections which are representative of areas of interest on the component, and the image processor extracts the sections.

30. The system of claim 29 where the image processor formats the sections in an EIA format adapted for communicating to the host processor.

31. The system of claim 1 where the detector is a CCD sensor.

32. The system of claim 1 where the detector is a linear array.

33. The system of claim 32 where the linear array has substantially 1024 pixels.

34. The system of claim 32 where the linear array has substantially 2048 pixels.

35. The system of claim 1 where the object has a top and the viewing plane is substantially coincident with the top.

36. The system of claim 1 where the object has a top and the viewing plane is substantially parallel to the top.

37. The system of claim 1 where the object has a bottom and the viewing plane is substantially coincident with the bottom.

38. The system of claim 1 where the object has a bottom and the viewing plane is substantially parallel to the bottom.

39. The system of claim 1 where the object is an electronic component.

40. The system of claim 39 where the component has a bottom, and where the bottom of the component has raised features thereon, the features selected from the group of features called balls, columns, pins and leads, where the viewing plane is formed from a plurality of the features.

41. The system of claim 40 where the feature is a lead and where the processing circuitry receives a plurality of gray values representative of areas on the plane and identifies at least two areas which correspond to a first lead tip area and a second lead tip area, the processing circuitry computing an orientation of the component from the two lead tip areas, the signal representative of the orientation of the component.

42. The system of claim 41 where the lead tip corresponding to the first lead tip area is located substantially diagonally opposite to the lead tip corresponding to the second lead tip area.

43. The system of claim 40 where the feature is a lead and where the processing circuitry receives a plurality of gray values representative of areas on the plane and identifies at least two areas which correspond to areas on two successive lead tips, the processing circuitry computing a distance between the areas on the lead tips.

44. The system of claim 43 further comprising a host processor coupled to the processing circuitry, the host processor communicating design information related to the component, where the design information is representative of an acceptable spacing between leads and further, where the processing circuits compares the distance to the acceptable spacing and provides the signal, the signal representative of lead tweeze.

45. The system of claim 40 where the processing circuitry receives a plurality of gray values representative of areas on the viewing plane, the circuitry identifying a first gray value which corresponds to an area on a first feature and a second gray value corresponding to an area on a second feature, the processing circuitry computing an orientation of the component from the two areas, the signal representative of the orientation of the component.

46. The system of claim 45 where the area on the first feature is located on the component substantially opposite to the area on the second feature.

47. The system of claim 40 further comprising a host processor coupled to the processing circuitry, the host processor communicating design information related to the component, where the design information is representative of the expected locations of the features and further, where the processing circuitry receives a plurality of gray values representative of areas on the plane proximate to the expected location of the feature and determines whether a feature is present in the component, the signal representative of the presence of the feature.

48. The system of claim 39 where the component has an outline defining a space below and above the component, and where the detector is located outside the space.

49. The system of claim 48 where the detector is located inside a housing.

50. The system of claim 48 further comprising a lens system for forming an optical image of the stripe onto the detector, where the lens system is located outside the space.

51. The system of claim 39 where the component additionally has four edges and four comers and the detector has a principal axis, where the principal axis of the detector is positioned perpendicularly to one of the edges, so that when the component rotates, the stripes largely represent the comers of the component.

52. The system of claim 39 where the component has a center which is substantially coincident with the central axis.

53. The system of claim 39 where the component has a center which is not coincident with the central axis.

54. The system of claim 53 where the quill contacts the component in an area which does not include the central axis.

55. The system of claim 54 where the component has a rectangular outline, where the central axis lies within the rectangular outline.

56. The system of claim 54 where the component has a rectangular outline, where the central axis lies outside of the rectangular outline.

57. The system of claim 54 where the quill is adapted to releasably hold at least one additional component.

58. The system of claim 54 further comprising at least one additional quill for releasably holding an additional component.

59. The system of claim 54 where the quill has a first segment connected to a second segment by an arm, the second segment releasably holding the component and rotating the component about an additional axis, the first segment rotating the arm, the second segment and the component about the central axis, the additional axis substantially parallel to the central axis.

60. The system of claim 59 where the first segment rotates the arm, the second segment and the component about the central axis at a first angular velocity and the second segment rotates the component about the additional axis at a second angular velocity, the first angular velocity and the second angular velocity substantially equal in magnitude and in opposite direction.

61. The system of claim 1 where the object has a center and a perimeter, and where the detector is positioned so that the plurality of stripes represent areas emanating substantially radially from the center and including the perimeter of the object.

62. The system of claim 61 where the motion control system rotates the object substantially through 360 degrees to provide the signal related to the physical condition of the object.

63. The system of claim 1 where the object has a center and a pair of edges, one edge substantially opposite the other, and where the detector is positioned so that the plurality of stripes represent an area including the two edges and the center.

64. The system of claim 63 where the motion control system rotates the object substantially through 180 degrees to provide the signal related to the physical condition of the object.

65. The system of claim 1 where a transmit optical path is formed between the detector and the stripe in the viewing plane, and where a mirror is interposed in the transmit optical path.

66. The system of claim 65 where the mirror is translatably positioned with respect to the stripe in the viewing plane.

67. The system of claim 65 where the mirror is fixedly positioned with respect to the stripe in the viewing plane.

68. The system of claim 65 where the mirror is a beam splitter.

69. The system of claim 65 where the mirror partially reflects the light which impinges thereon.

70. The system of claim 1 further comprising a lens system for forming an optical image of the stripe on the detector.

71. The system of claim 70 where the lens system includes an array of GRIN rod lenses.

72. The system of claim 1 where an observation plane is formed between the detector and the stripe in the viewing plane, the observation plane intersecting the central axis in a point.

73. The system of claim 72 where the system further comprises a light source for illuminating at least a portion of the stripe in the viewing plane.

74. The system of claim 73 where the light source is adapted to provide front-lit illumination of the stripe in the viewing plane.

75. The system of claim 74 where the front-lit illumination is specular.

76. The system of claim 74 where the front-lit illumination is diffuse.

77. The system of claim 74 where the front-lit illumination is diffuse and specular.

78. The system of claim 73 where the light source is adapted to provide back-lit illumination of the stripe in the viewing plane.

79. The system of claim 73 where the light source is adapted to provide back-lit shadow casting of the stripe in the viewing plane.

80. The system of claim 73 where the light source is adapted to provide reflective shadow casting illumination of the stripe in the viewing plane.

81. The system of claim 73 where a receive optical path is formed between the light source and the stripe in the viewing plane, and where a mirror is interposed in the receive optical path.

82. The system of claim 73 where a transmit optical path is formed between the detector and the stripe in the viewing plane, and where a mirror is interposed in the transmit optical path.

83. The system of claim 82 where the signal is representative of the coplanarity of the features.

84. The system of claim 72 where the object has a center and a pair of edges, one edge substantially opposite the other, where one of the plurality of stripe images represent an area including the edges and the center, where the motion control system rotates the object over at least 360 degrees so as to provide a set of data points, the set including two data points representative of a single feature on the object, the processing circuitry operating on the set to provide a height of the feature relative to the plane.

85. The system of claim 84 where the feature is selected from the group of features known as balls, pins, columns and leads.

86. The system of claim 72 where the object is a component which has a center and a pair of edges, one edge substantially opposite the other, where one of the plurality of stripe images represents an area including the edges and the center, where the motion control system rotates the object over at least 360 degrees so as to provide a set of data points, the set including two data points representative of each feature in a set of selected features on the object, the processing circuitry operating on the set to compute heights of the selected set of features and providing the signal representative of a coplanarity of the set of selected features.

87. The system of claim 86 where the feature is selected from the group of features known as balls, columns, pins and leads.

88. The system of claim 87 where the signal is representative of the coplanarity of the features.

89. The system of claim 1 where the central axis is substantially coincident with an observation plane formed between the detector and the stripe in the viewing plane.

90. The system of claim 89 where the system further comprises a light source for illuminating at least a portion of the stripe in the viewing plane.

91. The system of claim 90 where the light source is adapted to provide front-lit illumination of the stripe in the viewing plane.

92. The system of claim 91 where the front-lit illumination is specular.

93. The system of claim 91 where the front-lit illumination is diffuse.

94. The system of claim 91 where the front-lit illumination is diffuse and specular.

95. The system of claim 90 where the light source is adapted to provide back-lit illumination of the stripe in the viewing plane.

96. The system of claim 90 where the light source is adapted to provide back-lit shadow casting of the stripe.

97. The system of claim 90 where the light source is adapted to provide reflective shadow casting illumination of the stripe in the viewing plane.

98. The system of claim 90 where a receive optical path is formed between the light source and the stripe in the viewing plane, and where a mirror is interposed in the receive optical path.

99. The system of claim 90 where a transmit optical path is formed between the detector and the stripe in the viewing plane, and where a mirror is interposed in the transmit optical path.

100. The system of claim 89 where the object has a center and a pair of edges, one edge substantially opposite the other, where one of the plurality of stripe images represent an area including the edges and the center, where the motion control system rotates the object over at least 360 degrees so as to provide a set of data points, the set including two data points representative of a single feature on the object, the processing circuitry operating on the set to provide a height of the feature relative to the plane.

101. The system of claim 100 where the feature is selected from the group of features known as balls, column, pins and leads.

102. The system of claim 101 where the signal is representative of the coplanarity of the features.

103. The system of claim 89 where the object is a component which has a center and a pair of edges, one edge substantially opposite the other, where one of the plurality of stripe images represents an area including the edges and the center, where the motion control system rotates the object over at least 360 degrees so as to provide a set of data points, the set including two data points representative of each feature in a set of selected features on the object, the processing circuitry operating on the set to compute heights of the selected set of features and providing the signal representative of a coplanarity of the set of selected features.

104. The system of claim 103 where the feature is selected from the group of features known as balls, columns and leads.

105. The system of claim 104 where the signal is representative of the coplanarity of the features.

106. A method for picking and placing a component, comprising the steps of:
 1. Releasably picking up the component with a quill, the quill having a central axis substantially perpendicular to a viewing plane;
 2. Positioning the component relative to a detector, the detector adapted to view a stripe in the viewing plane and including electronics adapted to provide a signal representative of a physical condition of the component; and
 3. Rotating the component while acquiring a plurality of views of the stripes.

107. The method of claim 106 farther comprising the steps of:
 1. Moving the component to a placement area; and
 2. Placing the component as a function of the signal.

108. The method of claim 107 where a head is mechanically coupled to the quill and the detector travels with the head.

109. The method of claim 107 where the component has an outline, the outline forming a space above and below the component, where the method further comprises moving the detector at least partially within the space before step 3 and moving the detector outside the space after step 3.

110. The method of claim 107 where the component has an outline, the outline forming a space above and below the component where the method further comprises moving a mirror to a location at least partially within the space before step 3, and moving the mirror outside the space after step 3.

111. The method of claim 110 where mirror is rotatably moved.

112. The method of claim 110 where mirror is slidably moved.

113. The method of claim 107 where a head is mechanically coupled to the quill and the detector is at a fixed location, where the head moves with the object to the fixed location.

114. The method of claim 106 further comprising the steps of starting to move the component to a placement area before after step 1 has started, and placing the component as a function of the signal.

115. The method of claim 106 further comprising the steps of starting to move the component to a placement area after step 2 has started, and placing the component as a function of the signal.

116. The method of claim 106 further comprising the steps of starting to move the component to a placement area after step 3 has started, and placing the component as a function of the signal.

117. The method of claim 106 where the quill has a first segment rotating about a central axis connected to a second segment by an arm, the second segment releasably holding the component and rotating the component about an additional axis, the first segment rotating the arm, the second segment and the component about the central axis, the additional axis substantially parallel to the central axis, where the motion of step 2 includes a rotation about the central axis and where the rotation of step 3 includes a rotation about the additional axis.

118. A method of picking and placing a component, the method comprising the steps of:

1) releasably picking up the component with a quill, the quill having a central axis substantially perpendicular to a viewing plane;

2) elevating the quill to a measurement elevation relative to a detector;

3) rotating the quill so as to position the component relative to the detector, so that when the component rotates the detector views a stripe in the viewing plane, the detector including electronics adapted to provide a signal representative of a physical condition of the component, the electronics acquiring a plurality of views of the stripes;

4) rotating the quill so as to rotate the component away from the detector; and 5) lowering the quill so as to allow for placement of the component.

* * * * *